US011022257B2

(12) United States Patent
Diana et al.

(10) Patent No.: US 11,022,257 B2
(45) Date of Patent: Jun. 1, 2021

(54) LED LIGHT ENGINE FEATURES

(71) Applicant: Lumileds LLC, San Jose, CA (US)

(72) Inventors: Frederic Stephane Diana, Santa Clara, CA (US); Seng-Hup Teoh, Morgan Hill, CA (US); Michael Wasilko, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/729,162

(22) Filed: Dec. 27, 2019

(65) Prior Publication Data

US 2020/0340655 A1    Oct. 29, 2020

Related U.S. Application Data

(60) Provisional application No. 62/850,959, filed on May 21, 2019, provisional application No. 62/846,072, (Continued)

(51) Int. Cl.
*F21V 7/00* (2006.01)
*F21V 8/00* (2006.01)
(Continued)

(52) U.S. Cl.
CPC .............. *F21K 9/61* (2016.08); *F21V 7/0058* (2013.01); *F21V 7/0091* (2013.01); *F21V 7/24* (2018.02);
(Continued)

(58) Field of Classification Search
CPC . F21V 31/005; F21V 2200/20; G02B 6/0088; G02B 6/009; G02B 6/0091;
(Continued)

(56) References Cited

U.S. PATENT DOCUMENTS 7,095,461 B2 *  8/2006  Kim ................. G02F 1/133308
                                                     349/58
RE46,781 E      4/2018  Go et al.
(Continued)

FOREIGN PATENT DOCUMENTS

CN          202093200 U      12/2011
CN          102494273 A       6/2012
(Continued)

OTHER PUBLICATIONS

"U.S. Appl. No. 16/729,175, Non-Final Office Action dated Jul. 2, 2020", 9 pgs.
(Continued)

*Primary Examiner* — Bryon T Gyllstrom
*Assistant Examiner* — James M Endo
(74) *Attorney, Agent, or Firm* — Schwegman Lundberg & Woessner, P.A.

(57) ABSTRACT

A lighting engine, system and method of fabrication are described. The engine contains a chassis having a side wall and bottom surface that define a cavity. A recess is formed in the bottom surface. A flexible printed circuit (FPC) is on the side wall and LEDs are mounted on the FPC to emit light toward a center of the cavity. A light guide positioned within the cavity receives light emitted by the LEDs through an edge of the light guide. A gasket disposed within the recess is in contact with a first surface of the light guide. A reflector within the cavity is adjacent to a second surface of the light guide opposite the first surface of the light guide. A backplate is attached to the chassis and configured to seal the cavity. Other apparatuses, systems, and methods are also disclosed.

15 Claims, 44 Drawing Sheets

Related U.S. Application Data filed on May 10, 2019, provisional application No. 62/837,581, filed on Apr. 23, 2019.

(51) Int. Cl.

| | | |
|---|---|---|
| *F21V 7/24* | (2018.01) | |
| *F21Y 115/10* | (2016.01) | |
| *F21K 9/61* | (2016.01) | |
| *H01L 27/15* | (2006.01) | |
| *H05K 1/11* | (2006.01) | |
| *F21V 23/00* | (2015.01) | |
| *H05K 1/02* | (2006.01) | |
| *H05K 1/18* | (2006.01) | |

(52) U.S. Cl.
CPC .......... *F21V 23/004* (2013.01); *F21V 23/005* (2013.01); *F21V 23/007* (2013.01); *G02B 6/0055* (2013.01); *G02B 6/0068* (2013.01); *G02B 6/0083* (2013.01); *G02B 6/0088* (2013.01); *G02B 6/0091* (2013.01); *H01L 27/153* (2013.01); *H05K 1/0274* (2013.01); *H05K 1/118* (2013.01); *H05K 1/189* (2013.01); *F21V 2200/00* (2015.01); *F21Y 2115/10* (2016.08); *H05K 2201/055* (2013.01); *H05K 2201/10106* (2013.01); *H05K 2201/10522* (2013.01); *H05K 2201/2054* (2013.01)

(58) Field of Classification Search
CPC .. G02B 6/0086; G02B 6/0081; G02B 6/0083; G02B 6/0043; G02B 6/0031; G02B 6/0055; G02F 1/133615; G02F 13/18; G09F 13/18
See application file for complete search history.

(56) References Cited

U.S. PATENT DOCUMENTS

| | | | |
|---|---|---|---|
| 2003/0117790 A1* | 6/2003 | Lee ..................... | G02B 6/0051 362/617 |
| 2007/0086213 A1 | 4/2007 | Hsieh | |
| 2007/0091639 A1 | 4/2007 | Yoo | |
| 2008/0170415 A1 | 7/2008 | Han et al. | |
| 2008/0239754 A1* | 10/2008 | Kang .................... | G02B 6/0091 362/617 |
| 2009/0040415 A1 | 2/2009 | Kim | |
| 2010/0027255 A1* | 2/2010 | Chang ................. | G02B 6/0093 362/235 |
| 2010/0165253 A1 | 7/2010 | Jung et al. | |
| 2010/0290248 A1 | 11/2010 | Park | |
| 2011/0134359 A1* | 6/2011 | An ..................... | G02F 1/133308 349/61 |
| 2011/0164199 A1 | 7/2011 | Han et al. | |
| 2011/0292317 A1* | 12/2011 | Kim .................... | G02B 6/0088 349/61 |
| 2012/0106198 A1 | 5/2012 | Lin et al. | |
| 2012/0236593 A1* | 9/2012 | Wei ..................... | G02B 6/0085 362/609 |
| 2012/0281432 A1* | 11/2012 | Parker ................. | G02B 6/0031 362/609 |
| 2012/0320621 A1* | 12/2012 | Kleo ................... | B32B 17/10018 362/558 |
| 2013/0044513 A1 | 2/2013 | Pan | |
| 2013/0169886 A1* | 7/2013 | Kuromizu ........... | G02B 6/0088 348/739 |
| 2013/0235297 A1* | 9/2013 | Yu ...................... | G02F 1/133308 349/58 |
| 2013/0265784 A1* | 10/2013 | Nieberle ............. | G09F 13/18 362/382 |
| 2013/0279194 A1* | 10/2013 | Hodrinsky ........... | G02B 6/0065 362/612 |
| 2013/0336008 A1* | 12/2013 | Kim ..................... | G02B 6/0011 362/612 |
| 2013/0343087 A1 | 12/2013 | Huang | |
| 2014/0133174 A1* | 5/2014 | Franklin .............. | G02B 6/0088 362/606 |
| 2014/0320747 A1* | 10/2014 | Kamada .............. | G02B 6/0088 348/725 |
| 2014/0340875 A1* | 11/2014 | Hayashi .............. | G02B 6/0088 362/97.1 |
| 2014/0362603 A1 | 12/2014 | Song et al. | |
| 2014/0375897 A1* | 12/2014 | Sugiura ............... | G02B 6/0068 348/739 |
| 2015/0003110 A1 | 1/2015 | Choi et al. | |
| 2016/0161665 A1* | 6/2016 | Chen .................... | G02B 6/0085 362/629 |
| 2016/0231501 A1* | 8/2016 | Horiguchi ............ | H04N 5/44 |
| 2016/0313490 A1* | 10/2016 | Steijner .............. | G02F 1/133615 |
| 2017/0031080 A1 | 2/2017 | Speer et al. | |
| 2017/0176663 A1* | 6/2017 | Furuta ................. | G02B 6/0031 |
| 2018/0024290 A1* | 1/2018 | Watanabe ........... | G02B 6/0083 362/613 |
| 2018/0039137 A1* | 2/2018 | Yamakawa ......... | G02B 6/0088 |
| 2018/0045878 A1 | 2/2018 | Murata et al. | |
| 2018/0073688 A1* | 3/2018 | Xu ...................... | F21S 8/03 |
| 2018/0074253 A1* | 3/2018 | Ji ....................... | F21V 9/30 |
| 2018/0128434 A1 | 5/2018 | Moon et al. | |
| 2020/0340630 A1 | 10/2020 | Diana et al. | |
| 2020/0340654 A1 | 10/2020 | Diana et al. | |
| 2020/0341188 A1 | 10/2020 | Diana et al. | |

FOREIGN PATENT DOCUMENTS

| | | |
|---|---|---|
| CN | 103292216 A | 9/2013 |
| CN | 203431782 U | 2/2014 |
| CN | 105627190 A | 6/2016 |
| DE | 10129972 A1 | 1/2003 |
| EP | 1780584 A1 | 5/2007 |
| EP | 2202457 A2 | 6/2010 |
| JP | 2012014834 A | 1/2012 |
| KR | 20110027329 A | 3/2011 |
| KR | 101081807 B1 | 11/2011 |
| WO | WO-2012/176676 A1 | 12/2012 |
| WO | WO-2015/135240 A1 | 9/2015 |
| WO | WO-2020219551 A1 | 10/2020 |
| WO | WO-2020219560 A1 | 10/2020 |
| WO | WO-2020219568 A1 | 10/2020 |
| WO | WO-2020219577 A2 | 10/2020 |

OTHER PUBLICATIONS

"International Application Serial No. PCT/US2020/029341, International Search Report dated Jul. 29, 2020", 6 pgs.

"International Application Serial No. PCT/US2020/029341, Written Opinion dated Jul. 29, 2020", 7 pgs.

"U.S. Appl. No. 16/729,151, Non Final Office Action dated Oct. 13, 2020", 6 pgs.

"U.S. Appl. No. 16/729,175, Notice of Allowance dated Sep. 11, 2020", 8 pgs.

"U.S. Appl. No. 16/729,175, Notice of Allowance dated Sep. 23, 2020", 5 pgs.

"U.S. Appl. No. 16/729,175, Response filed Aug. 18, 2020 to Non Final Office Action dated Jul. 2, 2020", 11 pgs.

"International Application Serial No. PCT/US2020/029329, International Search Report dated Sep. 4, 2020", 6 pgs.

"International Application Serial No. PCT/US2020/029329, Written Opinion dated Sep. 4, 2020", 13 pgs.

"International Application Serial No. PCT/US2020/029353, International Search Report dated Sep. 18, 2020", 8 pgs.

"International Application Serial No. PCT/US2020/029353, Invitation to Pay Additional Fees dated Jul. 28, 2020", 12 pgs.

"International Application Serial No. PCT/US2020/029353, Written Opinion dated Sep. 18, 2020", 10 pgs.

"International Application Serial No. PCT/US2020/029362, International Search Report dated Oct. 21, 2020", 8 pgs.

"International Application Serial No. PCT/US2020/029362, Invitation to Pay Additional Fees dated Aug. 31, 2020", 17 pgs.

(56) References Cited

OTHER PUBLICATIONS

"International Application Serial No. PCT/US2020/029362, Written Opinion dated Oct. 21, 2020", 8 pgs.
U.S. Appl. No. 16/729,131, filed Dec. 27, 2019, Flexible Printed Wiring Structure for LED Light Engine.
U.S. Appl. No. 16/729,151, filed Dec. 27, 2019, Alignment Features for LED Light Engine.
U.S. Appl. No. 16/729,175, filed Dec. 27, 2019, Method of LED Light Engine Assembly.
"U.S. Appl. No. 16/729,131, Non-Final Office Action dated Nov. 27, 2020", 14 pgs.
"U.S. Appl. No. 16/729,151, Response filed Jan. 12, 2021 to Non-Final Office Action dated Oct. 13, 2020", 9 pgs.
U.S. Appl. No. 16/729,175, U.S. Pat. No. 10,895,353, filed Dec. 27, 2019, Method of LED Light Engine Assembly.
"U.S. Appl. No. 16/729,131, Response filed Feb. 26, 2021 to Non-Final Office Action dated Nov. 27, 2020", 9 pgs.
"U.S. Appl. No. 16/729,131, Notice of Allowance dated Mar. 18, 2021", 9 pgs.
"U.S. Appl. No. 16/729,151, Non Final Office Action dated Apr. 15, 2021", 8 pgs.

\* cited by examiner

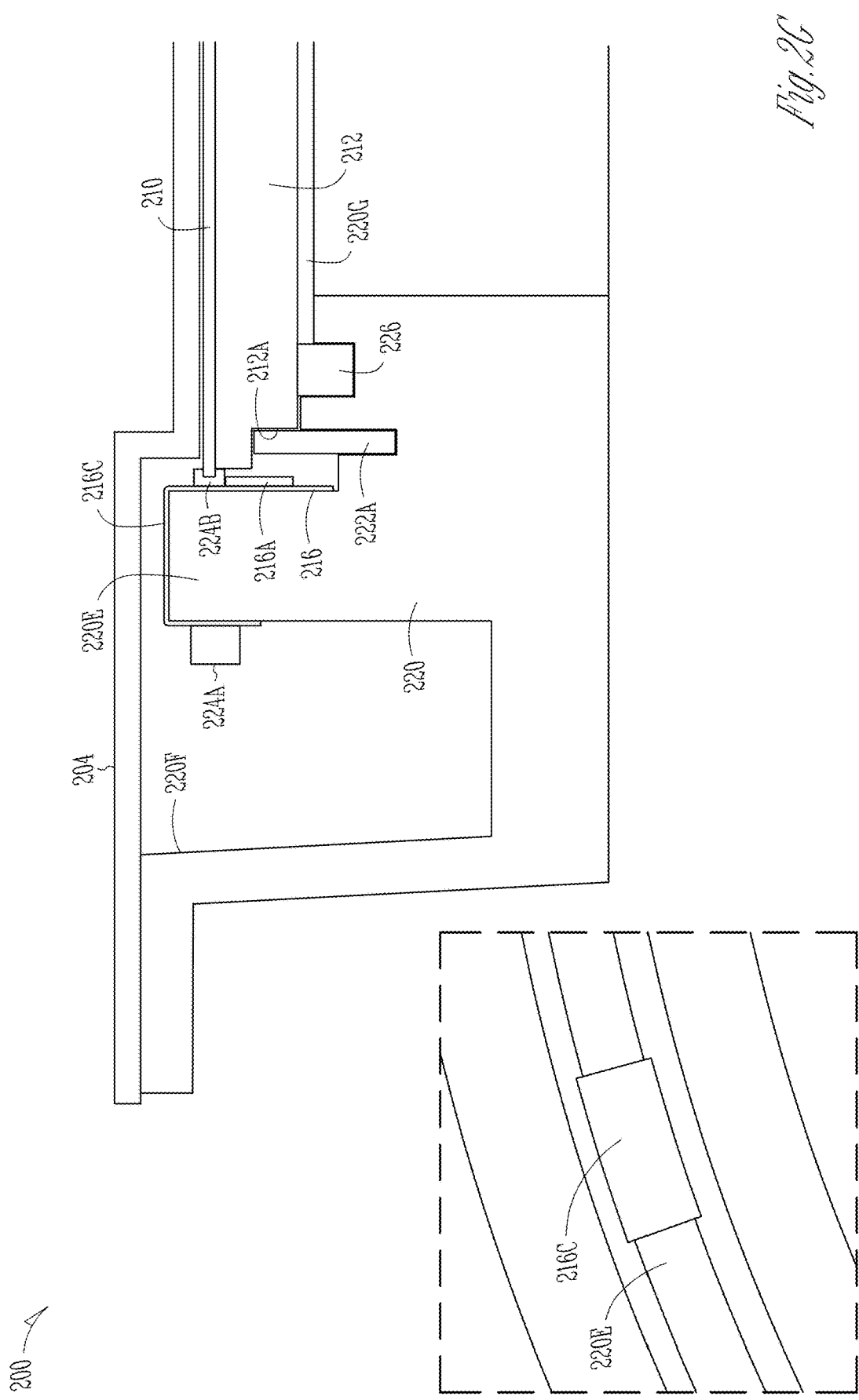

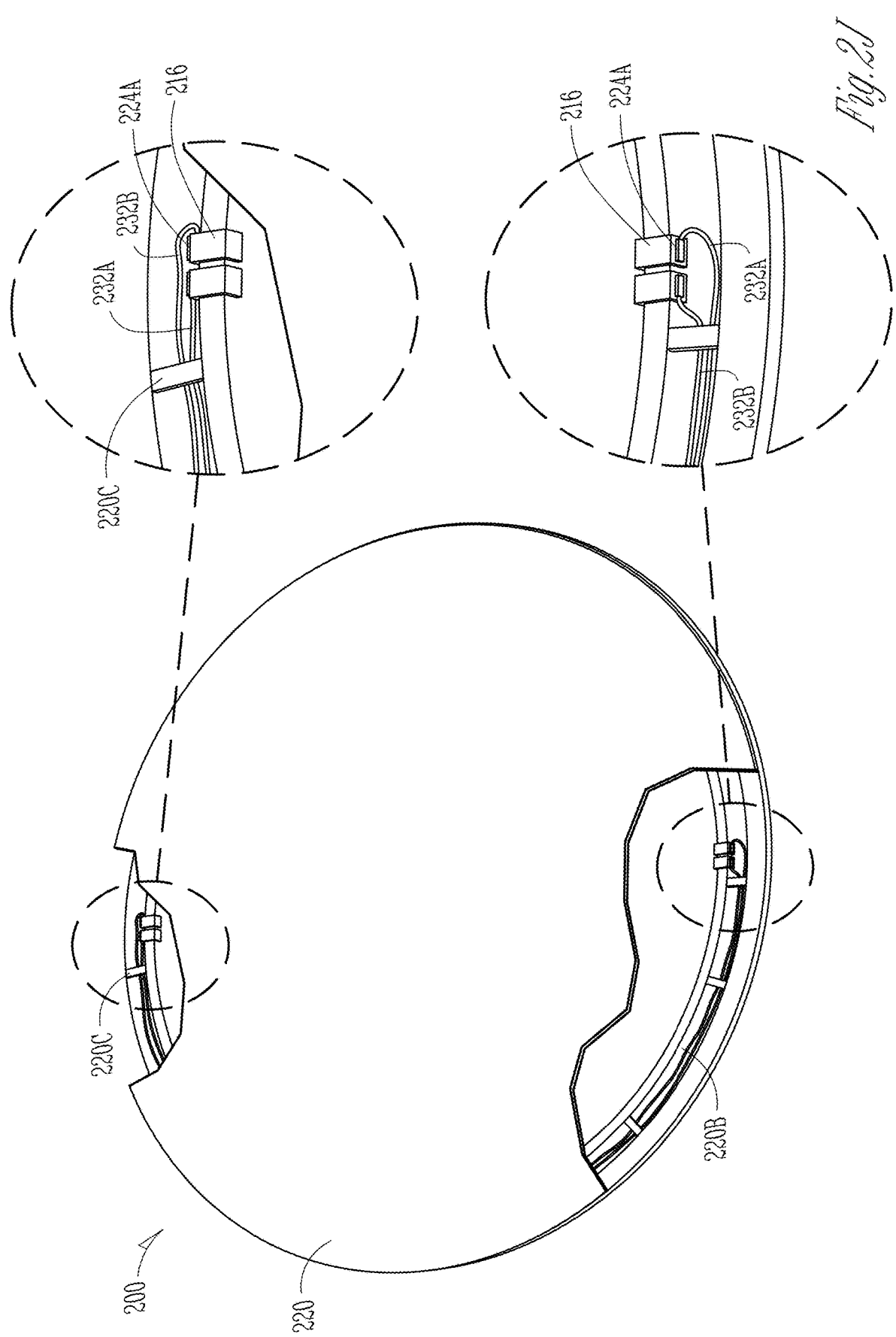

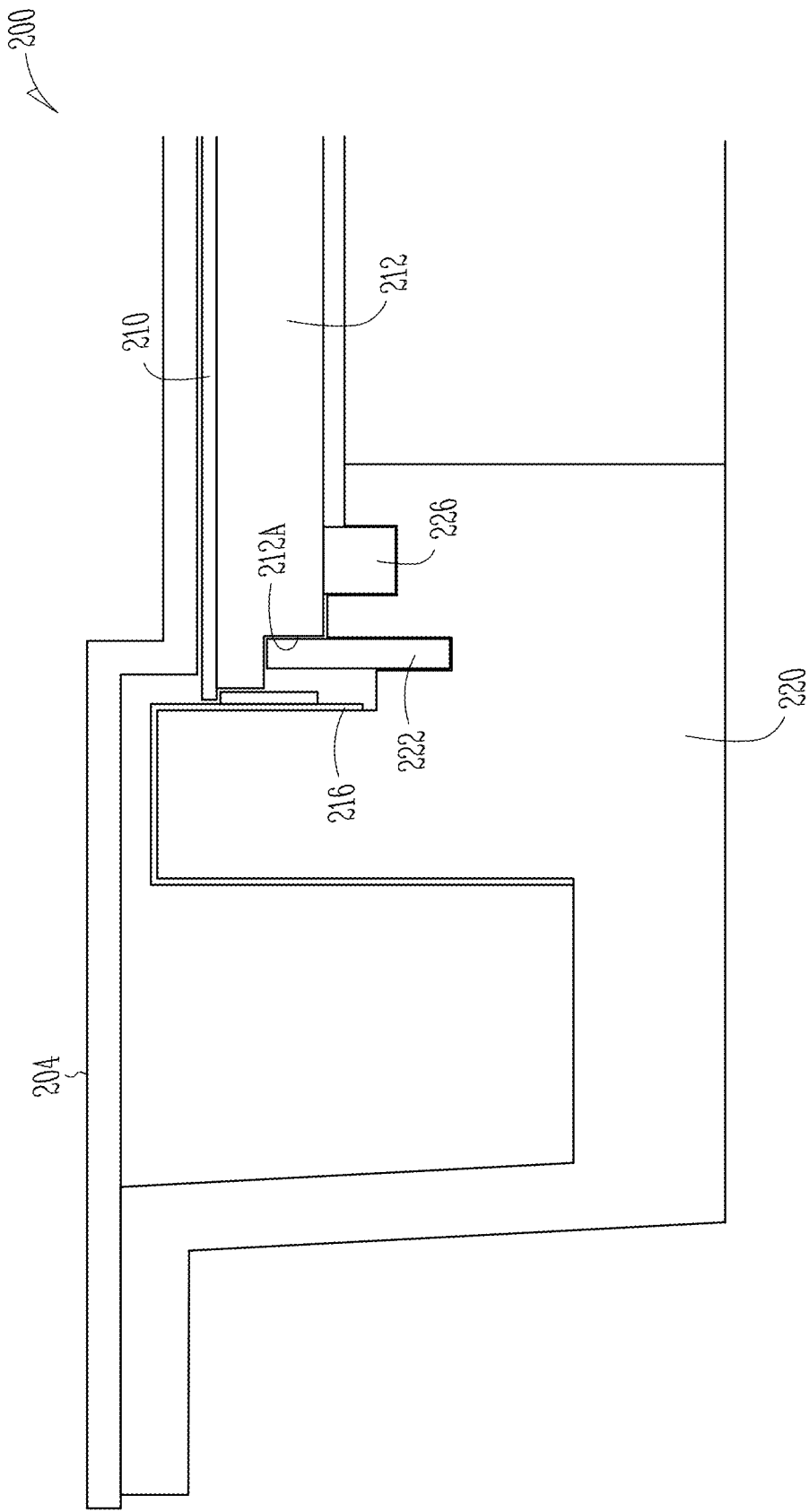

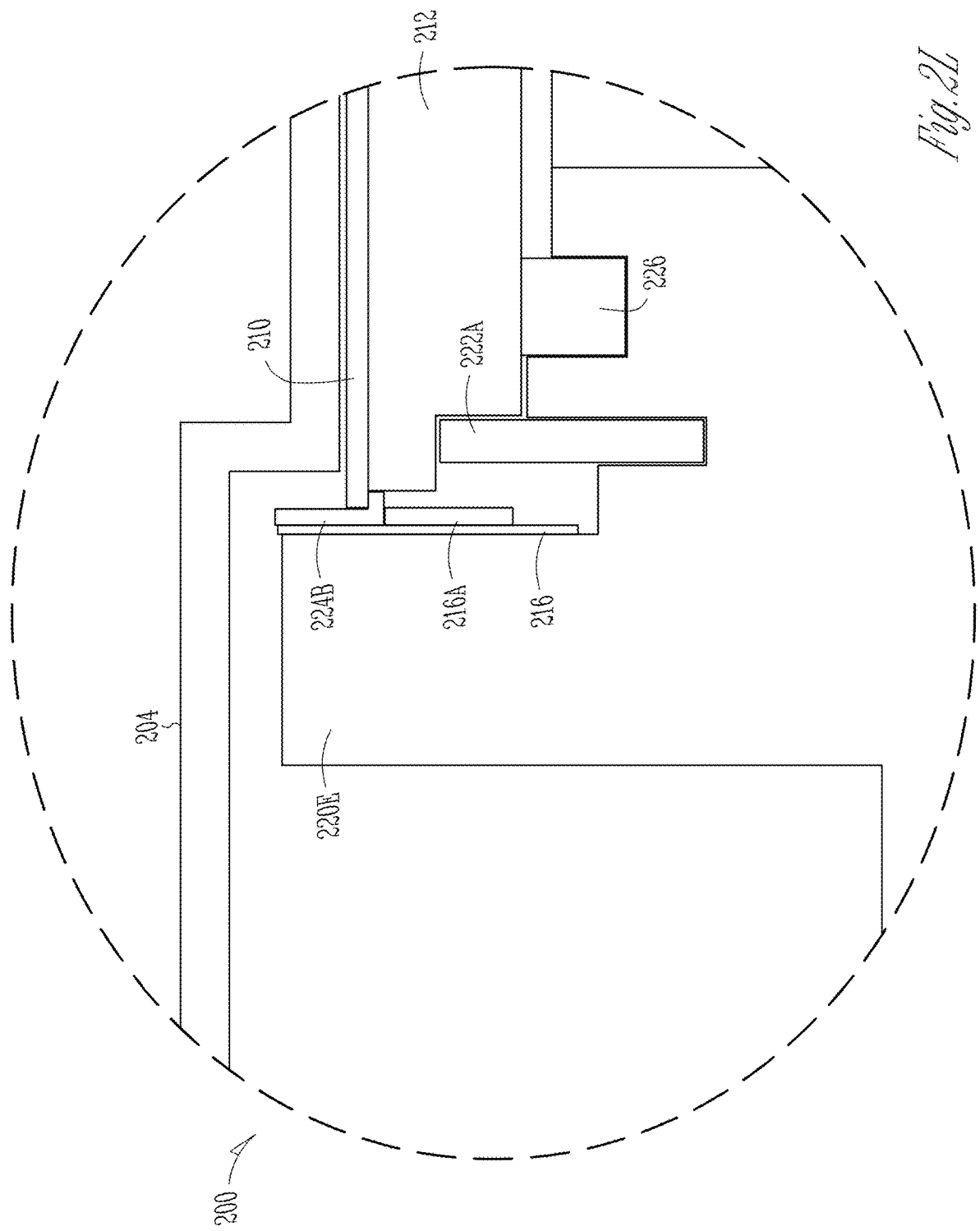

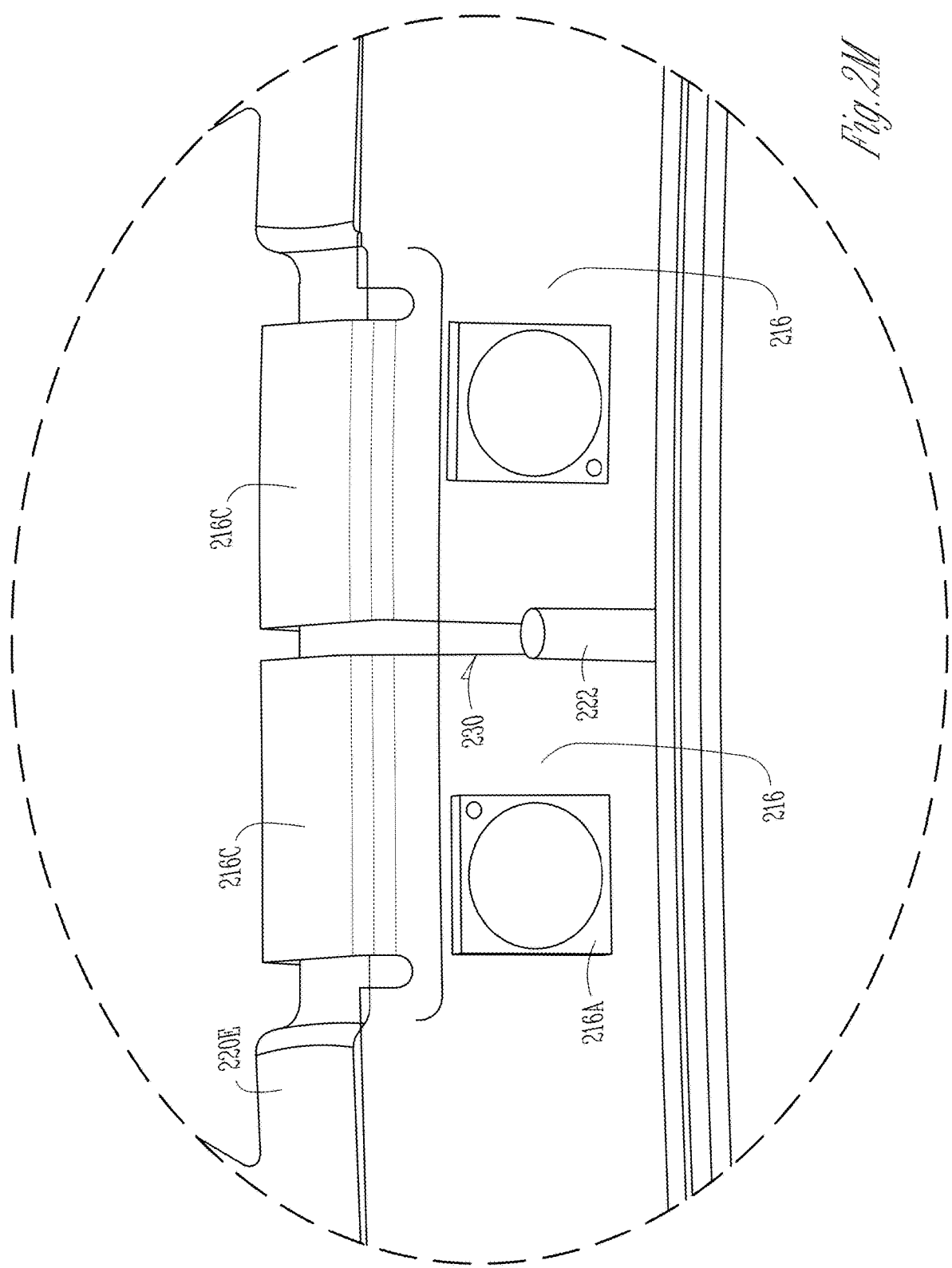

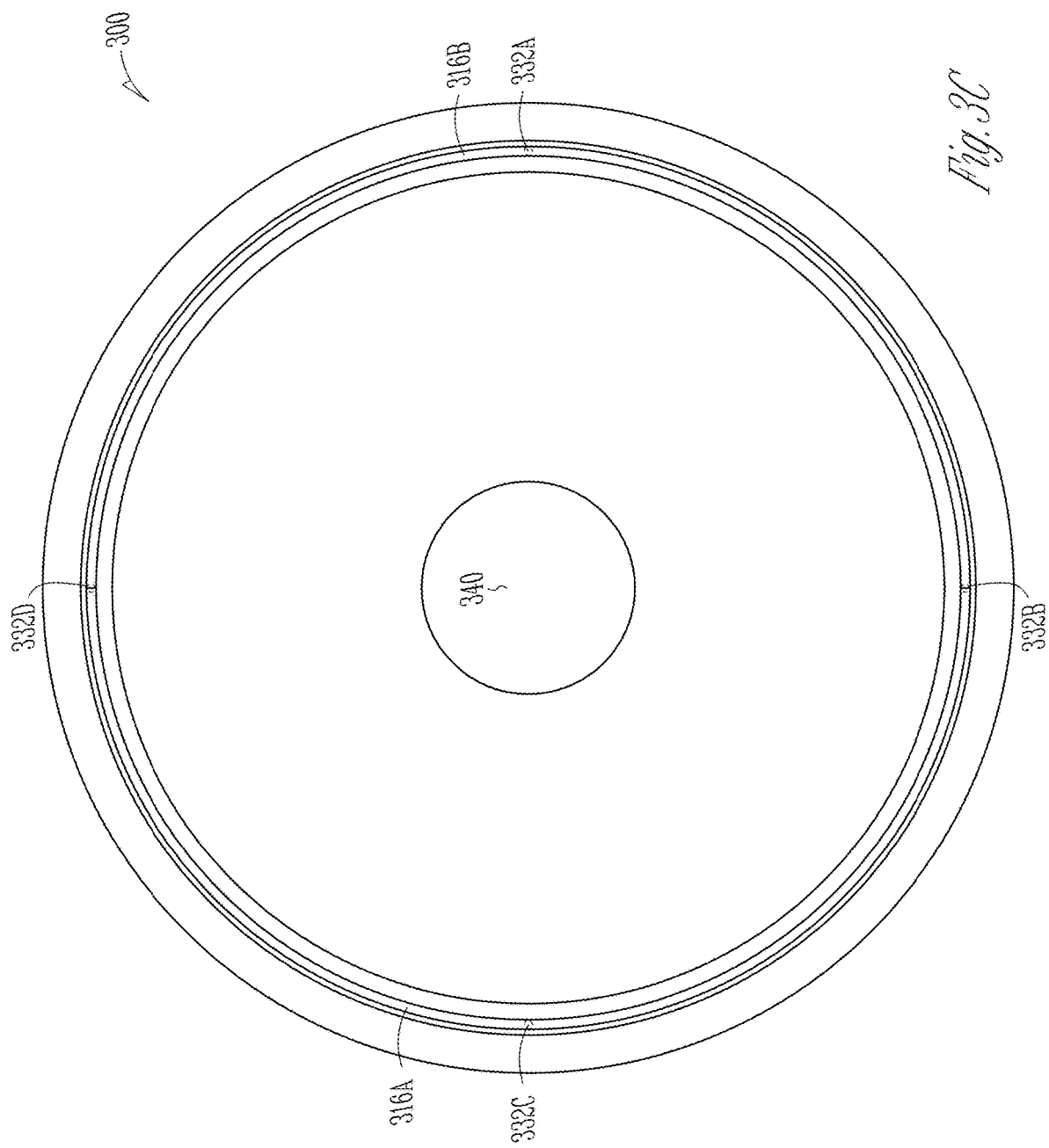

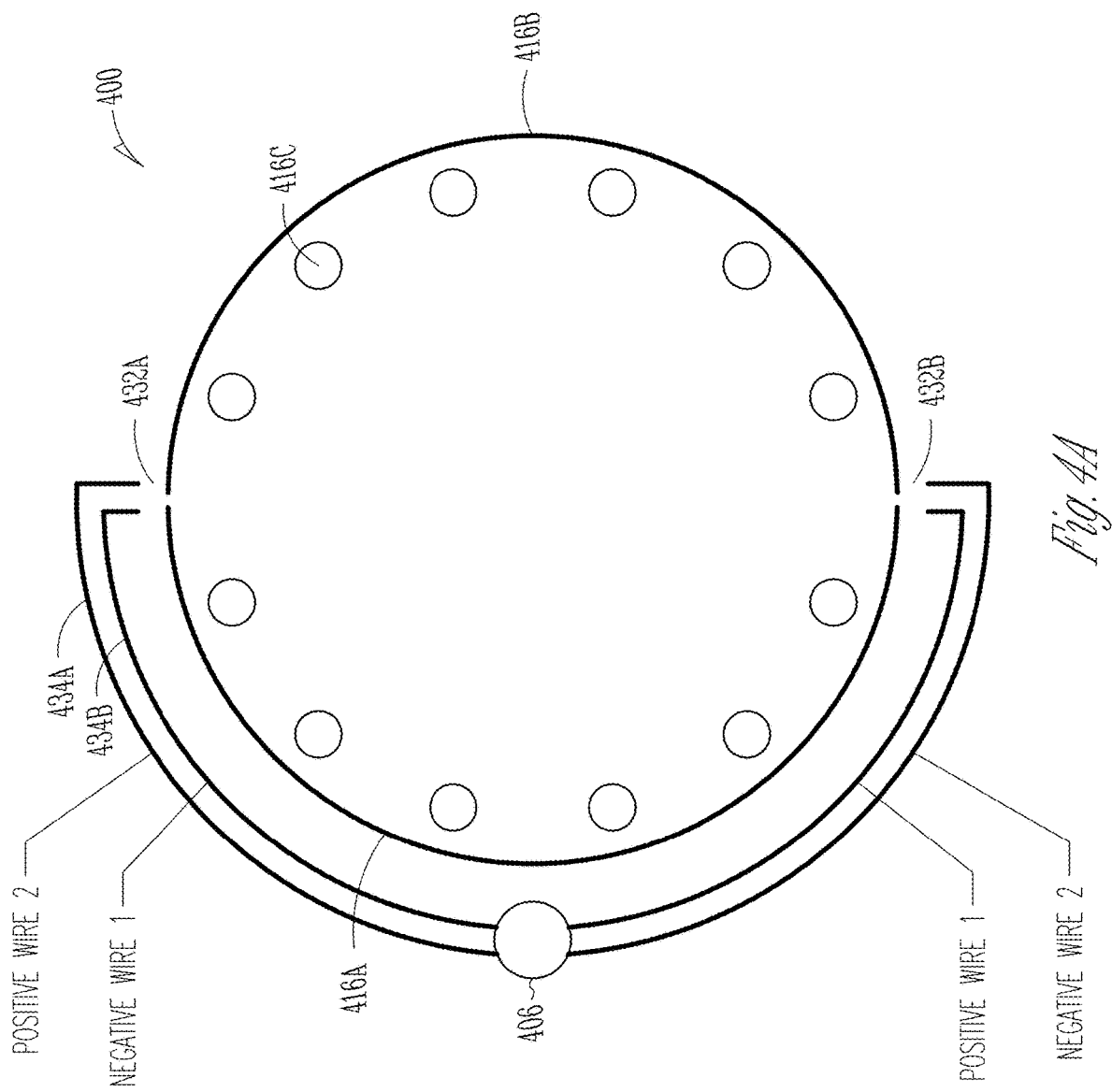

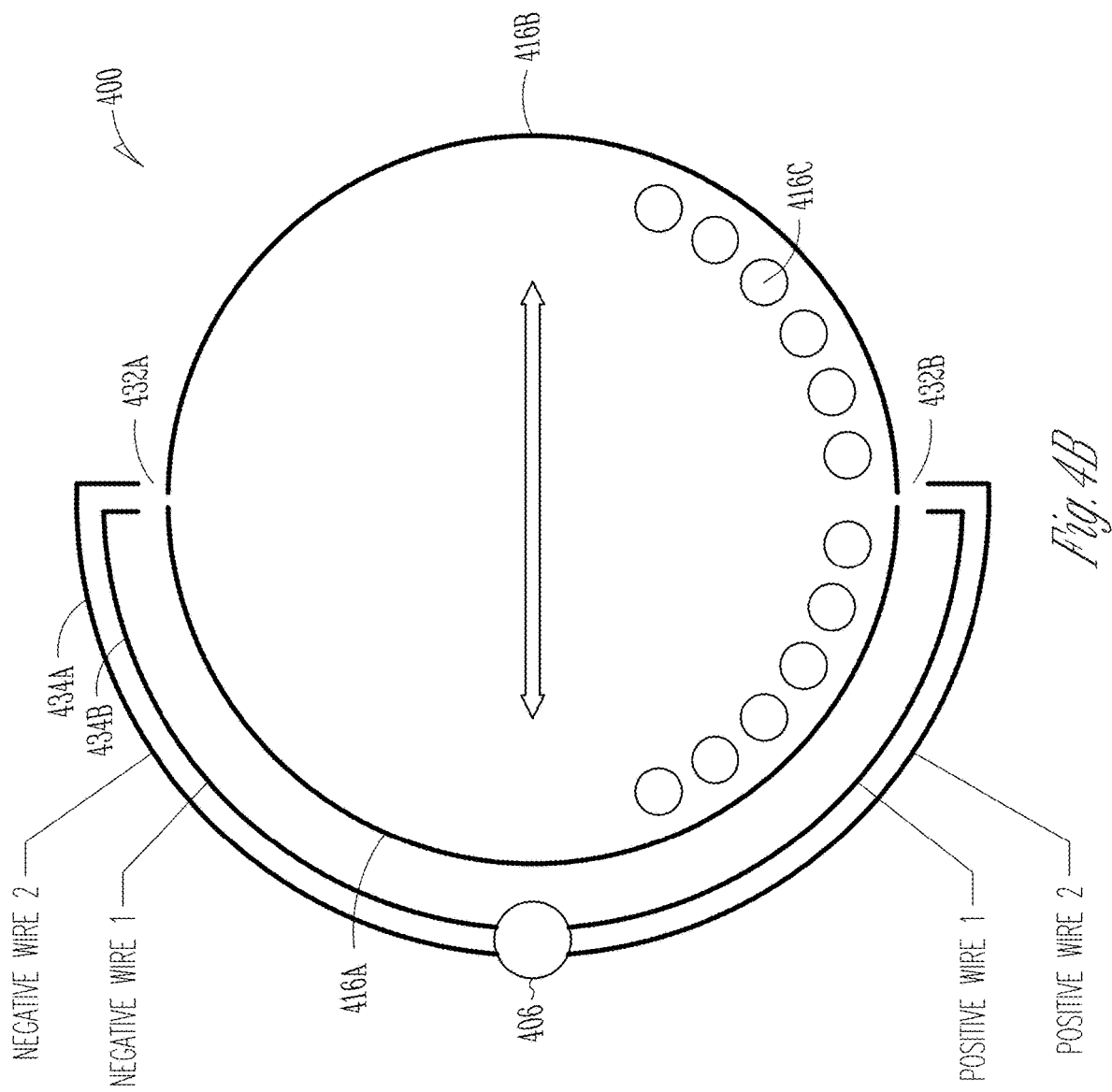

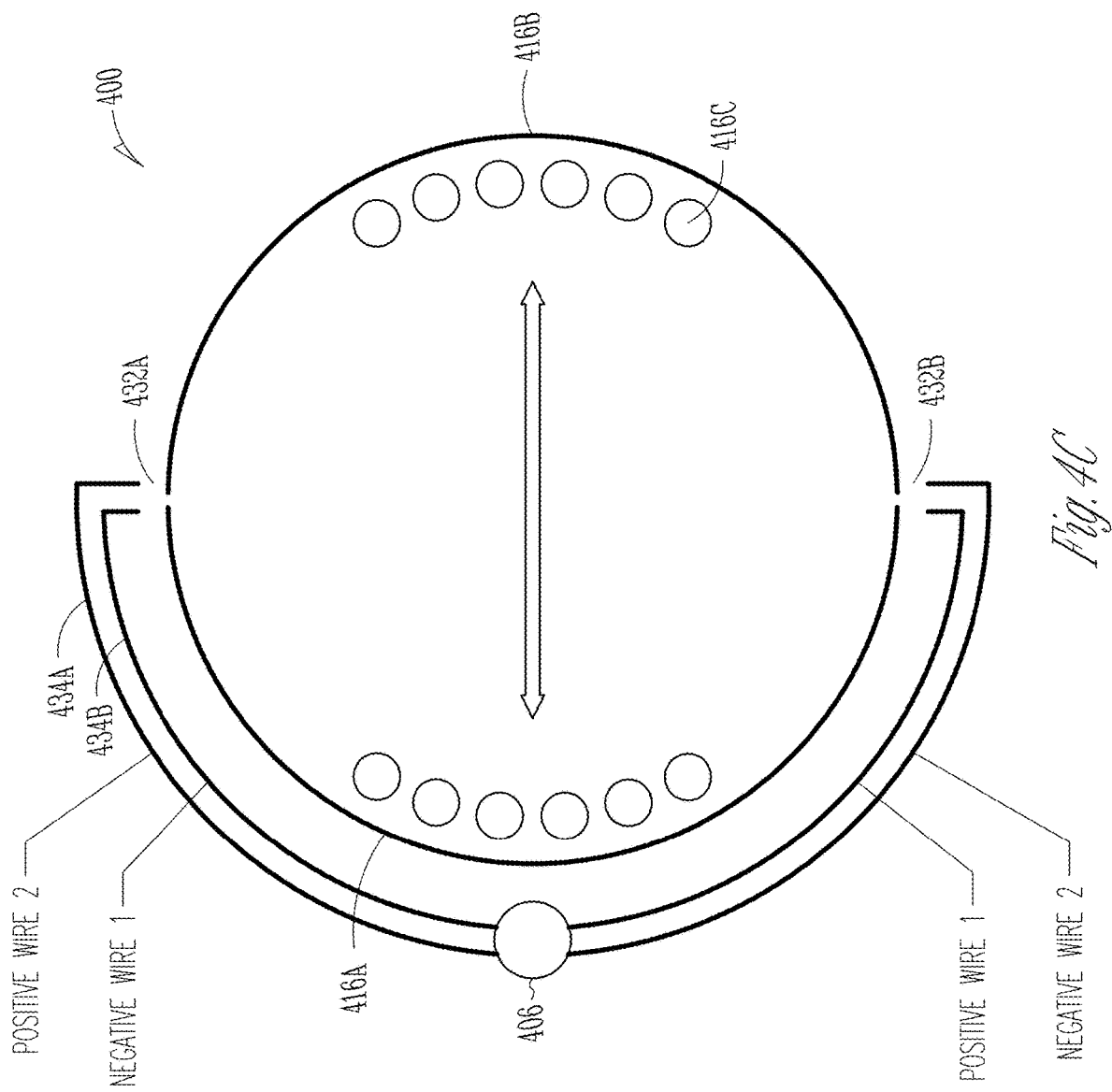

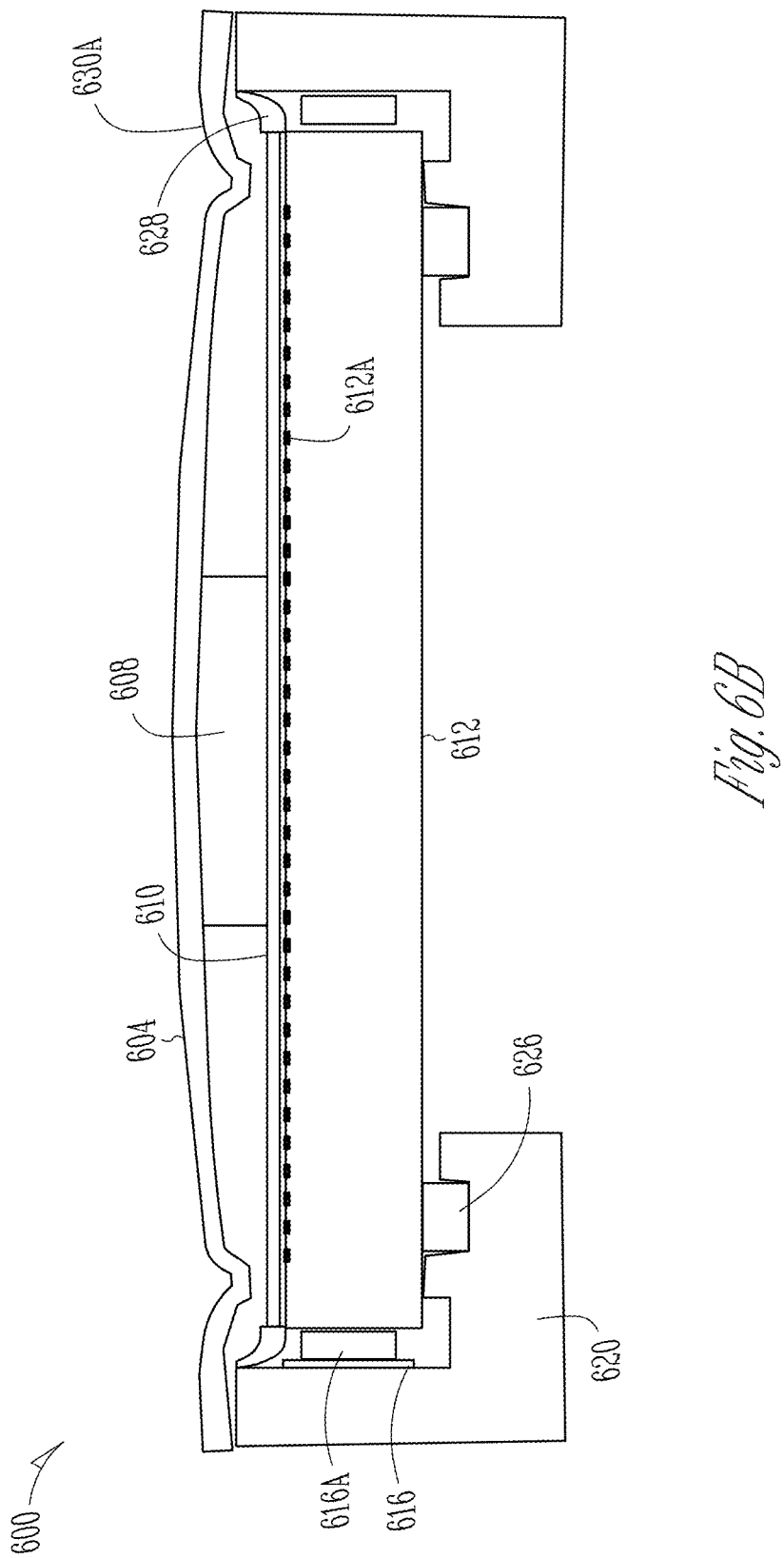

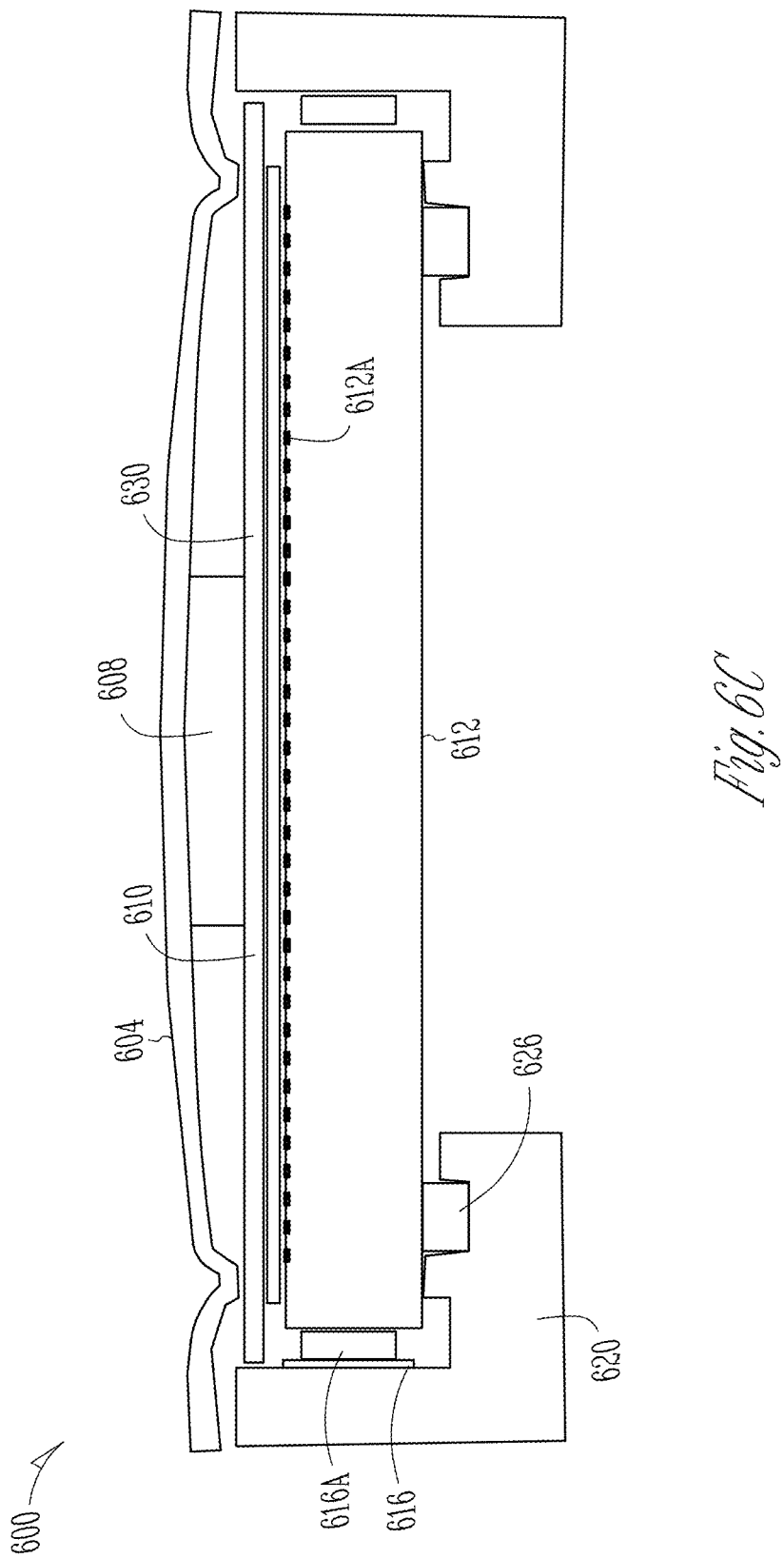

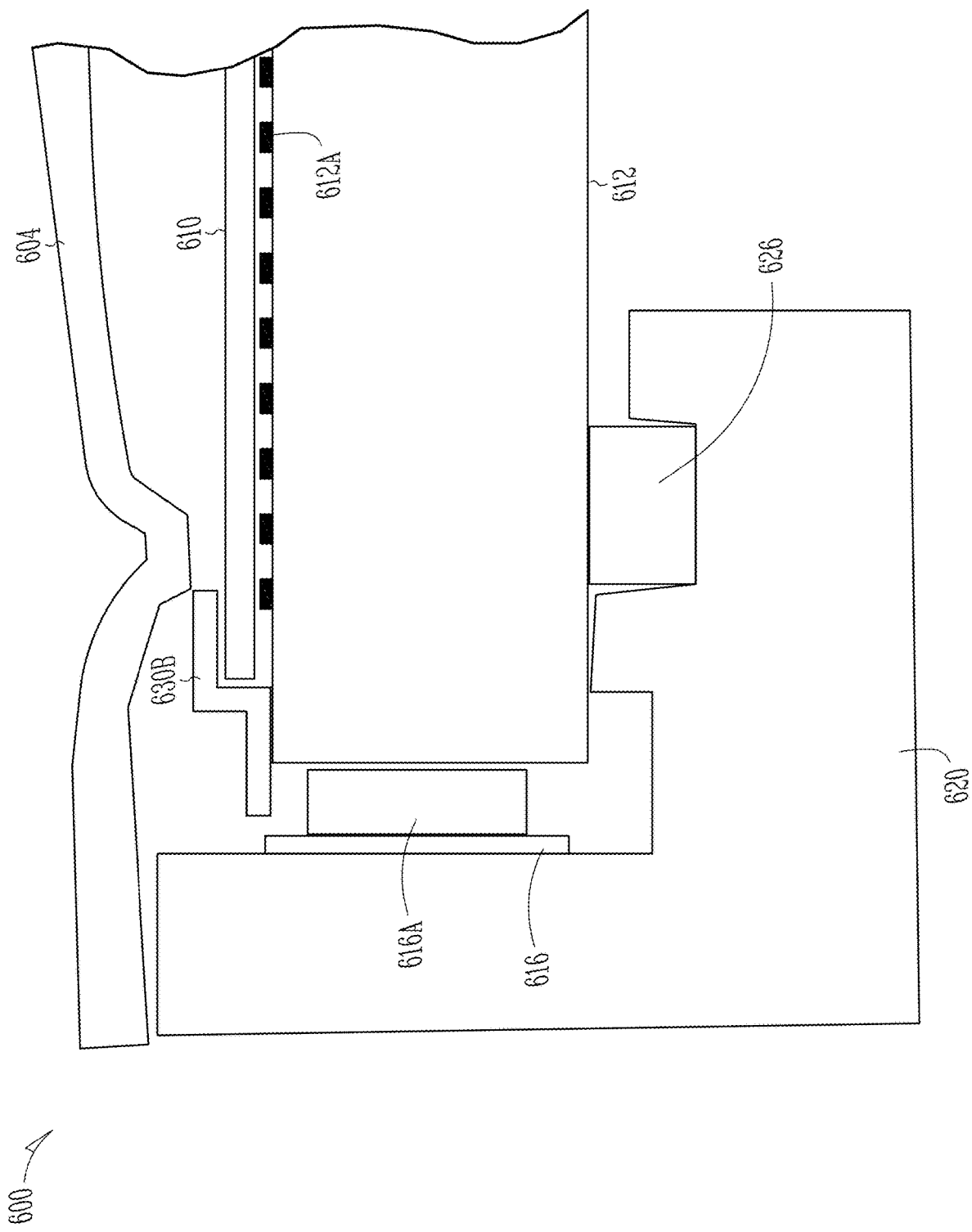

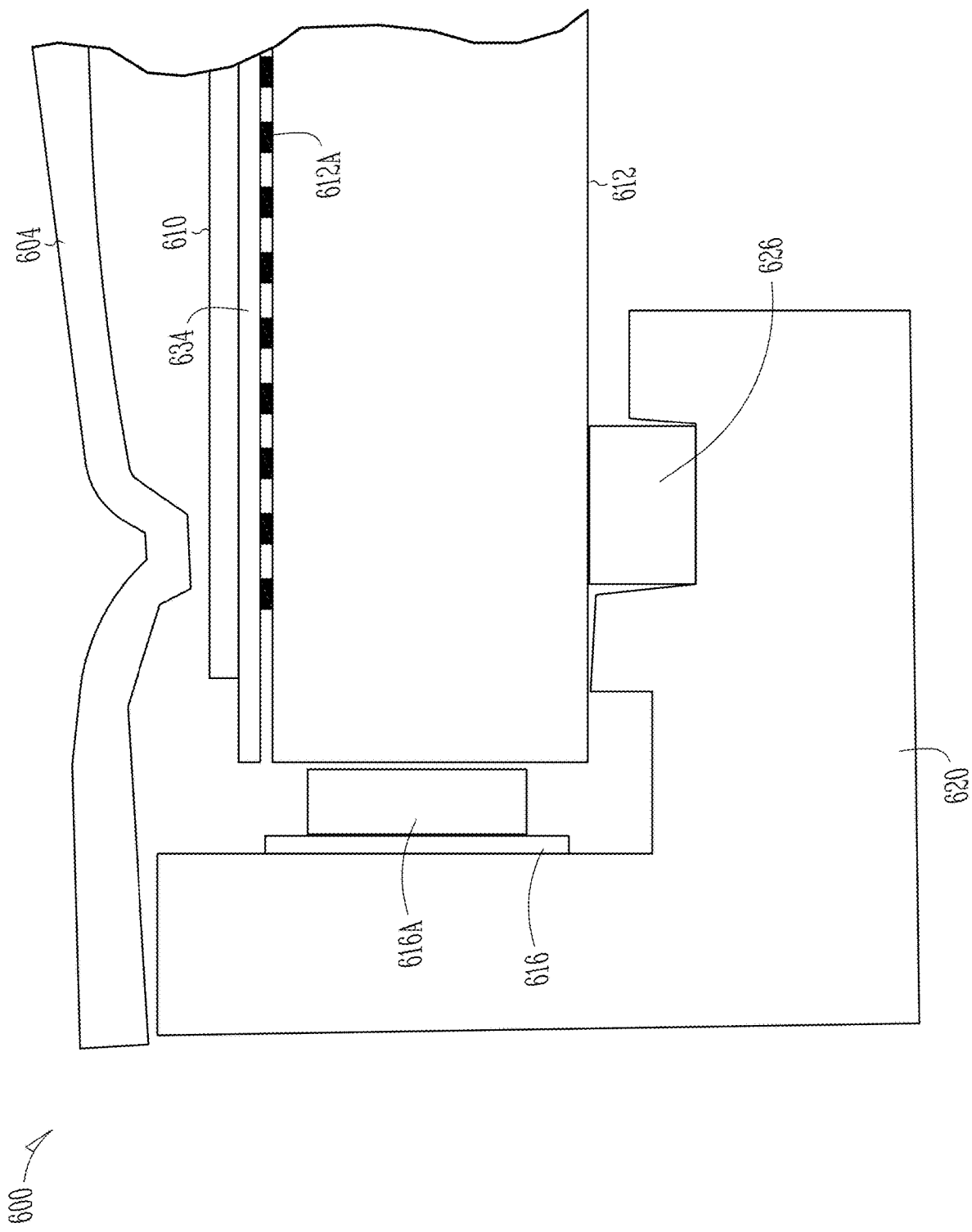

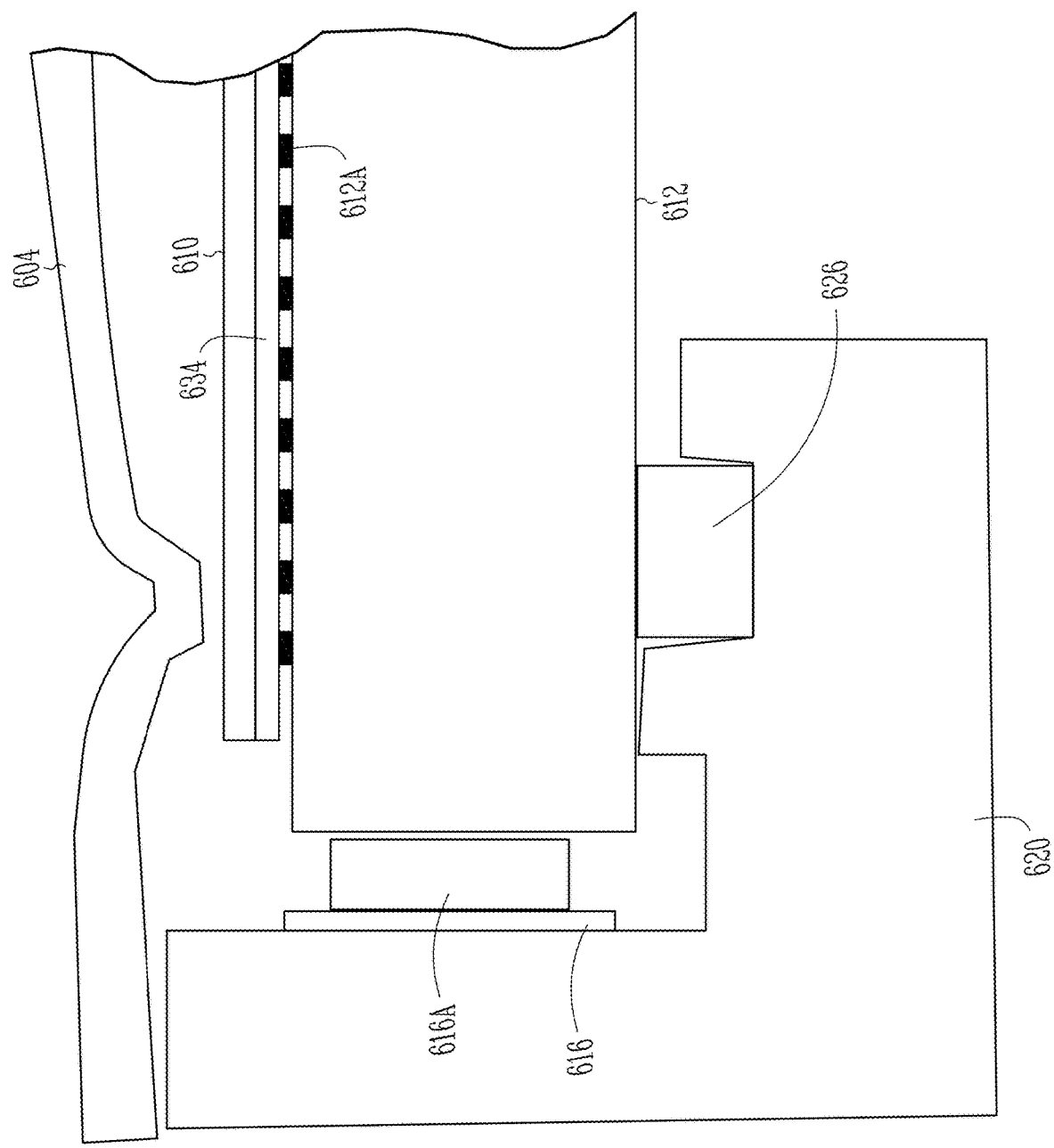

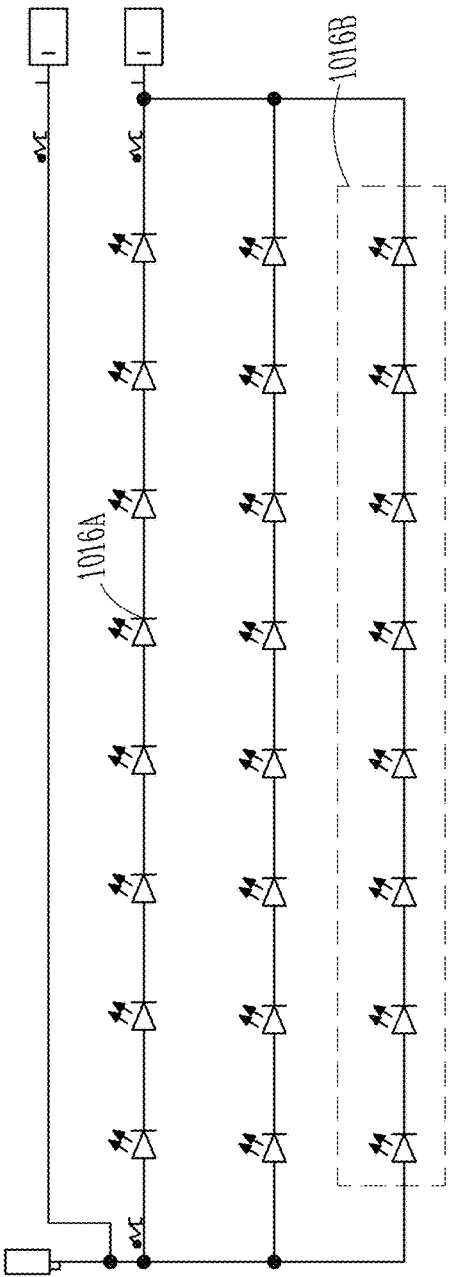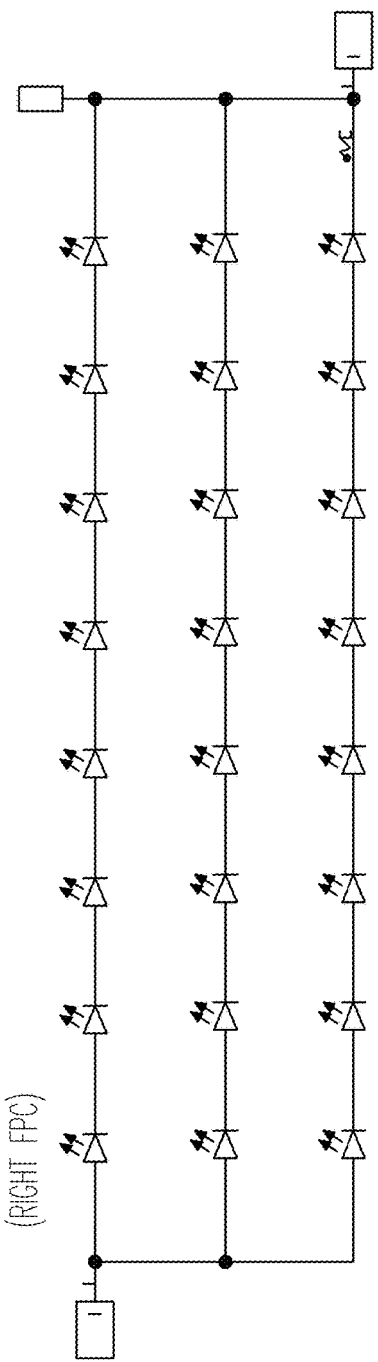
Fig. 10E

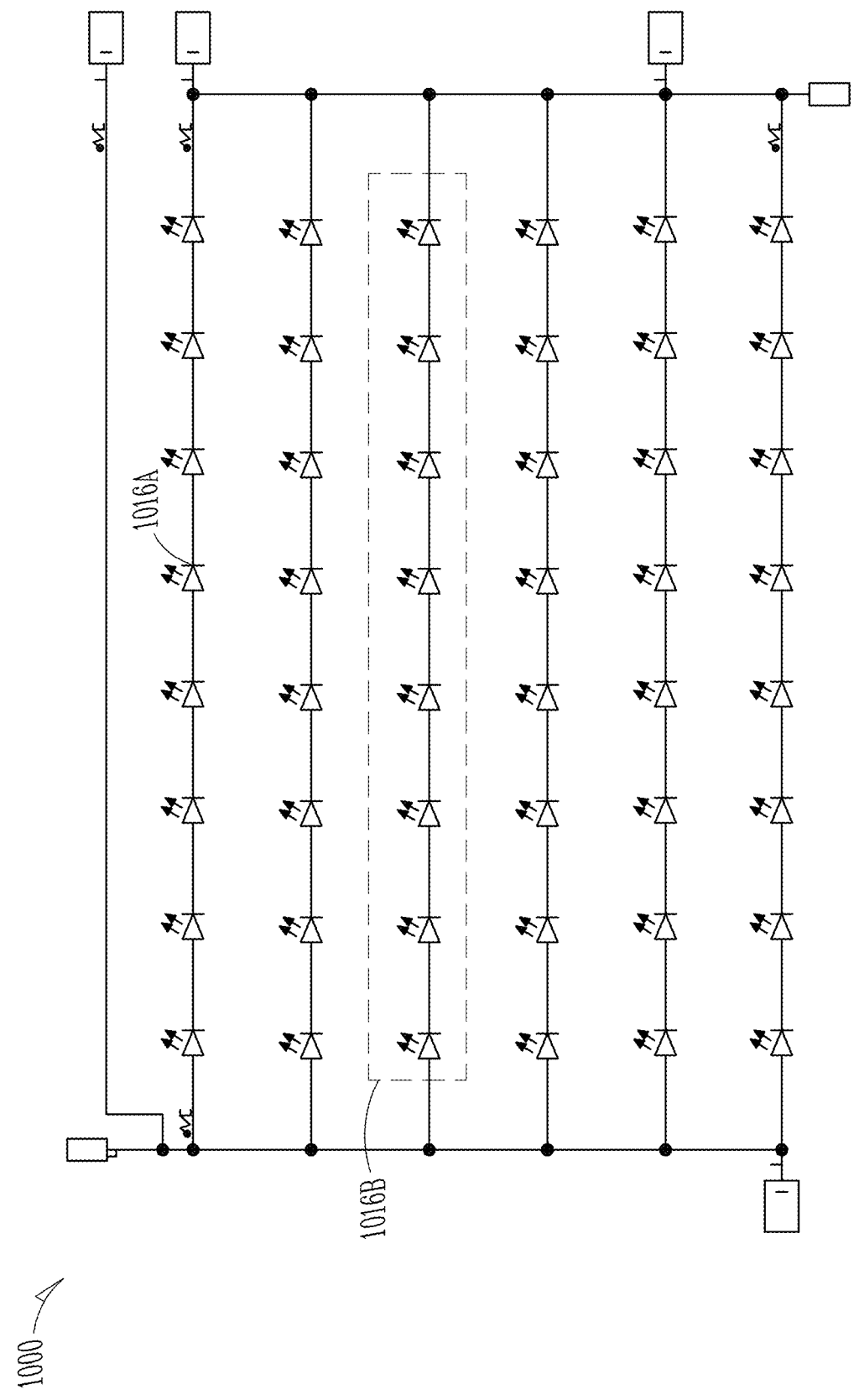

US 11,022,257 B2

LED LIGHT ENGINE FEATURES

PRIORITY

This application claims the benefit of priority to U.S. Provisional Patent Application Ser. No. 62/837,581, filed Apr. 23, 2019, U.S. Provisional Patent Application Ser. No. 62/846,072, filed May 10, 2019, and U.S. Provisional Patent Application Ser. No. 62/850,959, filed May 21, 2019, each of which is incorporated herein by reference in its entirety.

CROSS REFERENCE TO RELATED APPLICATIONS

This application is related to commonly assigned U.S. patent application Ser. No. 16/729,131, entitled "Flexible Printed Wiring Structure for LED Light Engine," U.S. patent application Ser. No. 16/729,151, entitled "Alignment Features for LED Light Engine," and U.S. patent application Ser. No. 16/729,175, entitled "Method of LED Light Engine Assembly," all filed on Dec. 27, 2019.

TECHNICAL FIELD

The present disclosure relates to a light emitting diode light engine.

BACKGROUND

Lighting applications can use light emitting diodes (LEDs) as their light sources. Many LED installations use Class 2 circuitry. Class 2 circuitry provides protection from electrical shock and carries no risk from fire. For example, in the US Class 2 compliant power supplies convert a 120V (wall) power into low voltage 12V or 24V using DC drivers that use less that 60V (in dry applications, 30V in wet applications), less than 5 amps, and under 100 W. These considerations may pose restrictions on the number of LEDs a Class 2 driver can operate simultaneously. In a number of lighting systems, however, it may be desirable to increase the number of LEDs used and/or power used by the LEDs, and thus supplied by the power supply, beyond that of Class 2. Thus, additional care may be taken in designing circuitry and installations for non-class 2 lighting systems that are not class 2 compliant.

BRIEF DESCRIPTION OF THE DRAWINGS

FIG. 2F shows another cross-sectional view of a portion of a light engine, in accordance with some embodiments.

FIG. 2G shows another cross-sectional, three-dimensional view of a portion of a light engine, in accordance with some embodiments.

FIG. 2I shows a planar view of a portion of the light engine, in accordance with some embodiments.

FIG. 2J shows a sectioned view of various portions of the light engine, in accordance with some embodiments.

FIG. 2K shows another cross-sectional view of a portion of a light engine, in accordance with some embodiments.

FIG. 2L shows another cross-sectional view of a portion of a light engine, in accordance with some embodiments.

FIG. 2M shows a perspective view of a portion of a light engine, in accordance with some embodiments.

FIG. 3C shows another bottom view of a light engine, in accordance with some embodiments.

FIG. 4A shows an example of a symmetric LED design with uniform spacing, in accordance with some embodiments.

FIG. 4B shows an example of an asymmetric LED design, in accordance with some embodiments.

FIG. 4C shows another example of a symmetric design, in accordance with some embodiments.

FIG. 6B shows another simplified geometric model of a light engine, in accordance with some embodiments.

FIG. 6C shows another simplified geometric model of a light engine, in accordance with some embodiments.

FIG. 6E shows an enlarged simplified geometric model of a portion of a light engine, in accordance with some embodiments.

FIG. 6F shows an enlarged simplified geometric model of a portion of a light engine, in accordance with some embodiments.

FIG. 6G shows an enlarged simplified geometric model of a portion of a light engine, in accordance with some embodiments.

FIG. 6I shows an enlarged simplified geometric model of a portion of a light engine, in accordance with some embodiments.

FIG. 10E shows an example of a circuit diagram for driving the FPC of FIG. 10A in accordance with some embodiments.

FIG. 10G shows an example of a circuit diagram for driving the FPC of FIG. 10C in accordance with some embodiments.

Figure 1:
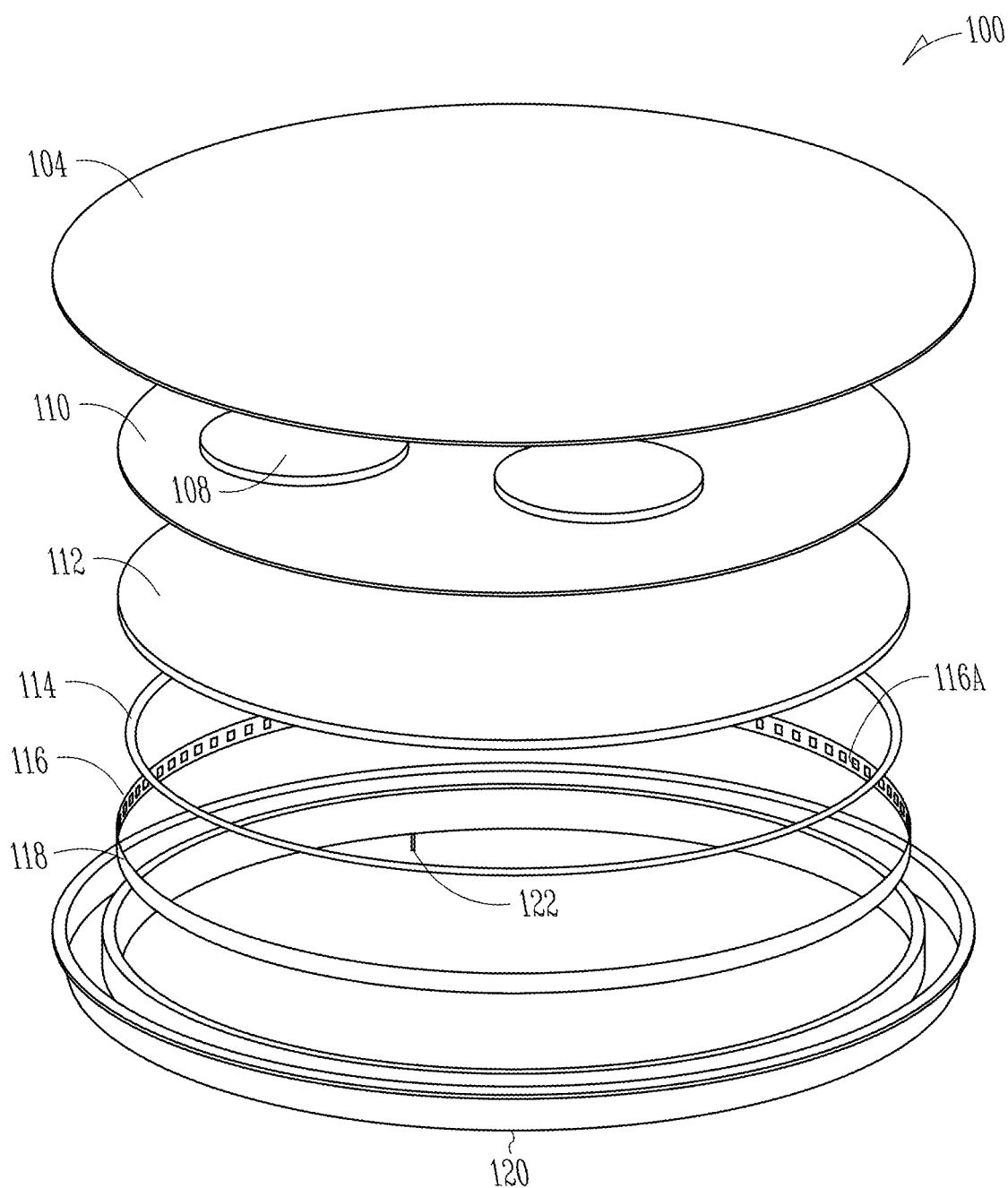
FIG. 1 shows an exploded view of an example of a light engine, in accordance with some embodiments.

Corresponding reference characters indicate corresponding parts throughout the several views. Elements in the drawings are not necessarily drawn to scale. The configurations shown in the drawings are merely examples, and should not be construed as limiting the scope of the disclosed subject matter in any manner.

DETAILED DESCRIPTION

Non-Class 2 lighting systems are discussed in detail below. The lighting systems may be suitable for indoor or outdoor applications. Such lighting systems may use LEDs and light-guide technologies to provide lighting because of reduced glare and pleasing appearance when the lighting system is in both an on state, in which one or more of the LEDs of the system provide illumination, and an off state, in which none of the LEDs provide illumination. For example, as described in more detail below, outdoor applications of the LED systems (such as pedestrian path lights) can use fairly expansive batwing-shaped light distributions (e.g., see FIG. 5) in a vertical plane, while indoor applications (such as flat-screen displays and luminaires) can use more Lambertian (e.g., a diffusely reflecting surface, where an apparent brightness of the surface to an observer is substantially the same regardless of the observer's angle-of-view) light distributions. LEDs with light-guide optics can be used with both indoor and outdoor applications.

As described above, Class 2 lighting systems can be relatively straightforward to design and manufacture due to the relatively low power. However, for relative high-power and/or high voltage (non-Class 2) lighting systems, additional safety-related factors may prove more challenging to meet in a design. Specifically, meeting standards known as, for example, UL8750 approbations standard (in North America) or EN 61347-2-13 and EN61347-1 (in Europe) can create challenges when designing and manufacturing a high-power LED light engine for a non-Class 2 system.

FIG. 1 shows an exploded view of an example of a light engine, in accordance with some embodiments. The light engine 100 can be used for a variety of different applications, such as indoor and/or outdoor lighting, signage, signals, emergency vehicle lighting, luminaires, pedestrian lights, pole lights, and other applications. The light engine 100 may be a non-class 2 device in which a flame-retardant barrier is not used due to the dimensions and materials selected for the elements used therein.

The light engine 100 contains a number of elements connected together with connectors, such as screws or other mechanical fasteners known in the art, or, for example, chemical fasteners such as adhesives. The light engine 100 provides light from LEDs 116a mounted on a flexible printed circuit (FPC) 116 (also referred to as a flexible printed circuit board). In some embodiments, the FPC 116 may be shaped as a circular loop (although other shapes may be used), with the LEDs 116a facing inward toward the center of the loop in some embodiments or outward away from the center of the loop in other embodiments.

The LEDs 116a can thus be mounted or otherwise mechanically supported or adhered by the FPC 116 (e.g., via a direct support requirement (DSR)) as well as being electrically powered by the FPC 116 and positioned to emit light inwards toward a center of the circular loop. The LEDs 116a can be soldered or otherwise electrically coupled onto the FPC 116. Drivers for the LEDs 116a can also be positioned on, or otherwise connected to, the FPC 116. The LEDs 116a, the accompanying circuitry (of the FPC 116 and elsewhere), and mechanical/optical elements can be designed to function at a maximum operating temperature (MOT) of 90° C., 105° C., or any suitable value, as desired dependent on the application and environment in which the light engine 100 is to be used.

The LEDs 116a can be arranged in a line along the FPC 116 (e.g., each LED 116a centered along the same line) or can be arranged in a two-dimensional pattern, such as an array. In some examples, the LEDs 116a can be arranged symmetrically around the FPC 116, with equal spacing around the loop (adjacent LEDs 116a having substantially the same distance therebetween). Such symmetry in some cases may be used to produce a generally uniform output beam. In other examples, the LEDs 116a can be arranged asymmetrically around the flexible printed circuit. One example of asymmetric arrangement may include the LEDs 116a positioned only on one half of the loop, with the other half lacking LEDs 116a (such as being arranged in a semicircle or in any number of segments whose total angular distribution is about 180°). In other examples, the LEDs may cover angular distributions other than about 180° (in any number of segments). Such asymmetry can produce beam shaping, which may be used in applications in which beam-shaping is desirable.

A generally planar, light guide plate (LGP) 112 can be positioned in an interior of the circular loop. The LGP 112 may be formed as a substantially circular disc as shown, or in a multi-sided shape (e.g., octagon) in other embodiments. The shape may be dependent, for example, on the light arrangement desired from light engine 100, in addition to or instead of the LED placement. The LGP 112 may receive light emitted by the LEDs 116a through a circumferential edge of the LGP 112. The LGP 112 can be shaped as a generally planar disc having a circular edge. In some examples, the LGP 112 can have a thickness of about 6 mm and a diameter of about 483 mm (approximately 19 inches). Note that here, as with all other measurements, the measurements are provided at about room temperature (e.g., about 20° C.-25° C.) and have a tolerance associated therewith. In some examples, the LGP 112 can be formed from poly(methyl methacrylate) (PMMA), glass or any other substantially transparent material. When the LGP 112 is formed from PMMA with a thickness of 6 mm can allow the LGP 112 to pass a UL94 V0 requirement, which limits flammability of plastic materials. The UL94 V0 requirement requires burning to stop within ten seconds on a vertical specimen, with drops of particles being allowed as long as they are not inflamed. By forming the LGP 112 from PMMA with a thickness of 6 mm, the maximum operating temperature of the LGP 112 may be greater than 90° C. In some examples, the LEDs 116a can be spaced greater than or equal to 1.6 mm from an edge of the LGP 112. The LGP 112 may have a dispersive pattern (e.g., dots, see FIG. 9) on one or more surfaces, such as a lower surface through which light exits to illuminate objects thereunder or an upper surface.

The LGP 112 may rest on a gasket 114 disposed within a chassis 120. The gasket 114 may be supported by the chassis 120 to allow the edge of the LGP 112 to be centered over the LEDs 116a. The gasket 114 may be a frontside gasket that, like a backplate gasket provided in a groove of the backplate 104, can help protect the light engine 100 from water and dust ingress. The gasket 114 in some embodiments may be formed from silicone, such as white silicone. The chassis 120 may be formed from a metal, such as aluminum. A thermocouple (TC) point 118 may be used to measure the temperature of the chassis 120. The TC point 118 may be located, for example, on top of the connector at the LED side.

A reflector 110 may be positioned directly adjacent to the LGP 112. The reflector 110 may in some embodiments be shaped similar to the LGP 112. In other embodiments, the reflector 110 may be formed independent of the shape of the LGP 112. As above, the reflector 110 may be formed as a substantially circular disc. The reflector 110 may be positioned adjacent to the upper surface of the LGP 112 to reflect light from the LGP 112 back toward the LGP 112.

The reflector 110 can be formed from a metal or other reflective material. In some examples, the reflector 110 can be formed from aluminum, and reflect substantially all light—e.g., having a reflectivity greater than or equal to 94% over all or a portion of the visible spectrum (e.g., having a wavelength between 400 nm and 700 nm). The reflector 110 can be attached with electrical tape or another adhesive. The electrical tape can be positioned on one or more portions of the top and bottom surfaces of the reflector 110. In some examples, tape on the top and/or bottom surface may extend radially outward past the circumferential edge of the reflector 110 and may be stuck to each other via adhesive on the tape. In some examples, the adhered tape portion may be bent approximately orthogonally to a plane of the top/bottom surface of the reflector 110, which may be bent away from the LEDs 116a.

The reflector 110 may have a first side facing the LGP 112 and a second side facing away from the LGP 112. The reflector 110 in some embodiments may be separated from a backplate 104 by one or more gap fillers 108. The gap fillers 108 may be formed from foam or another material and may have any desired shape, such as a circular disc shape or a semicircular shape (with the flat portion facing inwards). The gap filler 108 can have a thickness and durability selected to reduce or eliminate a gap between the reflector 110 and the LGP 112. Reducing or eliminating the gap can reduce or eliminate shadowing caused by the gap fillers 108. In other embodiments, the reflector 110 may only be separated along edges of the reflector 110, instead contacting the reflector backplate 104 over a substantial portion of the diameter of the reflector 110 and eliminating the gap filler 108.

The backplate 104 may be formed from a metal. The backplate 104 may be, in some embodiments, about 1.53 mm. The backplate 104 may be positioned adjacent to the reflector 110 on a side opposite the LGP 112. The backplate 104 may be connected to the chassis 120 by one or more fasteners. A cable reliever may be disposed on the backplate 104 to provide support for one or more cables used to hang or otherwise retain the light engine 100. The stress reliever can prevent tearing the electrical cables off main connection points.

A set of locator pins 122 (also called light guide alignment pins) may have matching slots in optics (not shown in FIG. 1) below the chassis 120 of the light engine 100, which can help meet a specified minimum distance requirement between the LEDs 116a and their live traces and the input surface of the optics. In some examples, the specified minimum distance can be 0.8 mm. The locator pins 122 can space apart two or more of the optical or mechanical elements. For example, the locator pins 122 can be used to account for thermal expansion (in conjunction with slots in the LGP 112, as described in more detail below), so that elements of the light guide engine 100 are able to expand and contract without breaking or causing unwanted displacement of any such element. A creepage and clearance distance in the FPC 116 can be greater than or equal to about 1.6 mm. This clearance distance can be the edges of the outer electrical traces to the edges of the FPC 116.

A maximum opening without the LGP 112 may be minimized or reduced to prevent electrical accessibility and therefore bypass any requirement for low-temperature impact tests to the LGP 112. The size of the light engine 100, a metal choice of the chassis 120 and/or backplate 104 and other metal components, and a spacing of the LEDs 116a may be designed to maximize or increase thermal dissipation and pass, for example, a UL8750 thermal test at a maximum power output. Flats in the chassis 120 can be designed to prevent any issue of air gaps below the LEDs 116a.

The FPC 116 may be designed such that male electrical connectors and wires that supply power to the LEDs 116a are located outside the optical path, which can improve the light-emission surface uniformity and increase the optical quality. The FPC 116 can optionally allow for curved shapes.

FIGS. 2A-2M show various views (e.g., cross-sectional/top) of a portion of a light engine and components thereof, in accordance with some embodiments. The various components are sized and positioned as shown and described to permit automatic adjustment for differences between materials with different coefficient of thermal expansions (CTEs) as the temperature of the light engine changes, as well as alignment for continued proper orientation of the light from the light engine. In addition, the size and spacing of the components in the light engine are designed to reduce or minimize the presence of air gaps below the LEDs shown, as well as preventing ingress of contaminants such as dust and water into the light engine.

Figure 2A:
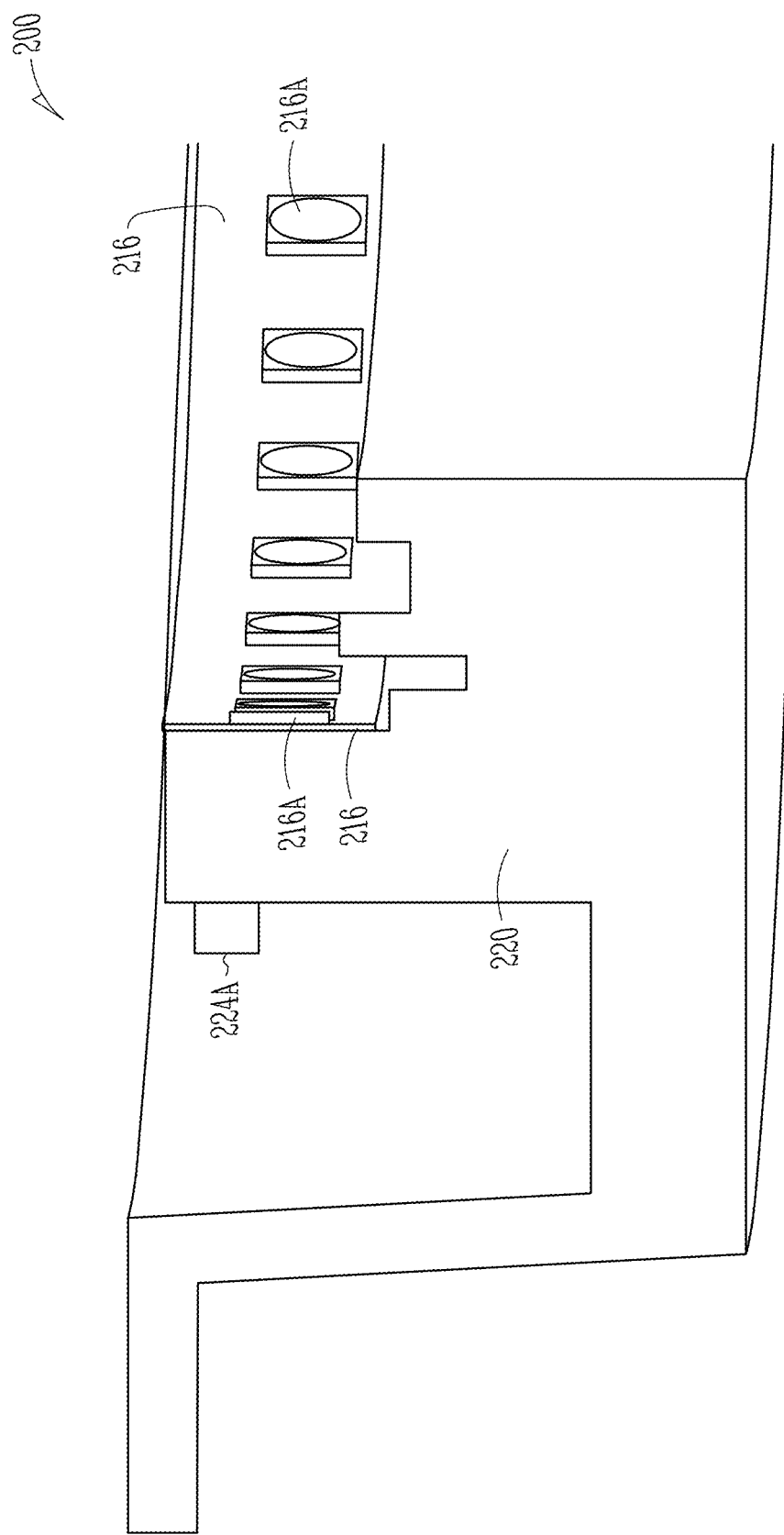
FIG. 2A shows a cross-sectional view of a portion of a portion of a light engine, in accordance with some embodiments.
Figure 2B:
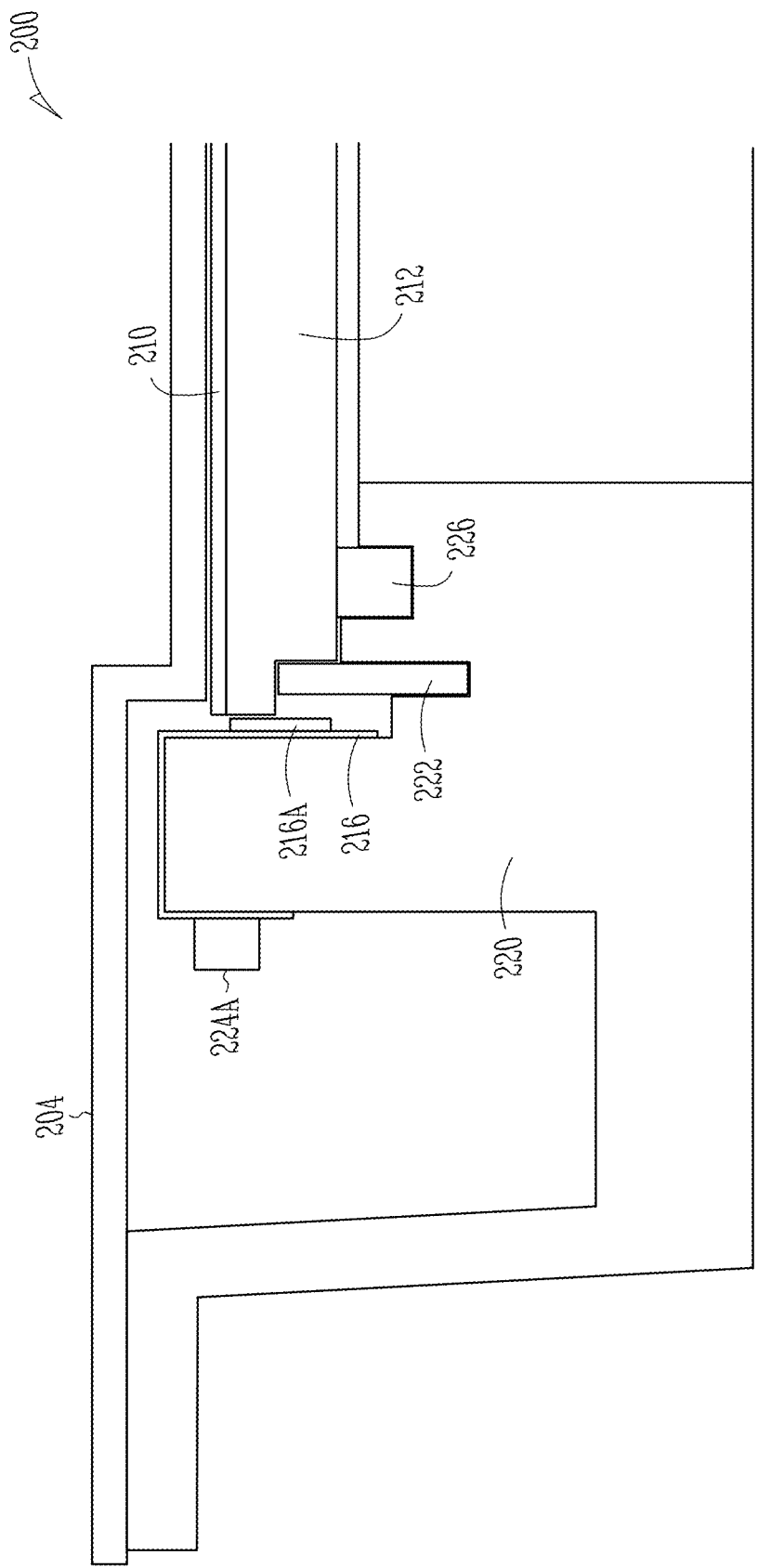
FIG. 2B shows a cross-sectional view of a portion of a light engine, in accordance with some embodiments.
Figure 2C:
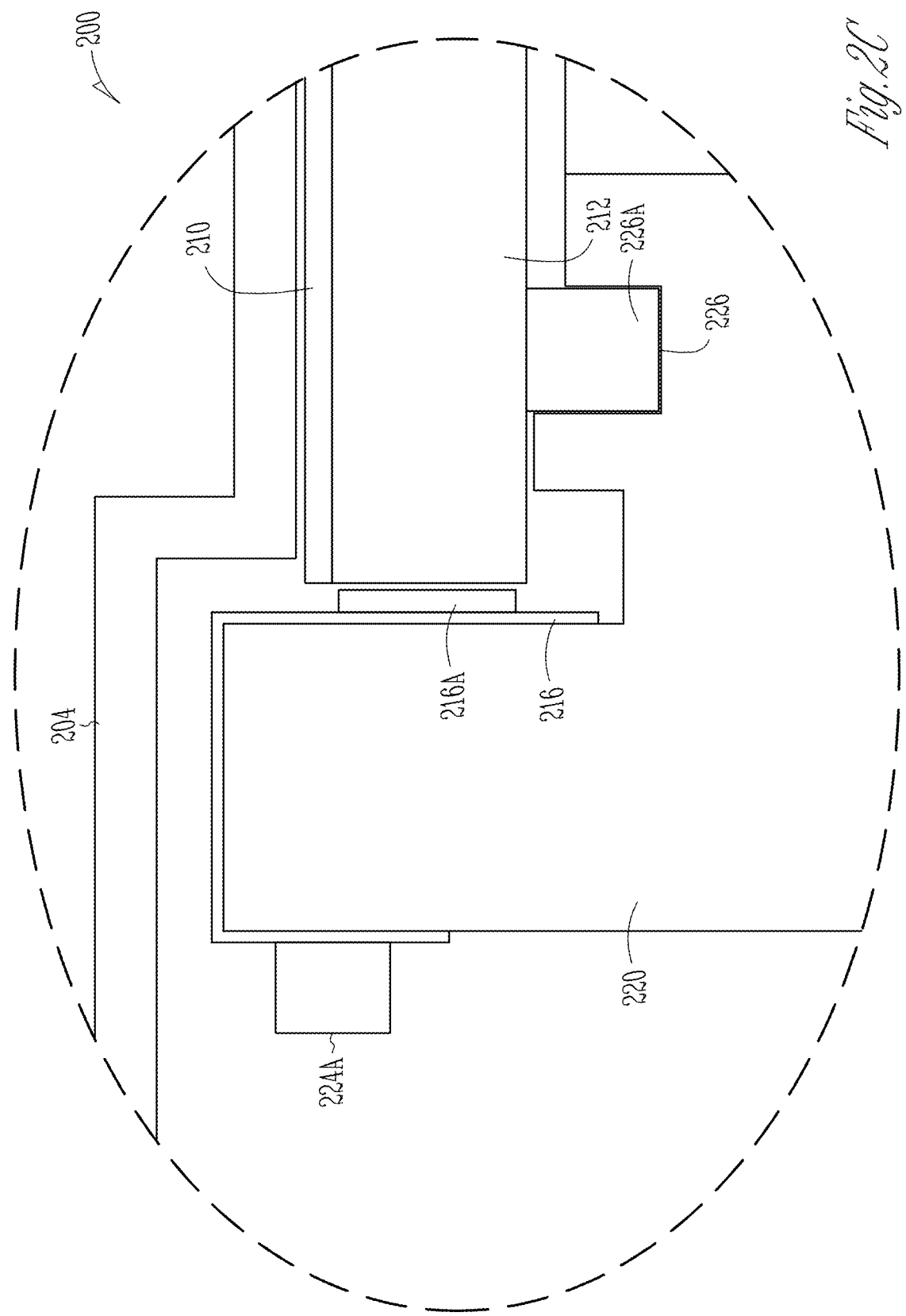
FIG. 2C shows an exploded view of a cross-sectional view of a portion of a light engine, in accordance with some embodiments.

While only a partial cross-section of the light engine 200 is shown in FIG. 2A, many of the physical features shown in FIG. 1, such as the presence of a backplate, reflector, etc. may be provided, only some of which are shown in FIGS. 2B and 2C. As shown in FIGS. 2A-2C, the light engine 200 may contain multiple FPC 216, with each FPC 216 containing multiple LEDs 216a. The FPC 216 may be coincident with the bottom of the chassis 220.

Similar to the arrangement of FIG. 1, the FPC 216 in FIG. 2A may be retained in a frame or chassis 220 in a semicircular shape in a manner similar to that of FIG. 1. The chassis 220 may have an inner cavity in which the optical components are disposed and an outer cavity in which wiring is disposed. The FPC 216 may, for example, be about 11.5 mm in height and 381 mm in length. A connector 224a (FIG. 2B) within the chassis 220 may make electrical contact to the FPC 216 and provide power, ground, and/or signals to the FPC 216 and LEDs 216a through one or more extensions 216c of the FPC 216 (also called fingers of the FPC 216), which are shown more clearly in FIG. 2G. Bending the extension 216c over the sidewall of the cavity in the chassis 220 eliminates shadows being formed by the power and control circuitry within the light engine 200. The FPC 216 may be disposed on the circular inner wall of the inner cavity of the chassis 220. The FPC 216 may be retained on the wall by insulating tape, for example, or may be soldered to a bridge that connects an inner and outer cavity, as described in more detail below. In some embodiments, each FPC 216 may extend around about half of the diameter of the inner wall, the light engine 200 containing two FPCs 216. In other embodiments, each FPC 216 may extend around one third or one quarter, for example, of the diameter of the inner wall. In some embodiments, the connector 224a may make electrical contact with the FPC 216 and inward facing LEDs 216a. Placement of the LEDs 216a along each FPC 216 may be similar to that described in relation to FIG. 1.

In some embodiments, optics such as the LGP 212 may be disposed between at least a portion of the chassis 220 and the FPC 216. As shown in FIGS. 2B, 2C, 2K and 2L, a reflector 210 may be disposed above the FPC 216 and LEDs 216a and an LGP 212 may be disposed between the inward facing LEDs 216a. The LGP 212 may be centered around an opening in the bottom surface of the chassis 220 through which light from the LEDs 216a are emitted. In some embodiments, the LGP 212 may be larger than the opening in the bottom surface of the chassis 220, such that an edge of the LGP 212 interacts with other components, such as the gasket 226 and locator pins 222. In some embodiments, the opening in the chassis 220 may have sidewalls that are substantially perpendicular to the surface of the chassis 220 that faces the LGP 212 throughout the opening. In other embodiments, only a proximate portion of the sidewalls adjacent to the surface that faces the LGP 212 may be substantially perpendicular to the surface that faces the LGP 212, while the remaining portion (more distal from the surface that faces the LGP 212 than the proximate portion) may have a chamfered edge. The chamfered edge may be formed at an acute angle of about 45 degrees, for example.

A backplate 204 may be attached to the chassis 220 via multiple fasteners, such as screws. The screws may be disposed symmetrically around the backplate 204. For example, eight screws (and thus screw holes) may be disposed along the circumference of the backplate 204, having about a 45° angle therebetween. The backplate 204 may not be completely flat; as above, in some embodiments, the backplate 204 may have a recess formed in a center area over the reflector 210 or may have grooves formed over the reflector 210. In some embodiments, an intermediate portion of the backplate 204 may be bent at an about a 90 degree angle between the portion of the backplate 204 disposed over the outer cavity and the portion disposed over the reflector 210. The intermediate portion of the backplate 204 may be disposed over, or proximate to (e.g., within several mm of) an edge of the reflector 210. In other embodiments, the intermediate (bent) portion may be formed at an acute angle of about 45 degrees, extending over about the same range proximate to the edge of the reflector 210. Locator pins 222 may be used to retain the LGP 212 in the chassis 220.

A gasket 226 may be used, as in FIG. 1, to prevent the ingress of air and/or moisture into the light engine 200. The gasket 226 may be essentially flat or have multiple ridges extending from a base portion. In some embodiments, the height of the gasket 226 may be about 5.08 mm, the width of the gasket 226 between the ridges is about 3.86 mm and across the base portion 226a is about 3.96 mm, and the height of the ridges is about 2.54 mm. The gasket 226 may have a diameter of about 473.9 mm (for outer edge distance) or about 464.9 mm (for center-to-center distance). The locator pins 222 may be seated in a machined hole in the chassis 220 such that the locator pins 222 do not contact the LGP 212 when the gasket 226 is fully compressed.

Figure 2D:
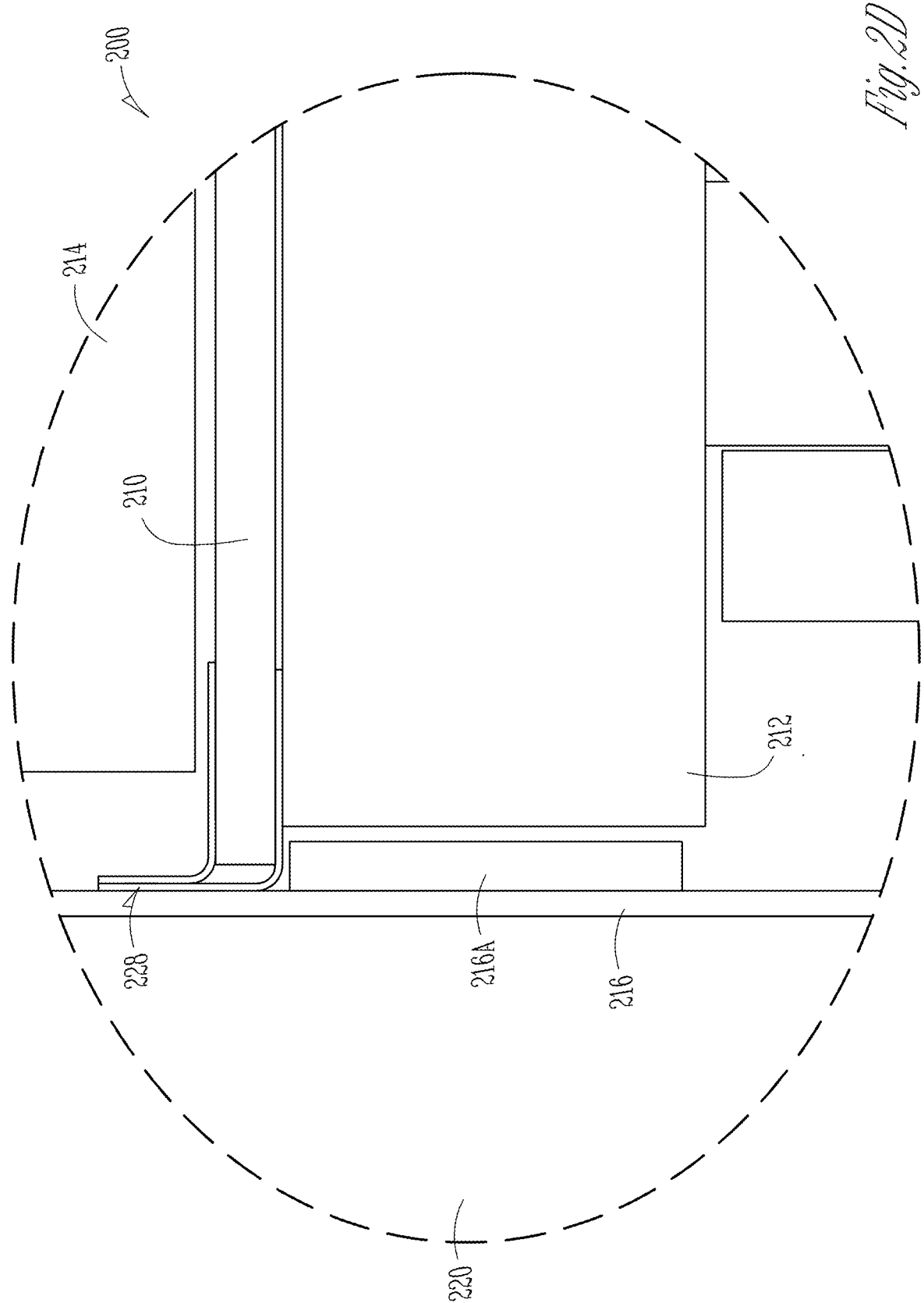
FIG. 2D shows another exploded view of a cross-sectional view of a portion of a light engine, in accordance with some embodiments.

In some embodiments, the distance from the FPC 216 on the chassis 220 to the LGP 212 may be about 1.5 mm, the distance between the top of the backplate 204 and the bottom of the chassis 220 may be about 32.2 mm, the width of an inner cavity of the chassis 220 in which the FPC 216 and LEDs 216a are retained may be about 11.5 mm, a thickness of the backplate may be about 1.59 mm, a distance between the top of the LEDs 216a to the reflector 210 may be about 0.51 mm, the distance between the reflector 210 and the middle of the LEDs 216a may be about 2.44 mm, the distance between the middle of the LEDs 216a and the bottom of the LGP 212 may be about 3.56 mm, the distance between the FPC 216 on the inner wall of the chassis 220 and the reflector may be about 0.71 mm, the distance between the bottom of the LGP 212 and the bottom of the chassis 220 may be about 20.3 mm, and the distance between the bottom of the cavity in the chassis 220, the length of the locator pin 222 may be about 9.53 mm and the locator pin 222 may be about 3.84 mm. As shown in FIG. 2D, electrical tape 228 may be attached to, and extend from an edge of, the reflector 210. The electrical tape 228 may, in some embodiments, extend from the edge of the reflector 210 around the entire circumference of the reflector 210. The electrical tape 228 in some embodiments may be, an electrically-insulating polyimide tape that meets flame retardant requirements of UL510, Product Category OANZ2) that has a width of greater than about 1.6 mm. The electrical tape 228 may have a thickness of about 0.06 mm and extend from the edge of the reflector 210 radially in either direction (i.e., both inward and outward from the edge) by a distance of greater than about 1.6 mm, such as about 1.75 mm. The length of radial extension from the edge of the reflector 210 may be the same in both directions or may be different (e.g., less inward than outward). The use of the electrical tape 228 may help to prevent generation of Moiré patterns due to the separation between the reflector 210 and the LGP 212, as described in more detail below.

Figure 2E:
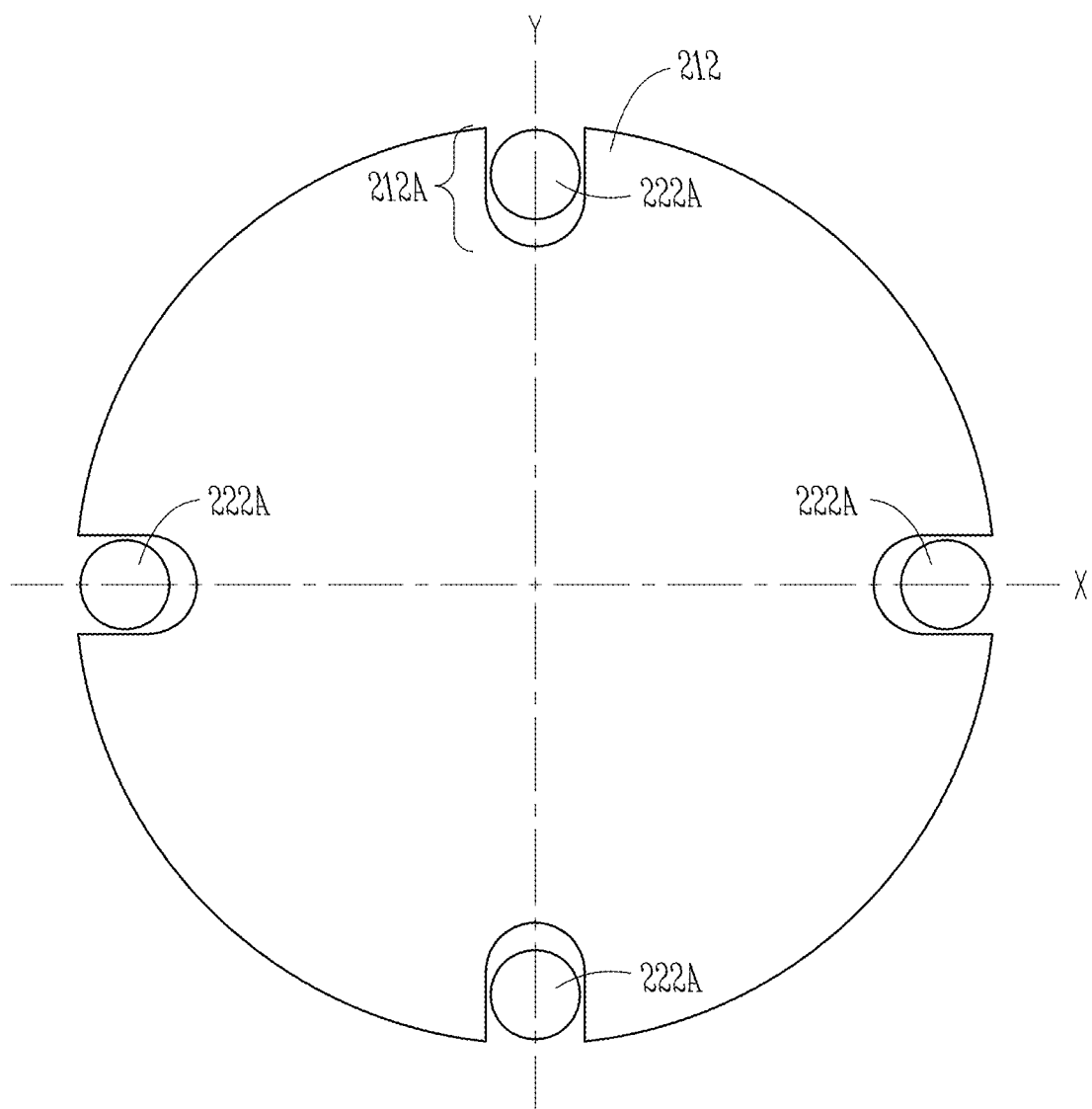
FIG. 2E shows a light guide plate, in accordance with some embodiments.
Figure 2H:
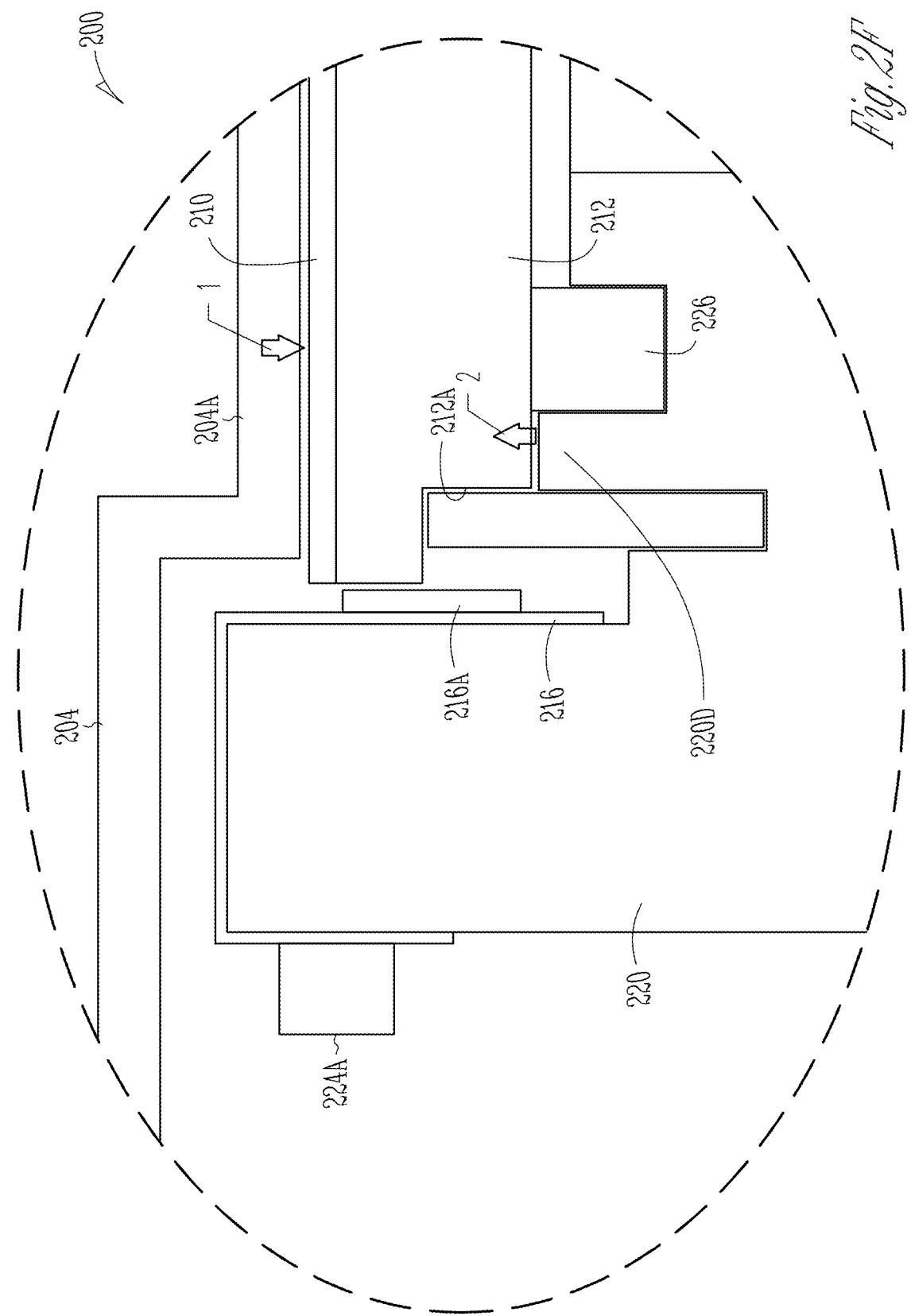
FIG. 2H shows another exploded view of cross-sectional view of a portion of a light engine, in accordance with some embodiments.
Figure 2H:
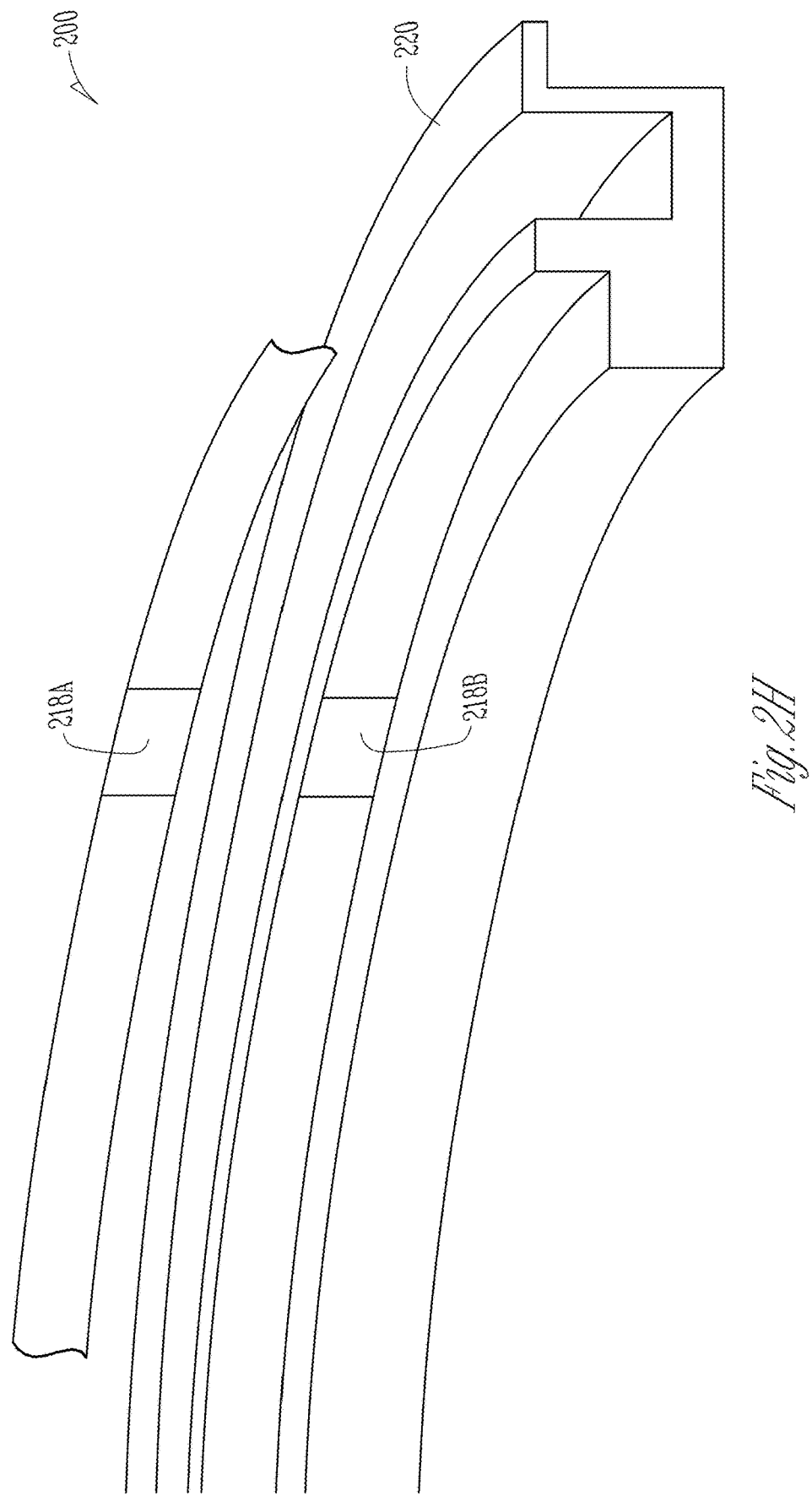
Figure 21:
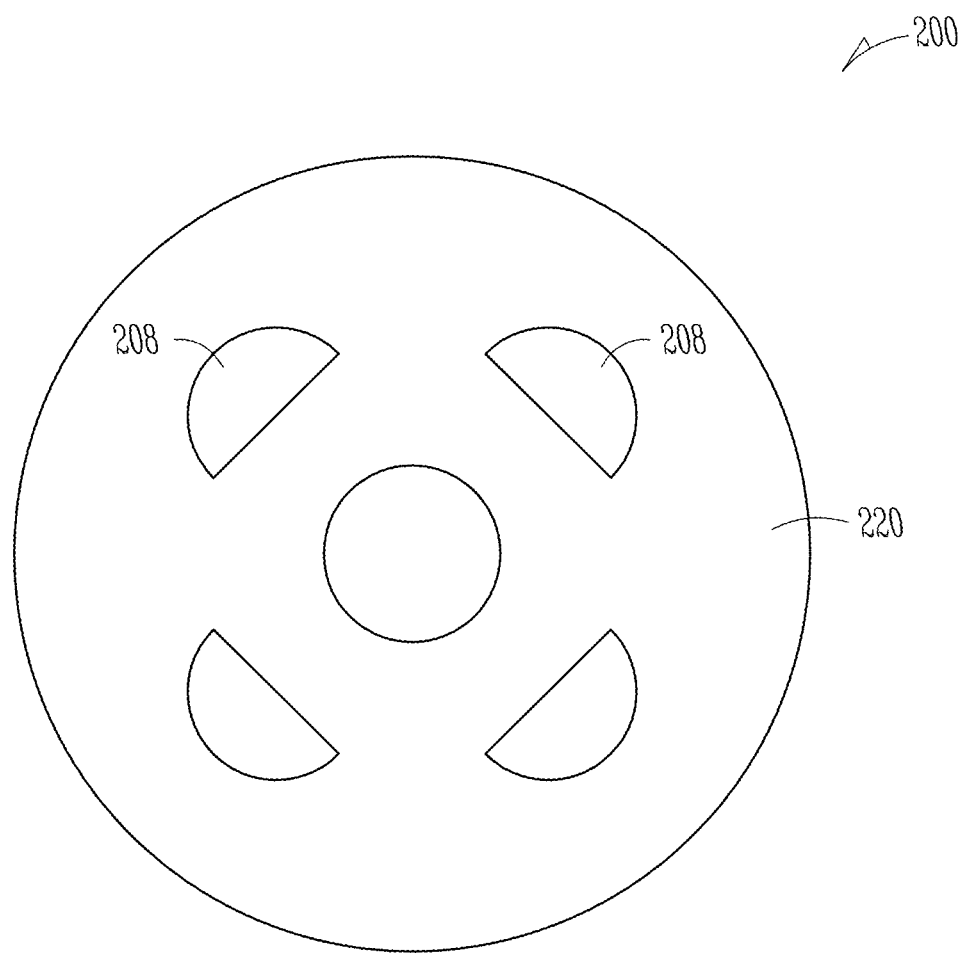

FIG. 2E shows a light guide plate, in accordance with some embodiments. The LGP 212 may have slots 212a that are openings formed therein that are used for retaining the locator pins 222a, 222b, which maintain the LGP 212 in place. In some embodiments, such as that shown in FIG. 2H, insulating tape 218a may cover solder joints (not shown) on the "L" portion of the FPC 216 that couples the FPC 216 with the chassis 220 behind the locator pins 222a, 222b. The insulating tape may be clear or white tape, rather than yellow to provide enhanced reflectivity, for example. In some embodiments, use of the tape may be avoided if reflectivity strips are used. In some embodiments, insulating tape 218b may also be disposed between the FPC 216 and the chassis 220 in the area where the LED strips have been joined with solder. However, the use of insulating tape below the LEDs 216a may be avoided.

In some embodiments, the radial width of the locator pin slots 212a may be as large as possible to allow assembly tolerance and prevent the LGP 212 from contacting the locator pins 222a, 222b upon an increase in temperature due to operation of the light engine 200 and/or external environmental changes. Similarly, in some embodiments, the transverse width of the locator pin slots 212a may be relatively tight to avoid movement in the transverse direction. The upper and lower locator pins 222a may control the x position of the LGP 212, the right and left locator pins 222b may control the y position of the LGP 212, and each of the locator pins 222a, 222b may control rotation of the LGP 212. The pin slots 212a may have a radial width of about 2.5 mm, the diameter of each of the locator pins 222a, 222b may be about 1.588 mm, the width of the pin slots 212a may be about 1.66 mm, and the distance between the end of the pin slots 212a and the end of the straight portion of the pin slots 212a may be about 1.67 mm. This permits the locator pins 222a, 222b to limit thermal displacement (expansion) of the LGP 212 towards the LEDs 216a while minimizing the distance between the LGP 212 and the LEDs 216a. The distance between the LGP 212 and the LEDs 216a may be minimized to 1.5 mm under the worst case ambient heat conditions of about 40° C. due to the different materials used (in some embodiments, the LGP 212 being formed from PMMA while the chassis 220 being formed from aluminum having a CTE 3 times that of PMMA).

FIG. 2F shows another exploded view of cross-sectional view of a portion of a light engine, in accordance with some embodiments, in accordance with some embodiments. In particular, FIG. 2F shows compression forces 1 and chassis-supporting forces 2. As shown, compression forces 1 provided by the grooves 204a in the backplate 204 and chassis-supporting forces 2 provided by a protrusion 220d in the chassis 220 are not aligned or balanced. The grooves 204a assert downward pressure proximate to a circumference of the reflector 210. This may result in torque around an edge of the LGP 212 that tends to deform the LGP 212 downwards at the center but will also induce deformations into the thin reflector. Assuming the chassis 220 is flat and rigid, a fixed boundary condition is thus present at the contact surface area between the chassis 220 and the LGP 212 (surface area 2, where the chassis-supporting forces 2 are located). The chassis 220 may thus eliminated from consideration. The backing plate 204 is in contact with the reflector at the surface area 1 only (where the compression forces 1 are located). The compression force per screw is tuned as to provide the expected deformation of the backing plate 204 after screwing is completed. This deformation corresponds to the amount of interference present by design between the backing plate 204 and reflector/LGP 212 (about 1.53 mm). The result is about 123 N (approximately 27.6 lbf) with a maximum torque of about 7.3 N-m (approximately 65 in-lb) per screw. The nominal torque is about 13.6 N-m (approximately 120 in-lb) for the hole threading.

To simplify and limit computational time in modeling this design, it is also assumed that there is no gasket 226. The gasket 226, if desired, may be included in a second round of modeling. Contacts between components are set to be bonded, which may not be completely valid, but these contacts are minimized; "non-penetration" contacts which should be the more appropriate interface conditions do not converge. Further, when the backplate is not present, the LGP 212 sits higher than the bottom edge of the LEDs 216a so at least a portion of the LEDs 216a is visible. This, however, is expected with the gasket 226 on and no back-plate pressing down on the LGP 212. Accordingly, the force used to press down the gasket 226 may be relatively high.

FIG. 2G shows another cross-sectional, three-dimensional view of a portion of a light engine, in accordance with some embodiments. FIG. 2G shows one of the locator pins 222a, 222b, which may have a 1.6 mm diameter. The LGP 212 may have a notch disposed therein for placement of the locator pins 222a, 222b. The chassis 220 may further contain a ridge 220e separating an outer cavity 220f of the chassis 220 from an inner cavity 220g of the chassis 220. One or more outer AVX connectors 224a are disposed in the outer cavity 220f (which may also contain other electronics). Similarly, a spacer 224b may be disposed in the inner cavity 220g, which contains the LGP 212 and FPC 216 among others. The distance between the wall facing the locator pins 222a, 222b and a portion of the locator pins 222a, 222b most distal from the wall may be about 3.96 mm. The distance from the corner of the portion of the chassis 220 that retains the locator pins 222a, 222b. The length of the LEDs 216a in the direction from the bottom of the cavity adjacent to the LGP 212 to the top of the cavity may be about 5.18 mm. The distance between the bottom of the LEDs 216a and the bottom of the inner cavity 220g adjacent to the spacer 220b may be about 2 mm.

As indicated above, the backplate 204 may have a center disc and an outer ring circumscribing the center disc. The center disc and outer ring may be connected by an intermediate portion that extends at up to a right angle (e.g., about 30 degrees, about 45 degrees, about 60 degrees or about 90 degrees) from both the center disc and outer ring, although the angles of extension may be the same or may be different. The center disc may contact the reflector 210 and may avoid the use of the gap fillers 208.

In other embodiments, as shown in the planar view of FIG. 2I, gap fillers 208 may separate the reflector 210 from the backplate 204. As shown, the gap fillers 208 may be attached to the backplate 204 via, for example, double-faced sticky pressure-sensitive adhesive (PSA) tape. In other embodiments, the gap fillers 208 may be attached to the reflector 210 instead of, or in addition to, the backplate 204. The gap fillers 208 may be formed from foam such as EPDM/neoprene/styrene-butadiene rubber (SBR) or another material with UL recognition and a MOT greater than about 90 C.°. The gap fillers 208 may, as above, have any desired shape. In FIG. 2I, the gap fillers 208 are formed from different shapes—a circular disc disposed in the center of the reflector 210 and semicircular discs closer to the edge of the reflector 210. The semicircular discs are symmetrically disposed around the reflector 210, with each flat portion facing the circular disc. Thus, as shown, the centers of the semicircular discs are disposed at about 90° with respect to each other and each center being the same distance from the center of the circular disc such that pairs of semicircular discs are disposed symmetrically across from each other. The gap filler 108 can have a thickness and durability selected to reduce or eliminate a gap between the reflector 110 and the LGP 112. Due to the above compression, for example, the thickness of the different gap fillers may be different; for example, the thickness for the four semicircular pads may be about 4.8 mm (approximately 3/16 inch) while that of the center pad may be about 6.4 mm (approximately ¼ inch). Reducing or eliminating the gap can reduce or eliminate shadowing caused by the gap fillers 208.

FIG. 2J shows a sectioned view of a portion of the light engine, in accordance with some embodiments. As above, the chassis 220 may have an inner cavity 220a in which the optical components are disposed and an outer cavity 220b in which wiring is disposed. The chassis 220, including the inner and outer cavities 220a, 220b, may be covered by the backplate 204. The wiring may include sets of both positive and negative wires 232a, 232b (one for each FPC 216) that are retained within the outer chassis 220b using tape applied to raised bosses 220c disposed at regular intervals throughout the outer cavity 220b. The combination of the tape, which may be aluminum tape for example, and the bosses 220c may help to ensure that the wires 232a, 232b stay retained within the outer cavity 220b and do not become pinched between the chassis 220 and the backplate 204. The wires 232a, 232b may exit the outer cavity 220b through an exit hole 204b in the backplate 204. The wires 232a, 232b may be secured with strain relief. In some embodiments, heat-shrink tubing may be used to secure the wires 232a, 232b. The wires 232a, 232b may be, for example, about 1.1 m in length (approximately 42 inch) wires having a diameter of about 1.6 mm (approximately 0.063 inch) (AWG22, stranded, 300V, 105° C., UL recognized).

FIG. 2L shows another cross-sectional view of a portion of a light engine, in accordance with some embodiments. FIG. 2L shows many of the features already indicated above. In addition, as shown, in some embodiments, the reflector 210 may mechanically interlock with an L-shaped spacer 224b that is disposed on the FPC 216 on the ridge 220e separating the outer cavity 220f and the inner cavity 220g of the chassis 220. The reflector 210 may be attached to the FPC 216 via solder or one or more mechanical fasteners, such as a screw.

FIG. 2M shows a perspective view of a portion of a light engine, in accordance with some embodiments. As can be seen, the FPCs 216 may each have LEDs 216a electrically attached thereto. The FPCs 216 may each have an extension that extends over the ridge 220e in the chassis 220. The FPCs 216 are separated by a gap 230 and aligned such that one of the locator pins 222 opposes the gap 230. The alignment helps to prevent light occlusion of the LEDs 216a by the locator pins 222.

Figure 3A:
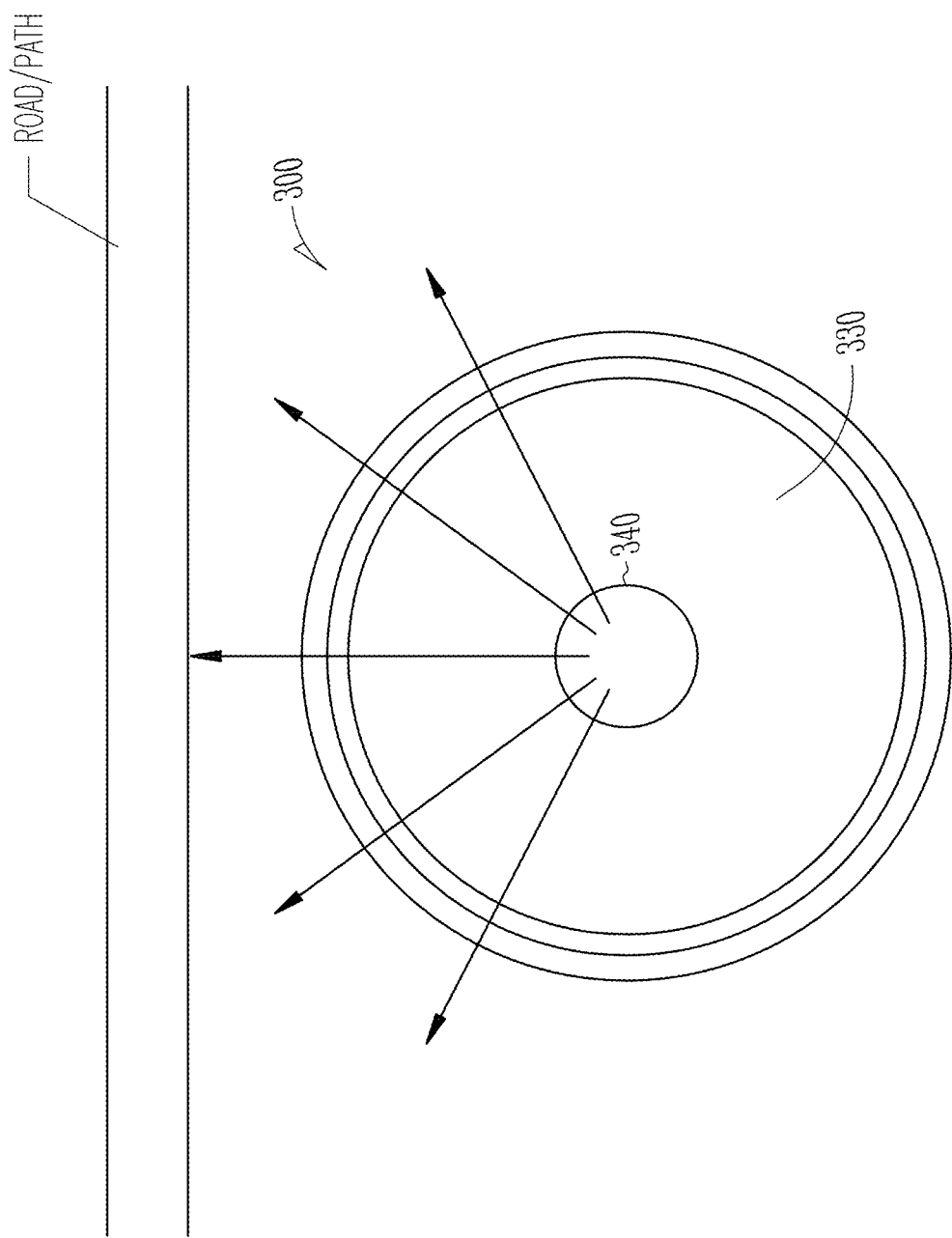
FIG. 3A shows a bottom view of a light engine with asymmetric light distribution, in accordance with some embodiments.
Figure 3B:
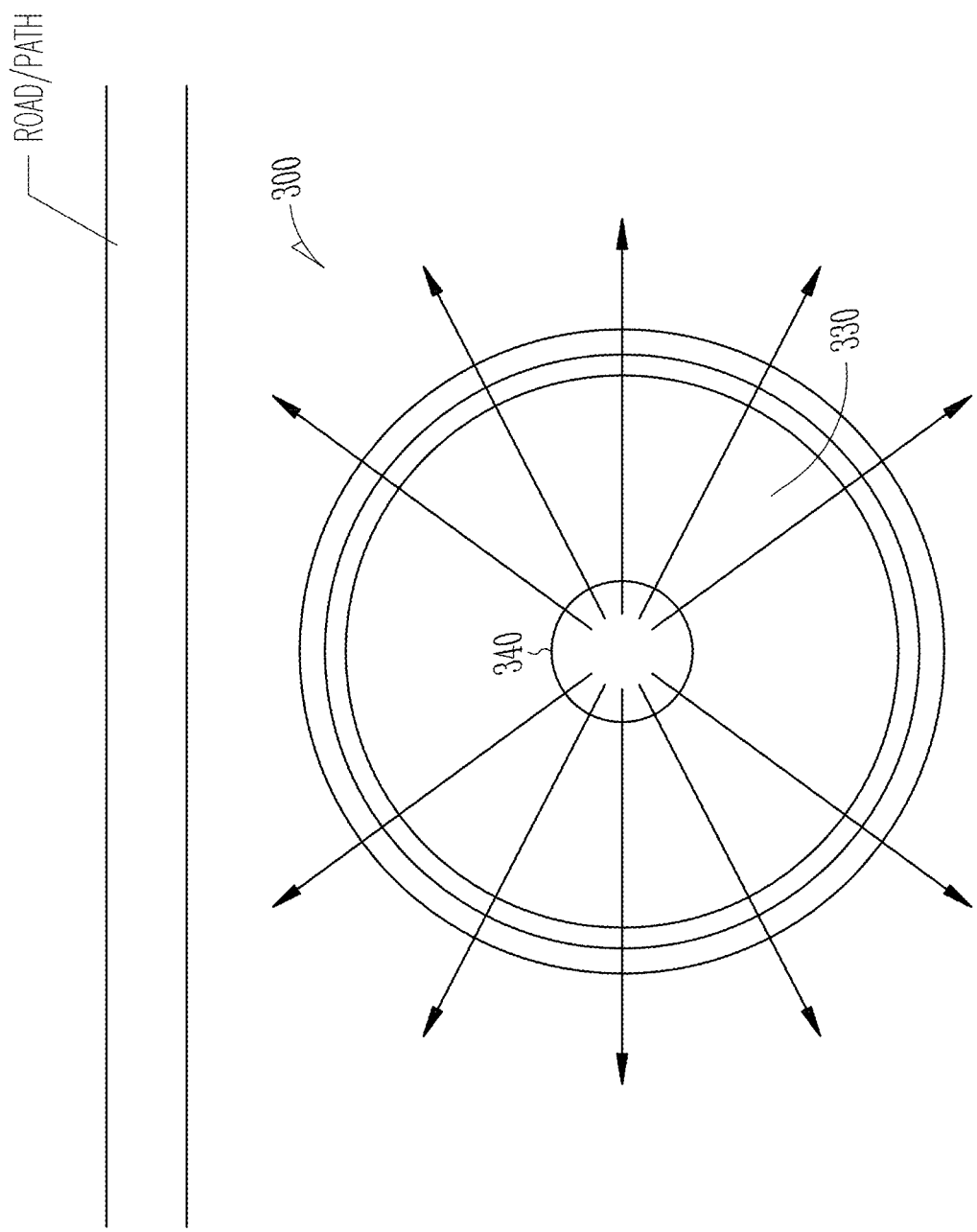
FIG. 3B shows a bottom view of a light engine with symmetric light distribution, in accordance with some embodiments.

FIG. 3A shows a bottom view of a light engine with asymmetric light distribution, in accordance with some embodiments; FIG. 3B shows a bottom view of a light engine with symmetric light distribution, in accordance with some embodiments; FIG. 3C shows another bottom view of a light engine, in accordance with some embodiments. The light engine 300 of FIGS. 3A, 3B, and 3C may be similar to that shown in FIG. 1 or FIGS. 2A, and 2B. In some embodiments, the diameter of the cavity within the chassis (inner) shown may be, for example, about 458.7 mm, while the (outer) diameter of the chassis may be about 565.5 mm and the thickness of the chassis, from the bottom to the top of the chassis, may be about 30.78 mm.

The light engine 300 may be disposed on a pedestal or post 340 for indoor or outdoor lighting applications. A reference notch may be used to permit the light engine 300 to be positioned correctly on the post 340 and/or components of the light engine 300 to be assembled. The reference notch may be, for example, triangular in shape, although, upon reading and understanding the disclosed subject matter, a person of ordinary skill in the art will recognize that many other shapes may be used as well. The bottom view of the light engine 300 shows an element 330 may be present between the LEDs 216a and the external environment. The element 330 may be an optical element such as a lens, a window or detector, such as a motion detector, and/or an opaque plate. A light diffuser may be formed from any material that diffuses or scatters light, e.g., a translucent material such as ground or greyed glass, or may use a diffraction element to scatter the light.

In some embodiments, the light from the light engine 300 may be distributed asymmetrically. For example, as shown in FIG. 3A, the light from the light engine 300 may be distributed over a substantially semi-circular range (or, for example, about 120° to about 180° range). The asymmetric distribution may be accomplished using one or more of a number of different techniques, including limiting the LED distribution in the light engine 300 to provide the desired radiation pattern, using a reflector within the light engine 300 to direct light from the LEDs to the desired radiation pattern, and/or providing an optical element to direct the light from the LEDs to the desired radiation pattern, among others. Such a light engine 300 may be used, for example, to provide lighting indoor or outdoor environment in which a greater amount of illumination in a particular directional range is desirable. For example, the light engine 300 may illuminate only a limited direction such that the road/path is illuminated as shown in FIG. 3A.

In other embodiments, such as that shown in FIG. 3B, the light from the light engine 300 may be distributed symmetrically around the light engine 300. Such a light engine 300 may be used, for example, to provide lighting for a pathway or other indoor or outdoor environment in which illumination in all directions is desirable.

FIG. 3C shows another bottom view of a light engine. In this view, the bottom element has been removed and various physical retention and guiding elements provided. In particular, as shown, multiple pinhole locations 332a, 332b, 332c, 332d may be present, at least some of which may also be associated with connectors to couple the chassis and the backplate together, as shown in FIG. 2B, and/or electrical connectors to the different strips 316a, 316b. FIG. 3C also shows the cable stress reliever 306, which may be a snap-in element that provides stress relief for wires used to hang or otherwise retain the light engine 300. The cable stress reliever 306 may be retained in the reference notch. The FPC shown in FIGS. 1 through 2L may, as shown in FIG. 3C, be split into two flexible half strips 316a, 316b that cover about 180° and that may be controlled separately (as may the LEDs thereon). In various embodiments, the strips may cover an angular range different than 180°, the strips may cover the same or different angular ranges, and any number of strips may be used.

FIG. 4A shows an example of a symmetric LED design with substantially uniform spacing, in accordance with some embodiments; FIG. 4B shows an example of an asymmetric LED design, in accordance with some embodiments; FIG. 4C shows another example of a symmetric design, in accordance with some embodiments. Similar to FIG. 3C, flexible half strips 416a, 416b of the light engine 400 may cover about 180°. Each flexible half strip 416a, 416b may contain multiple LEDs 416c. As shown, each flexible half strip 416a, 416b may contain 48 LEDs 416c having a uniform spacing therebetween. The LEDs may be contained in a package having a size of, for example, 5 mm×5 mm. As above, in various embodiments, the strips may cover an angular range different than 180°, the strips may cover the same or different angular ranges, and any number of strips may be used. In addition, the LEDs 416c on one or both of the flexible half strip 416a, 416b may have non-uniform spacing therebetween and/or the LEDs 416c on both of the flexible half strip 416a, 416b may have uniform spacing, but the pitches may be different between the flexible half strip 416a, 416b. Positive and negative wires 434a, 434b, used to separately control each of the flexible half strips 416a, 416b, may extend from the cable stress reliever 406. A positive wire and negative wire 434a, 434b may be connected to each of the flexible half strips 416a, 416b through AVX connectors 432a, 432b.

The example of FIG. 4B is similar to that of FIG. 4A, except that only a portion of each flexible half strip 416a, 416b may contain LEDs 416c. In FIG. 4B, about 40% of each flexible half strip 416a, 416b contains LEDs 416c, although in other embodiments a different percentage of each flexible half strip may contain LEDs (which may be the same or may be different for each flexible half strip). In FIG. 4B, the distribution of the LEDs 416c are symmetric with regard to each other but asymmetric along the length of each flexible half strip 416a, 416b. In some embodiments, the same number of LEDs on each flexible half strip 416a, 416b shown in FIG. 4A may be contained in each flexible half strip 416a, 416b of FIG. 4B (thus having a smaller uniform spacing), while in other embodiments the same uniform spacing shown in FIG. 4A may be used in FIG. 4B (thus having fewer LEDs). As above, the LEDs 416c on one or both of the flexible half strip 416a, 416b may have non-uniform spacing therebetween and/or the LEDs 416c on both of the flexible half strip 416a, 416b may have uniform spacing, but the pitches may be different between the flexible half strip 416a, 416b.

In FIG. 4C, similar in some ways to FIG. 4B, only a portion of each flexible half strip 416a, 416b may contain LEDs 416c. However, unlike FIG. 4B, in FIG. 4C, the distribution of the LEDs 416c are symmetric with regard to each flexible half strip 416a, 416b as well as each other. In FIG. 4C, about 40% of each flexible half strip 416a, 416b contains LEDs 416c, although in other embodiments a different percentage of each flexible half strip may contain LEDs (which may be the same or may be different for each flexible half strip). In some embodiments, the same number of LEDs on each flexible half strip 416a, 416b shown in FIG. 4A may be contained in each flexible half strip 416a, 416b of FIG. 4C (thus having a smaller uniform spacing), while in other embodiments the same uniform spacing shown in FIG. 4A may be used in FIG. 4C (thus having fewer LEDs). As above, the LEDs 416c on one or both of the flexible half strip 416a, 416b may have non-uniform spacing therebetween and/or the LEDs 416c on both of the flexible half strip 416a, 416b may have uniform spacing, but the pitches may be different between the flexible half strip 416a, 416b.

Figure 5A:
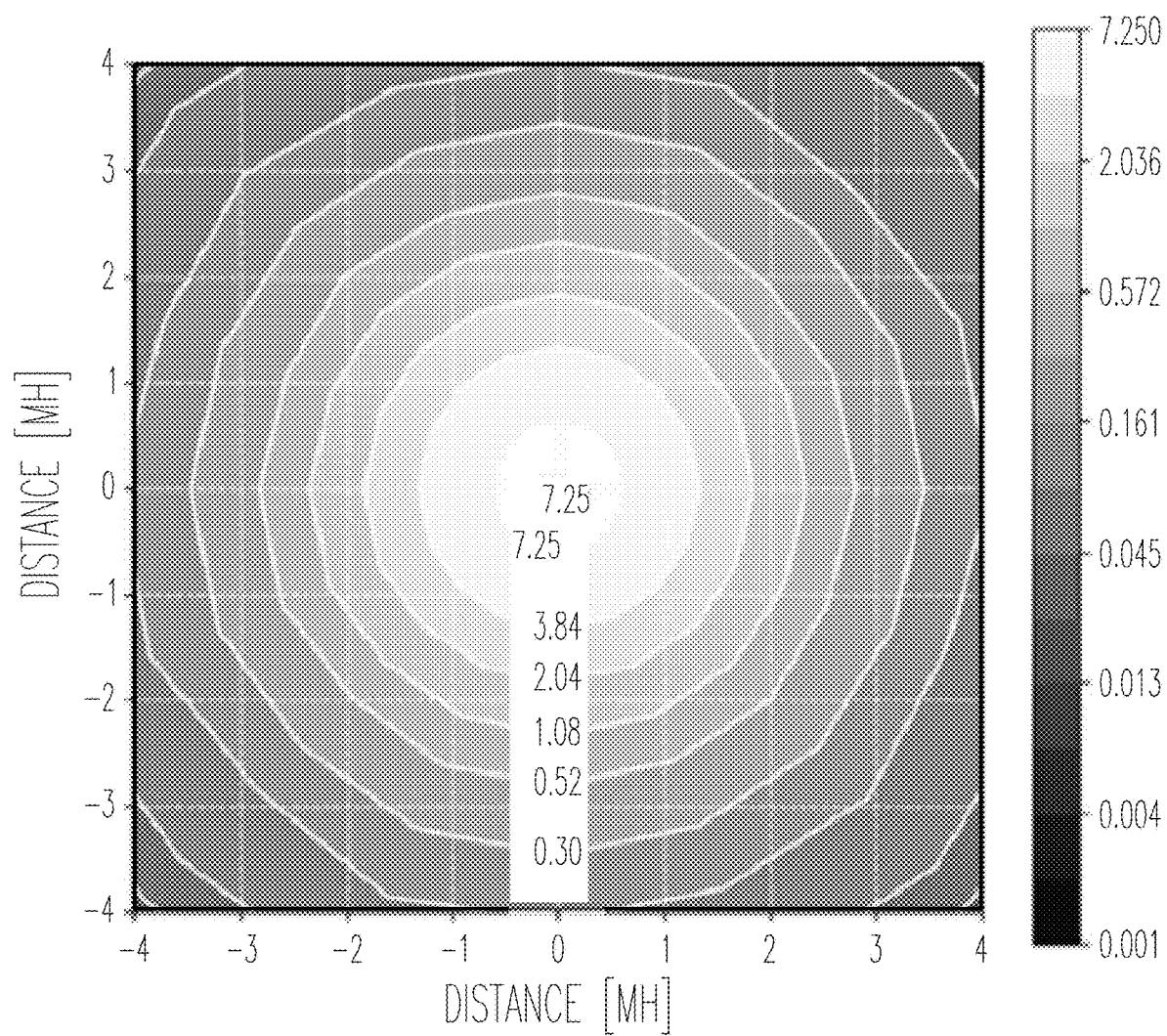
FIG. 5A shows a simulated illuminance isolines of an example of a light engine, in accordance with some embodiments.
Figure 5B:
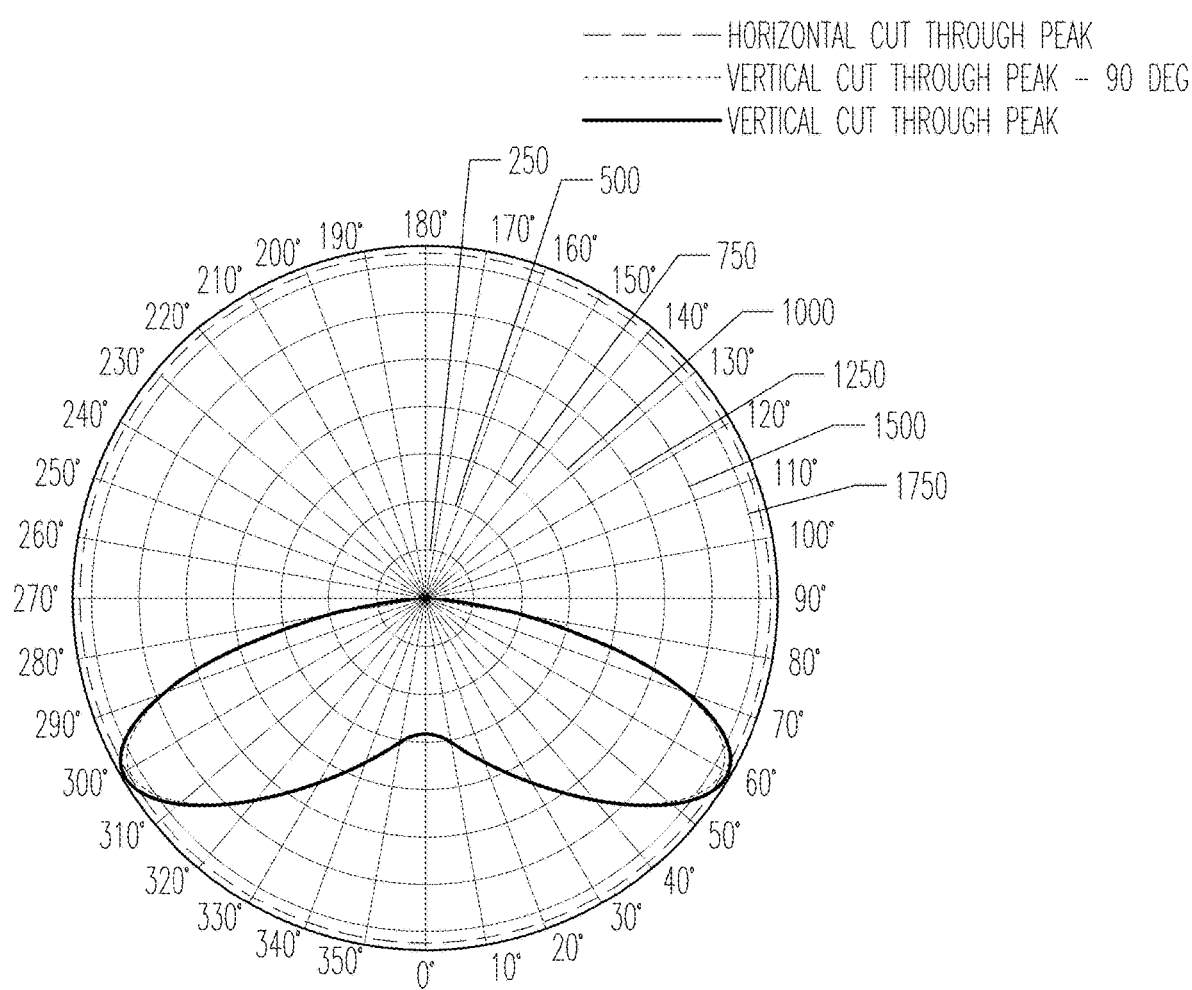
FIG. 5B shows a simulated vertical luminance of an example of a light engine, in accordance with some embodiments.
Figure 5C:
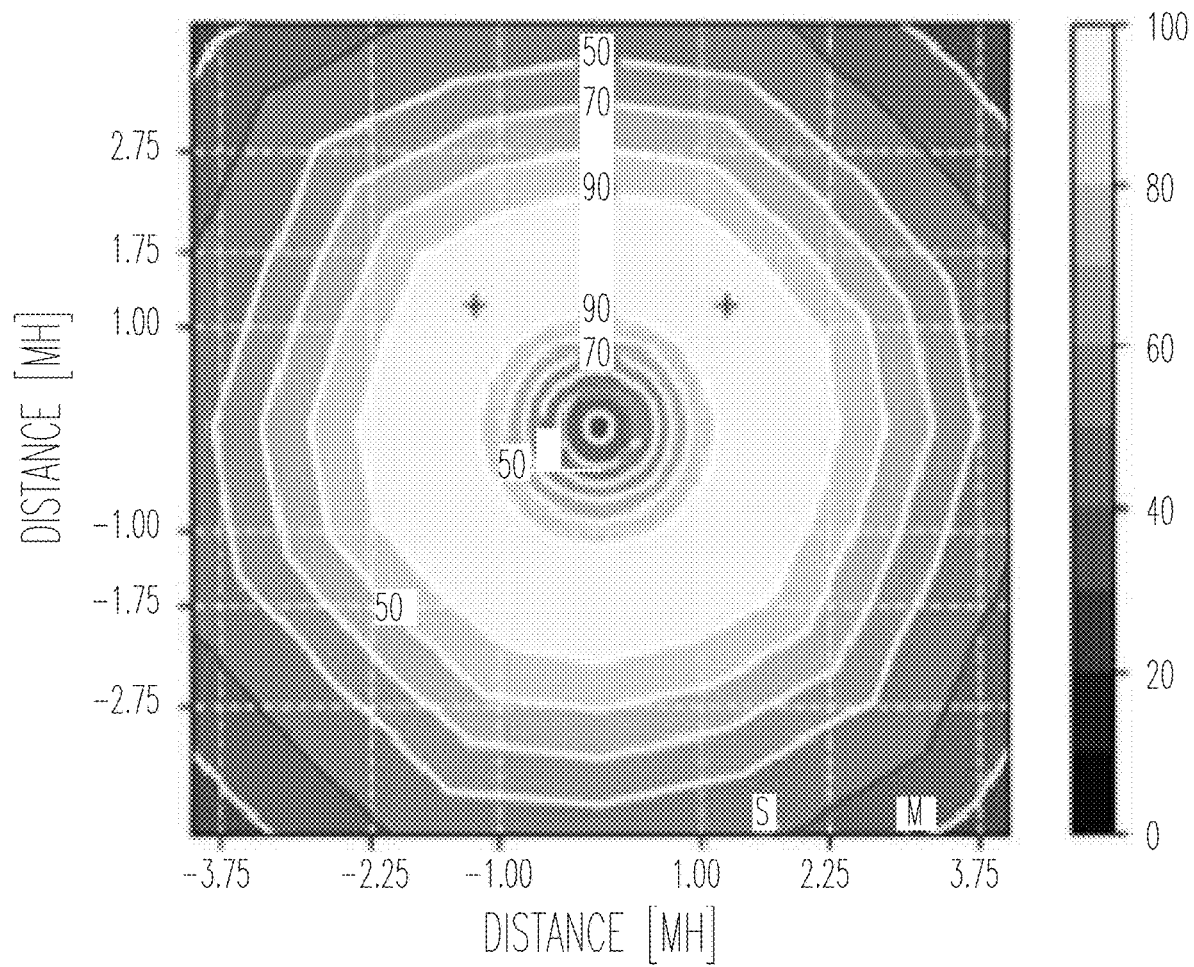
FIG. 5C shows a simulated illuminance isolines of an example of a light engine, in accordance with some embodiments.

FIGS. 5A-5C show a simulated performance of an example of a light engine, in accordance with some embodiments. As can be seen, the illuminance isolines shown in FIGS. 5A and 5C are substantially symmetrically centered such that the luminance is substantially uniformly distributed around the center of the light source. The vertical luminance shown in FIG. 5B has a batwing distribution whose peaks are centered around about 60° and about 300°.

Figure 6A:
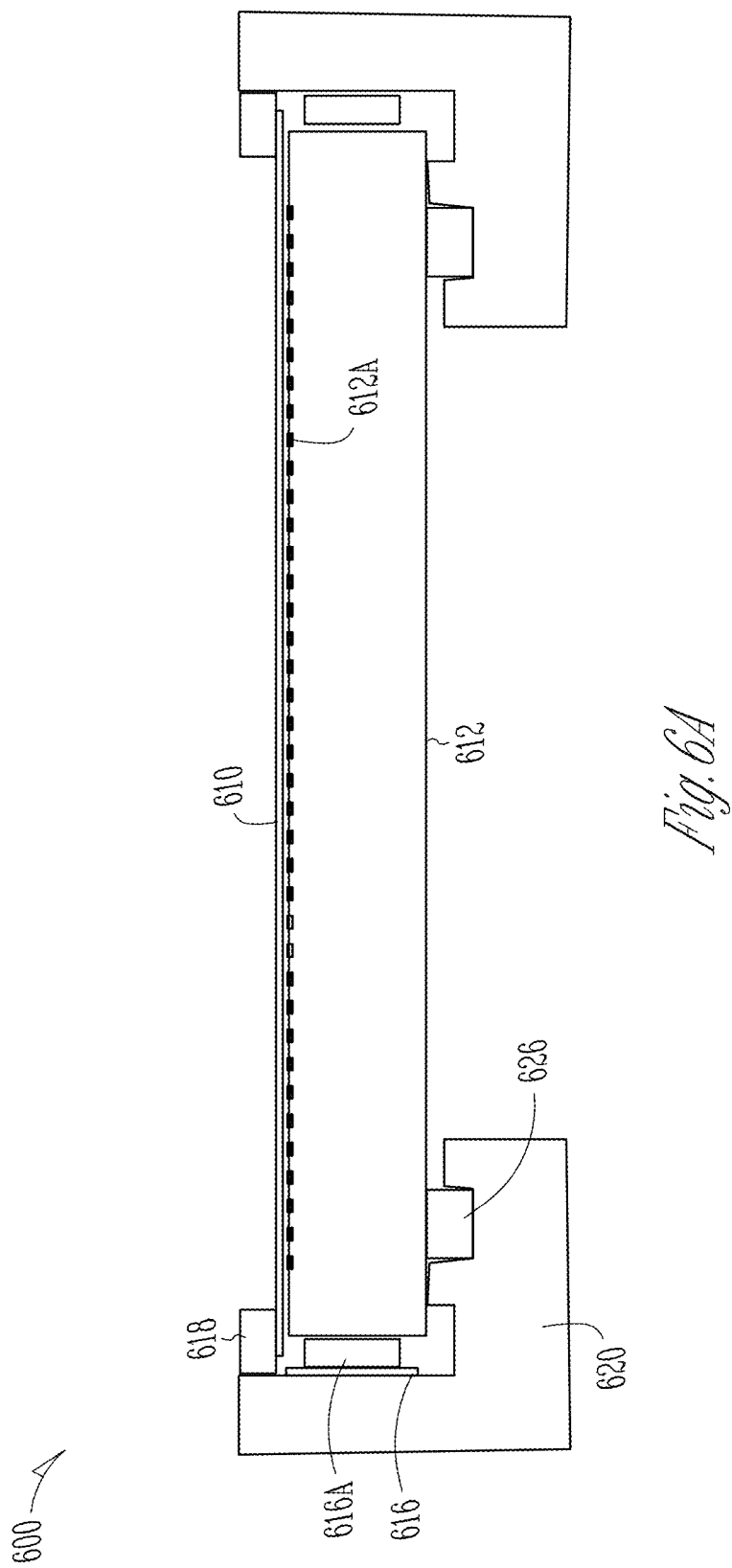
FIG. 6A shows a simplified geometric model of a light engine, in accordance with some embodiments.

FIG. 6A shows a simplified geometric model of a light engine, in accordance with some embodiments. The light engine 600, as above, may contain a frame 620 in which are situated LEDs 616a, an LGP 612 (e.g., which is about 6 mm thick in some embodiments) and a reflector 610. As above, the LEDs 616a may be disposed on the frame 620 and face inward, towards the LGP 612. The reflector 610 may be disposed on the LGP 612 and may have a diameter of about 483.5 mm. The notch formed in the LGP 612 for seating the LGP 612 via the locator pins may have a depth of about 4.97 mm, a width of about 1.8 mm and a length of about 2.54 mm. A dispersive pattern 612a, such as dots, may be formed on a surface of the LGP 612 opposite the reflector 610. In some embodiments, the dispersive pattern 612a may be disposed uniformly over only the surface of the LGP 612 opposite the reflector 610. The dispersive pattern 612a may extend radially from the center of the LGP 612 to terminate before reaching the edge of the LGP 612. For example, if the diameter of the LGP 612 is about 482 mm, the diameter of the dispersive pattern 612 may be about 466 mm. The thick LGP 612 and a reflector 610 may be retained in the inner cavity in the frame 620, disposed between the frame 620 and a ring 618. A gasket 626 is retained within a recess in the frame 620 under the LGP 612 to avoid ingress of liquid or other contaminants into the outer cavity where the LED 616a and other electronics are present. The reflector 610, frame 620 and ring 618 may all be formed from a metal, such as aluminum.

FIG. 6B shows another simplified geometric model of a light engine, in accordance with some embodiments. FIG. 6B shows additional components, compared with FIG. 6A. The light engine 600, as above, may contain a chassis 620 in which are situated LEDs 616a, an LGP 612 and a reflector 610. As above, the LEDs 616a may be disposed on the frame 620 and face inward, towards the LGP 612. The reflector 610 may be disposed on the LGP 612. A dispersive pattern 612a, such as dots, may be formed on a surface of the LGP 612 opposite the reflector 610. The LGP 612 and the reflector 610 may be retained in the inner cavity in the frame 620, disposed between the frame 620 and a ring 618. A gasket 626 is retained within a recess in the frame 620 under the LGP 612 to avoid ingress of liquid or other contaminants into the cavity in which the LED 616a and other electronics are present. A backplate 604 is attached to the chassis 620 via connectors, with foam spacers 608 disposed between the backplate 604 and the reflector 610 to provide additional pressure on the reflector 610 over the entire surface of the reflector 610. The reflector 610 may be retained in the chassis 620 using, for example, electrical tape 628 disposed on both sides of the edges of the reflector 610. The electrical tape 628 may be retained between and contact both the backplate 604 and the chassis 620.

FIG. 6C shows another simplified geometric model of a light engine, in accordance with some embodiments. FIG. 6C is slightly different from FIG. 6B. Similar to the above, the light engine 600 contains a chassis 620 in which are situated LEDs 616a, an LGP 612 and a reflector 610. As above, the LEDs 616a may be disposed on the frame 620 and face inward, towards the LGP 612. The reflector 610 may be disposed on the LGP 612. A dispersive pattern 612a, such as dots, may be formed on a surface of the LGP 612 opposite the reflector 610. The LGP 612 and the reflector 610 may be retained in the inner cavity in the frame 620, disposed between the frame 620 and a ring 618. A gasket 626 is retained within a recess in the frame 620 under the LGP 612 to avoid ingress of liquid or other contaminants into the cavity in which the LED 616a and other electronics are present. A backplate 604 is attached to the chassis 620 via connectors, with foam spacers 608 disposed between the backplate 604 and the reflector 610 to provide additional pressure on the reflector 610 over the entire surface of the reflector 610. Unlike FIGS. 6A and 6B, however, the backplate 604 does not directly contact the reflector 610. Instead, in FIG. 6C, the reflector diameter is reduced to meet the minimum UL clearance distance of 1.6 mm (having a diameter of about 480 mm rather than 483.5 mm) and a white reflective sheet 630 is disposed over the entire surface of the reflector 610. The reflective sheet 630 may be formed, in one embodiment, from plastic (e.g., polyethylene terephthalate (PET)) and is in direct contact with the backplate 604. The reflective sheet 630 may be taped to the reflector 610 using double-faced sticky tape having a UL maximum temperature of 85° C. or higher. This avoids the use of the tape at the edges of the reflector 610 and improves the flatness of the reflector 610.

Figure 6D:
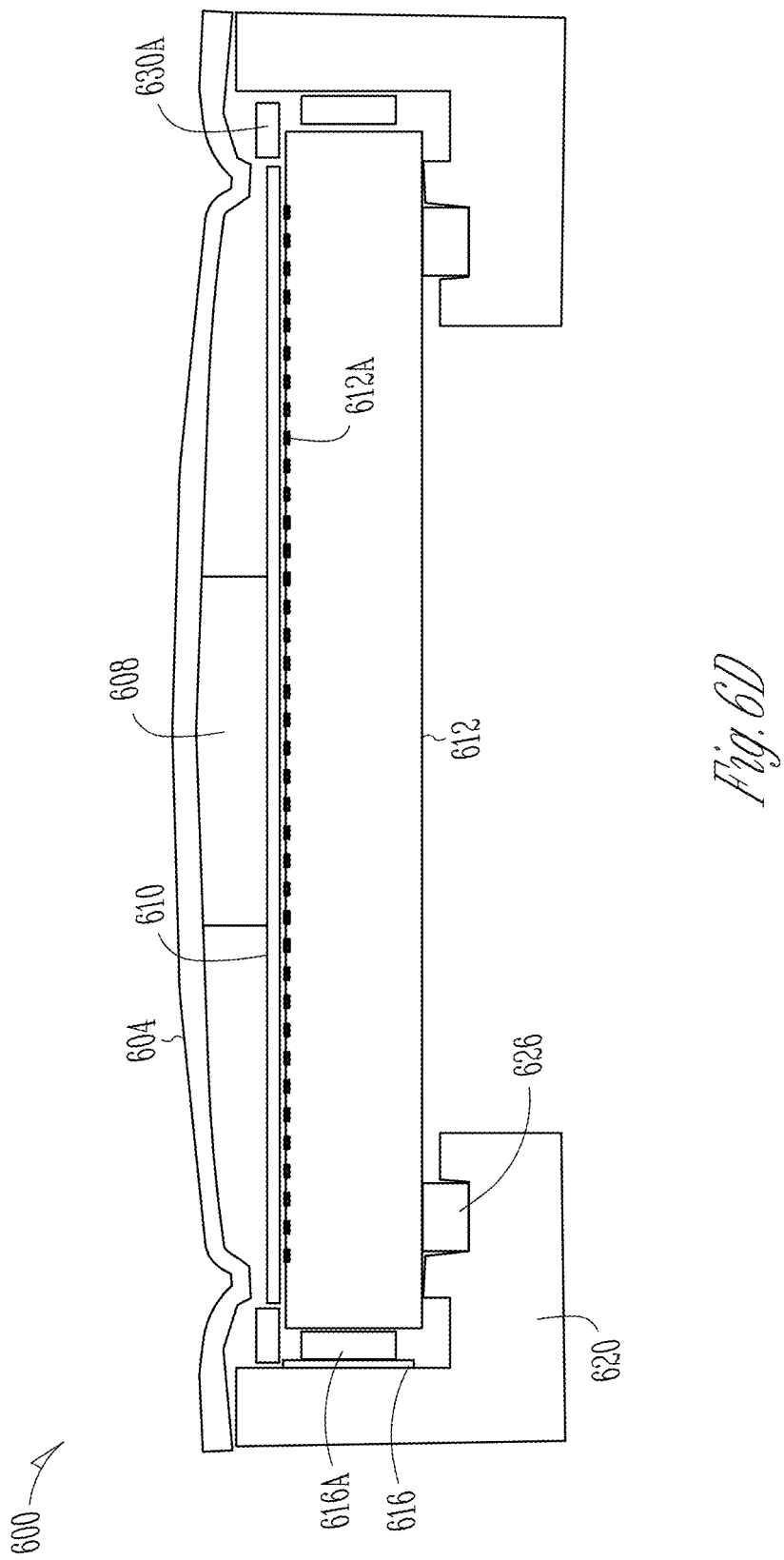
FIG. 6D shows another simplified geometric model of a light engine, in accordance with some embodiments.

FIG. 6D shows another simplified geometric model of a light engine, in accordance with some embodiments. FIG. 6D is slightly different from FIG. 6C. Similar to the above, the light engine 600 contains a chassis 620 in which are situated LEDs 616*a*, an LGP 612 and a reflector 610. As above, the LEDs 616*a* may be disposed on the frame 620 and face inward, towards the LGP 612. The reflector 610 may be disposed on the LGP 612. A dispersive pattern 612*a*, such as dots, may be formed on a surface of the LGP 612 opposite the reflector 610. The LGP 612 and the reflector 610 may be retained in the inner cavity in the frame 620, disposed between the frame 620 and a ring 618. A gasket 626 is retained within a recess in the frame 620 under the LGP 612 to avoid ingress of liquid or other contaminants into the cavity in which the LED 616*a* and other electronics are present. A backplate 604 is attached to the chassis 620 via connectors, with foam spacers 608 disposed between the backplate 604 and the reflector 610 to provide additional pressure on the reflector 610 over the entire surface of the reflector 610. Unlike FIG. 6C, however, while the reflector diameter is again reduced to meet the minimum UL clearance distance of 1.6 mm, a reflective sheet 630 is not present over the entire surface of the reflector 610. Instead, in FIG. 6D, a reflective material 630*a* is disposed over the edge of the LGP 612 and adjacent to the edge of the reflector 610. The reflective material 630*a* is formed, in one embodiment, from plastic (PET). In some embodiments, the reflective material 630*a* may be formed in a ring around the entire circumference of the reflector 610. In other embodiments, rather than a ring, the reflective material 630*a* may be formed in quadrants or spacers that are connected together (e.g., by tape) but that again avoid the use of tape at the edge of the reflector 610.

FIG. 6E shows an enlarged portion of a simplified geometric model of a light engine, in accordance with some embodiments. FIG. 6E is similar to FIG. 6D. Similar to the above, the light engine 600 contains a chassis 620 in which are situated LEDs 616*a*, an LGP 612 and a reflector 610. The LEDs 616*a* may be disposed on the frame 620 and face inward, towards the LGP 612. The reflector 610 may be disposed on the LGP 612. A dispersive pattern 612*a* may be formed on a surface of the LGP 612 opposite the reflector 610. The LGP 612 and the reflector 610 may be retained in the inner cavity in the frame 620, disposed between the frame 620 and reflective material 630*b*. A gasket 626 is retained within a recess in the frame 620 under the LGP 612 to avoid ingress of liquid or other contaminants into the cavity in which the LED 616*a* and other electronics are present. A backplate 604 is attached to the chassis 620 via connectors. As with FIG. 6D, the reflector diameter is again reduced to meet the minimum UL clearance distance of 1.6 mm, with the reflective material 630*b* being tape that is disposed over the edge of the LGP 612 and adjacent to the edge of the reflector 610. The reflective material 630*b* may be, for example, white. The reflective material 630*b* may be further attached to a top of the reflector 610. In some embodiments, the reflective material 630*b* may be formed in a ring around the entire circumference of the reflector 610. In other embodiments, rather than a ring, the reflective material 630*b* may be formed in quadrants or spacers. The reflective material 630*b* may be attached to the reflector 610 after compression of the reflector 610 to remove or reduce the air layer between the reflector 610 and the LGP 612 to remove or reduce the air layer therebetween and thus prevent the re-entry of air to prevent the formation of gaps.

FIG. 6F shows another enlarged portion of a simplified geometric model of a light engine, in accordance with some embodiments. FIG. 6E is similar to FIG. 6E. Similar to the above, the light engine 600 contains a chassis 620 in which are situated LEDs 616*a*, an LGP 612 and a reflector 610. The LEDs 616*a* may be disposed on the frame 620 and face inward, towards the LGP 612. The reflector 610 may be disposed on the LGP 612. A dispersive pattern 612*a* may be formed on a surface of the LGP 612 opposite the reflector 610. The LGP 612 and the reflector 610 may be retained in the inner cavity in the frame 620, disposed between the frame 620 and reflective material 630*b*. A gasket 626 is retained within a recess in the frame 620 under the LGP 612 to avoid ingress of liquid or other contaminants into the cavity in which the LED 616*a* and other electronics are present. A backplate 604 is attached to the chassis 620 via connectors. As with FIG. 6E, the reflector diameter is again reduced to meet the minimum UL clearance distance of 1.6 mm, with the reflective material 630*b* being tape that is disposed over the edge of the LGP 612 and adjacent to the edge of the reflector 610. The reflective material 630*b* may be further attached to a top of the reflector 610. In some embodiments, the reflective material 630*b* may be formed in a ring around the entire circumference of the reflector 610. In other embodiments, rather than a ring, the reflective material 630*b* may be formed in quadrants or spacers to again avoid the use of tape at the edge of the reflector 610. The reflective material 630*b* may be attached to the reflector 610 after compression of the reflector 610 to remove or reduce the air layer between the reflector 610 and the LGP 612 to remove or reduce the air layer therebetween and thus prevent the re-entry of air to prevent the formation of gaps. In addition, a high reflectivity side layer or ring 630*a* is disposed adjacent to the edge of the reflector 610. In some embodiments, the side layer or ring 630*a* may be formed in a ring around the entire circumference of the reflector 610. In other embodiments, rather than a ring, the side layer 630*a* may be formed in quadrants or spacers. The side layer 630*a* prevents light from escaping and getting absorbed by the backplate 604.

FIG. 6G shows another enlarged portion of a simplified geometric model of a light engine, in accordance with some embodiments. Similar to the above, the light engine 600 contains a chassis 620 in which are situated LEDs 616*a*, an LGP 612 and a reflector 610. The LEDs 616*a* may be disposed on the frame 620 and face inward, towards the LGP 612. The reflector 610 may be disposed on the LGP 612. A dispersive pattern 612*a* may be formed on a surface of the LGP 612 opposite the reflector 610. The LGP 612 and the reflector 610 may be retained in the inner cavity in the frame 620. A gasket 626 is retained within a recess in the frame 620 under the LGP 612 to avoid ingress of liquid or other contaminants into the cavity in which the LED 616*a* and other electronics are present. A backplate 604 is attached to the chassis 620 via connectors. The reflector diameter is again reduced to meet the minimum UL clearance distance of 1.6 mm with a transparent double-sided sticky adhesive 634 applied over the LGP 612 to attach the reflector 610 and the LGP 612 together. The double-sided sticky adhesive 634 may extend over the entire LGP 612 but stick only to the top of the dispersive pattern 612*a* to maintain a sufficient refractive index step.

Figure 6H:
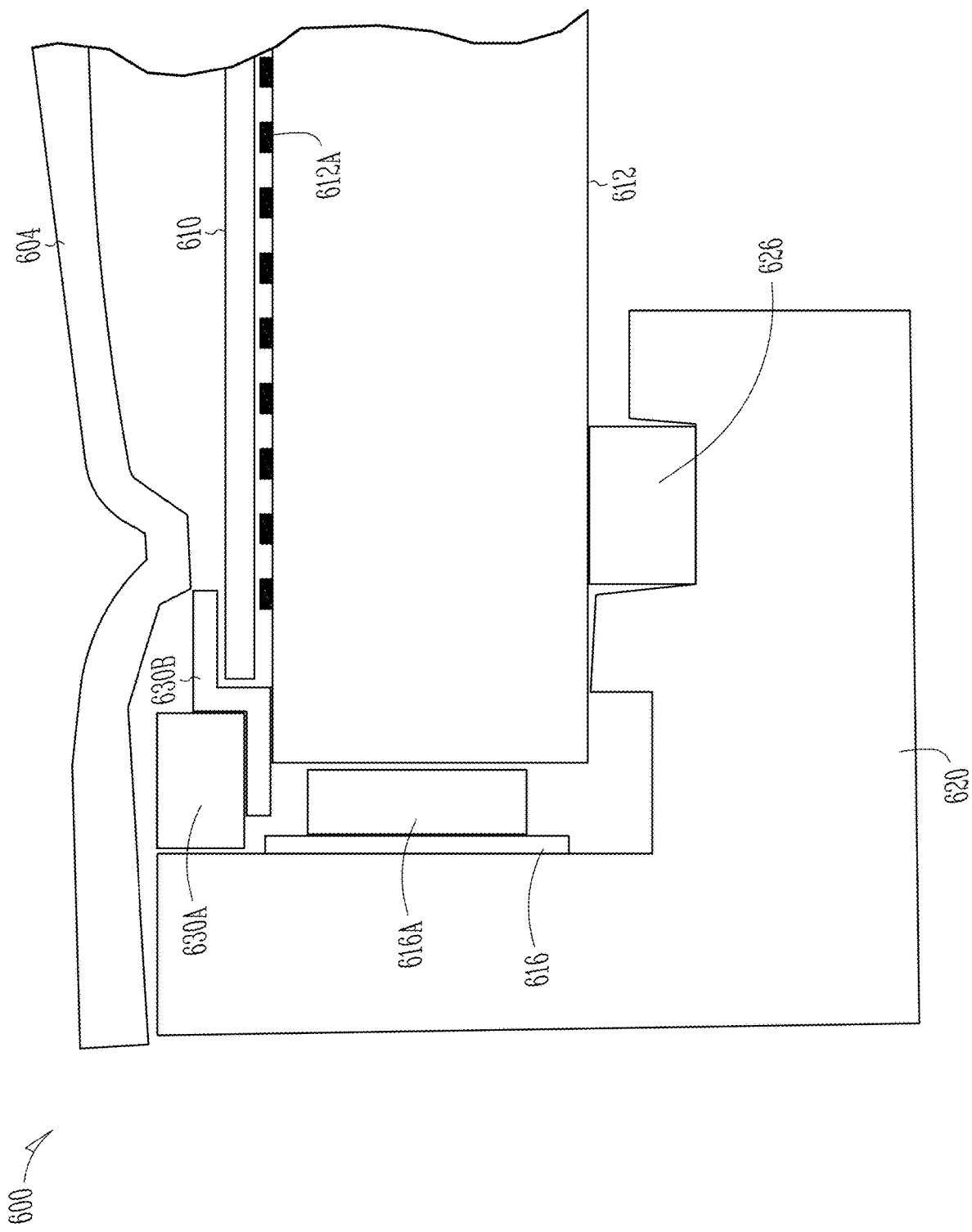
FIG. 6H shows an enlarged simplified geometric model of a portion of a light engine, in accordance with some embodiments.
Figure 6H:
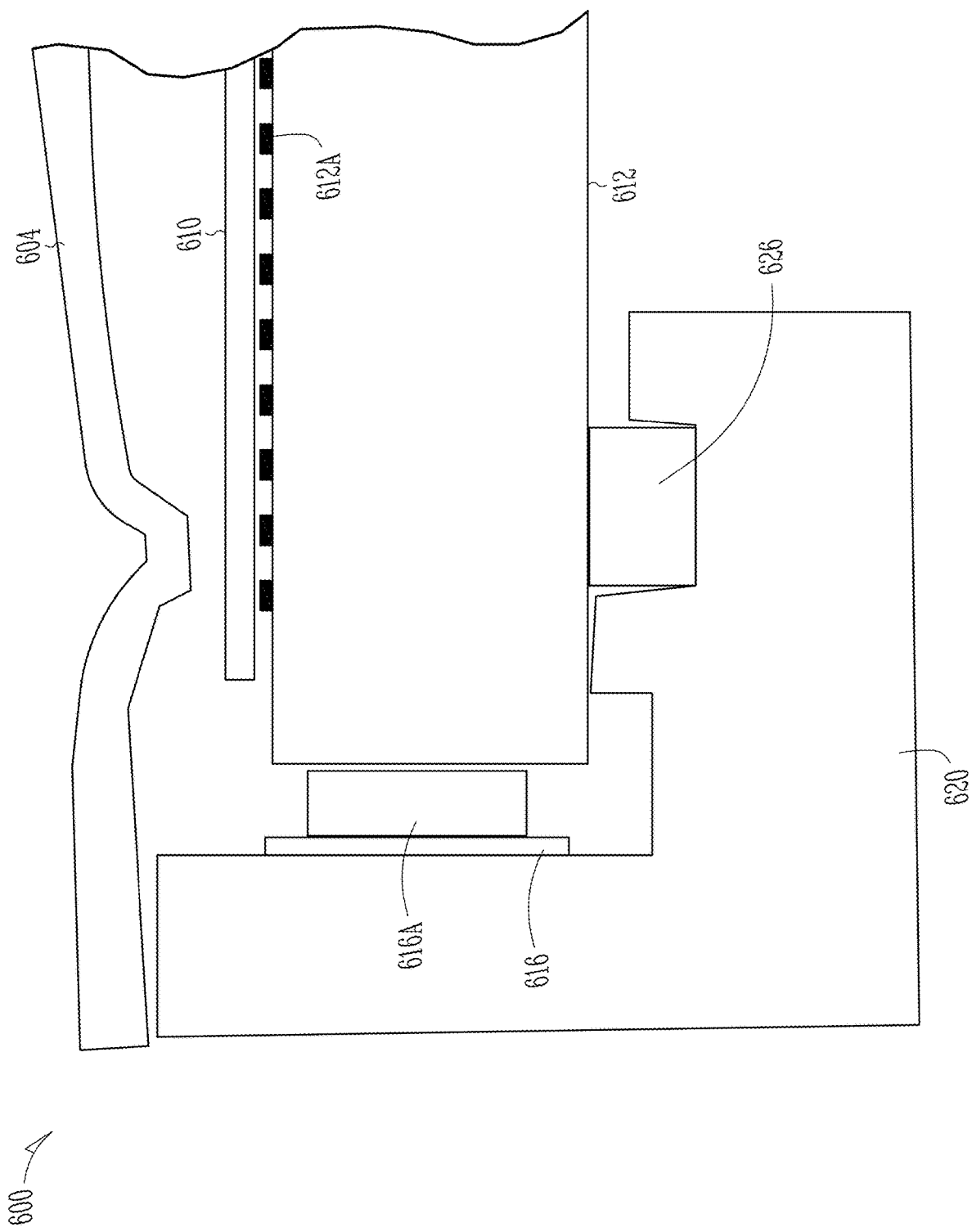

FIG. 6H shows another enlarged portion of a simplified geometric model of a light engine, in accordance with some embodiments. Similar to the above, the light engine 600 contains a chassis 620 in which are situated LEDs 616*a*, an LGP 612 and a reflector 610. The LEDs 616*a* may be disposed on the frame 620 and face inward, towards the LGP 612. The reflector 610 may be disposed on the LGP 612. A dispersive pattern 612*a* may be formed on a surface of the LGP 612 opposite the reflector 610. The LGP 612 and the reflector 610 may be retained in the inner cavity in the frame 620. A gasket 626 is retained within a recess in the frame 620 under the LGP 612 to avoid ingress of liquid or other contaminants into the cavity in which the LED 616*a* and other electronics are present. A backplate 604 is attached to the chassis 620 via connectors. The reflector diameter is again reduced to meet the minimum UL clearance distance of 1.6 mm with the dispersive pattern 612*a* itself having adhesive to attach the reflector 610 and the LGP 612 together.

FIG. 6I shows another enlarged simplified geometric model of a light engine, in accordance with some embodiments. Similar to the above, the light engine 600 contains a chassis 620 in which are situated LEDs 616*a*, an LGP 612 and a reflector 610. The LEDs 616*a* may be disposed on the frame 620 and face inward, towards the LGP 612. The reflector 610 may be disposed on the LGP 612. A dispersive pattern 612*a* may be formed on a surface of the LGP 612 opposite the reflector 610. The LGP 612 and the reflector 610 may be retained in the inner cavity in the frame 620. A gasket 626 is retained within a recess in the frame 620 under the LGP 612 to avoid ingress of liquid or other contaminants into the cavity in which the LED 616*a* and other electronics are present. A backplate 604 is attached to the chassis 620 via connectors. The reflector diameter is again reduced to meet the minimum UL clearance distance of 1.6 mm with double-sided sticky adhesive 634 applied over the LGP 612 to attach the reflector 610 and the LGP 612 together. The double-sided sticky adhesive 634 may extend over only the reflector 610, leaving the edges of the LGP 612 uncovered, and stick only to the top of the dispersive pattern 612*a* to maintain a sufficient refractive index step.

Figure 6J:
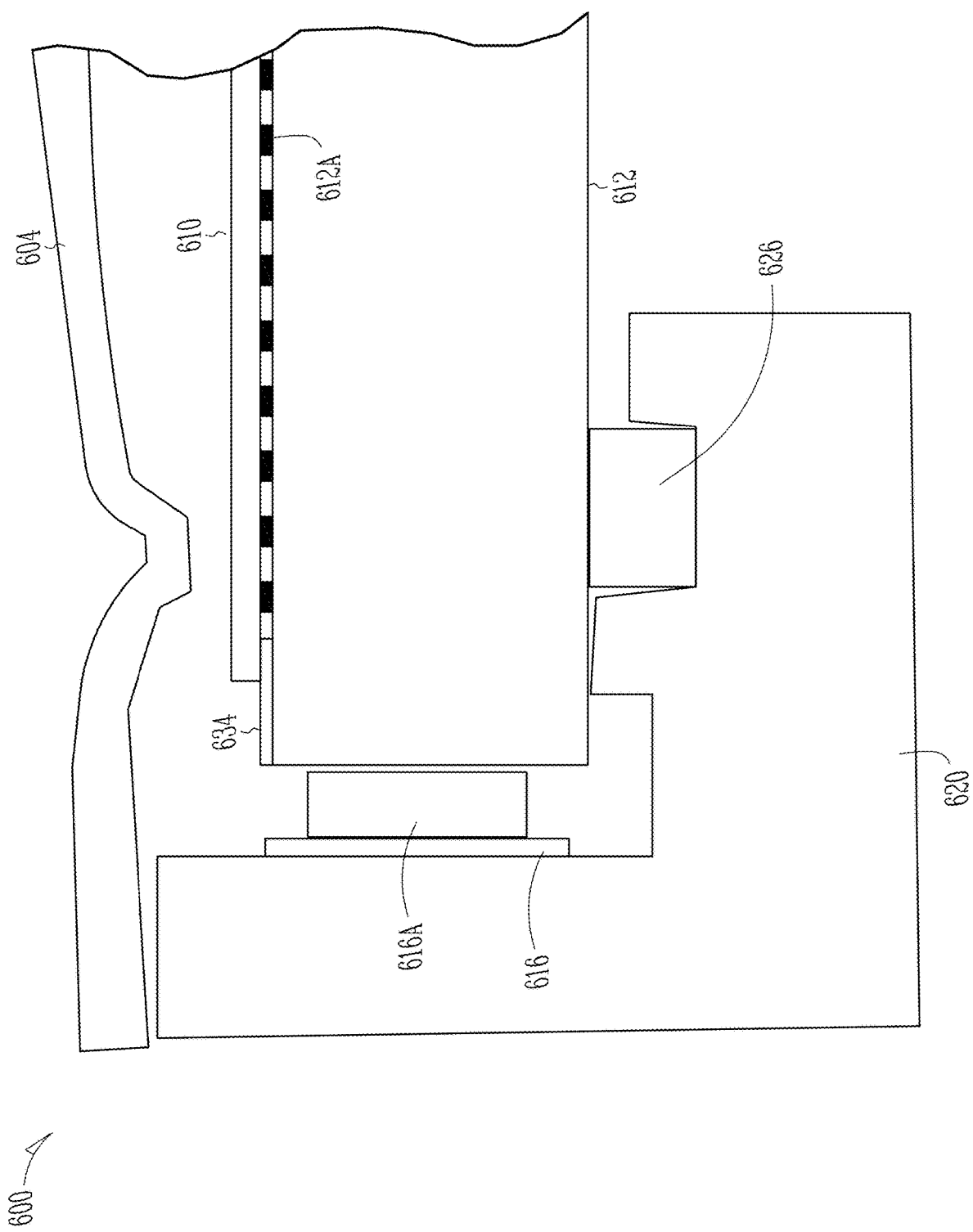
FIG. 6J shows an enlarged simplified geometric model of a portion of a light engine, in accordance with some embodiments.

FIG. 6J shows another enlarged simplified geometric model of a light engine, in accordance with some embodiments. Similar to the above, the light engine 600 contains a chassis 620 in which are situated LEDs 616*a*, an LGP 612 and a reflector 610. The LEDs 616*a* may be disposed on the frame 620 and face inward, towards the LGP 612. The reflector 610 may be disposed on the LGP 612. A dispersive pattern 612*a* may be formed on a surface of the LGP 612 opposite the reflector 610. The LGP 612 and the reflector 610 may be retained in the inner cavity in the frame 620. A gasket 626 is retained within a recess in the frame 620 under the LGP 612 to avoid ingress of liquid or other contaminants into the cavity in which the LED 616*a* and other electronics are present. A backplate 604 is attached to the chassis 620 via connectors. The reflector diameter is again reduced to meet the minimum UL clearance distance of 1.6 mm with double-sided sticky adhesive 634 applied over the LGP 612 to attach the reflector 610 and the LGP 612 together. The double-sided sticky adhesive 634 may extend over only the edges of the LGP 612 and the reflector 610 to attach the reflector 610 and the LGP 612 together at those points instead of being applied to the dispersive pattern 612*a*.

Figure 7:
FIG. 7 shows an example of a protective film of a light engine, in accordance with some embodiments.

FIG. 7 shows an example of a protective film of a light engine, in accordance with some embodiments. In some embodiments, after assembly of the light engine 700, a protective film 740 may be applied to the LGP 712 when disposed within the chassis 720. The film 740 may be, for example, a polyethylene or other type of plastic film that is attached to the LGP 712 using an adhesive. In some embodiments, the film 740 may be about 50 μm thick. The film 740 may have a diameter of about 441 mm to cover the LGP 712. In some embodiments, the adhesive rating may be 150 g/25 mm. In some embodiments, the film 740 may have a pull tab for the end user to remove the film 740. The pull tab may be folded over the film 740 to avoid entrapment during assembly and may face a marking on the chassis.

Figure 8:
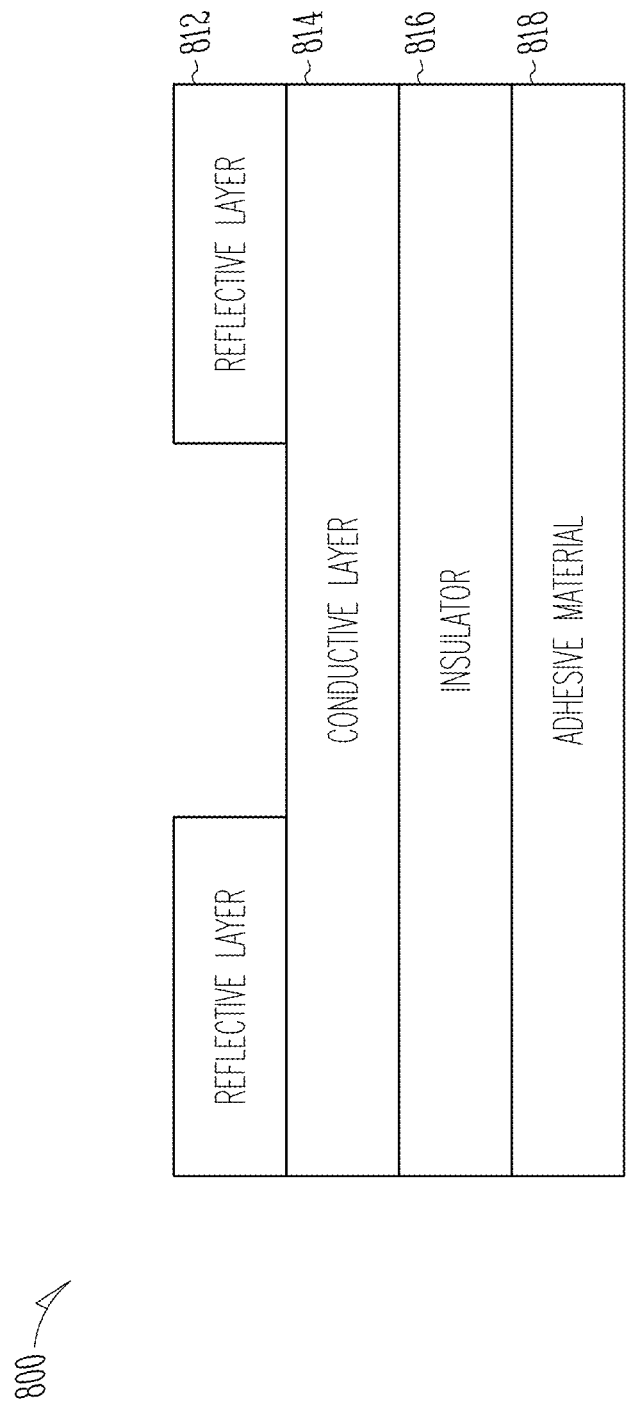
FIG. 8 shows an example of a side view of a light engine, in accordance with some embodiments.

FIG. 8 is a cross-sectional view of the FPC 800, in accordance with some embodiments. In some examples, the FPC 800 can be a 1 L/2 oz copper flexible printed circuit with a white coverlay. In some examples, the FPC 800 can be formed as tape and be delivered as a reel of tape. The FPC 800 may be a multilayer structure that contains at least one pair of a conductive layer (such as metal) 814 and insulator (such as dielectric) 816, respectively, and a reflective layer 812 on a topmost conductive layer 814.

An adhesive material 818 may be attached to the underside of a portion of the insulator 816. The adhesive material 818 may be a pressure-sensitive adhesive (PSA). The PSA is a non-reactive adhesive material that forms a bond when pressure is applied without the use of a solvent, water, or heat. The adhesive material 818 may be between about 50 μm and about 1 mm, but is typically around 100 μm. The adhesive material 818 can function like double-stick tape. The adhesive material 818 may be applied at any point, such as before the LEDs are attached. The adhesive material 818 may be applied to areas to which the multilayer structure is attached.

The insulator 816 may be formed from polyimide, or any other suitable insulating material that is sufficiently flexible when of the desired thickness. The dielectric layer 816 may be between about 25 μm and about 1000 μm, sufficient to support the conductive layer 814.

The conductive layer 814 may be formed on the dielectric layer 816. In different embodiments, the conductive layer 814 may be deposited or plated on the insulator 816. The conductive layer 814 may be formed from copper, or any other suitable conductive material. The conductive layer 814 can be patterned as desired to form traces and interconnects. The conductive layer 814 may be between about 107.5 μm and about 100 μm, nominally about 70 μm or so. In some examples, the insulator 816 and conductive layer 814 can be packaged together to form a copper-clad laminate (CCL). The insulator 816 and the conductive layer 814 can be tested together, and can withstand a specified maximum operating temperature, such as 130° C.

In some embodiments, after formation of the conductive layer 814 on the insulator 816, portions of the insulator 816 may be removed by etching or other chemical or mechanical processes to permit contact to the conductive layer 814 at appropriate locations. In other embodiments, the portions of the insulator 816 may not be removed. If a multilayer structure is used and the conductive layer 814 is not the final metal layer, a new dielectric layer may be deposited or otherwise formed on the underlying the conductive layer 814 and the process continued until the desired number of layers is reached.

In some embodiments, a reflective layer 812 may be formed on the conductive layer 814. The reflective layer 812 can be colored white, and can optionally have a reflectivity greater than or equal to a specified value, such as 70%. The reflective layer 812, the insulator 816 and conductive layer 814 can also be tested together. In some examples, these layers can withstand a specified maximum operating temperature, such as 130° C.

If a multilayer structure is not used or the conductive layer 814 is the final metal layer, a solder mask may be deposited on the topmost conductive layer 814. The solder mask may be, for example, between about 25 µm and about 50 µm. The solder mask when applied, may have openings to expose portions of the topmost conductive layer 814 to form the body contacts. The solder mask may also have openings to expose portions of the topmost conductive layer 814 to form contacts, if not formed in the insulator 816. In other embodiments, the openings in the solder mask may be formed after application of the solder mask. The LEDs or other illumination sources may then be soldered or affixed to the solder mask and/or connections otherwise made to the FPC 800.

Figure 9:
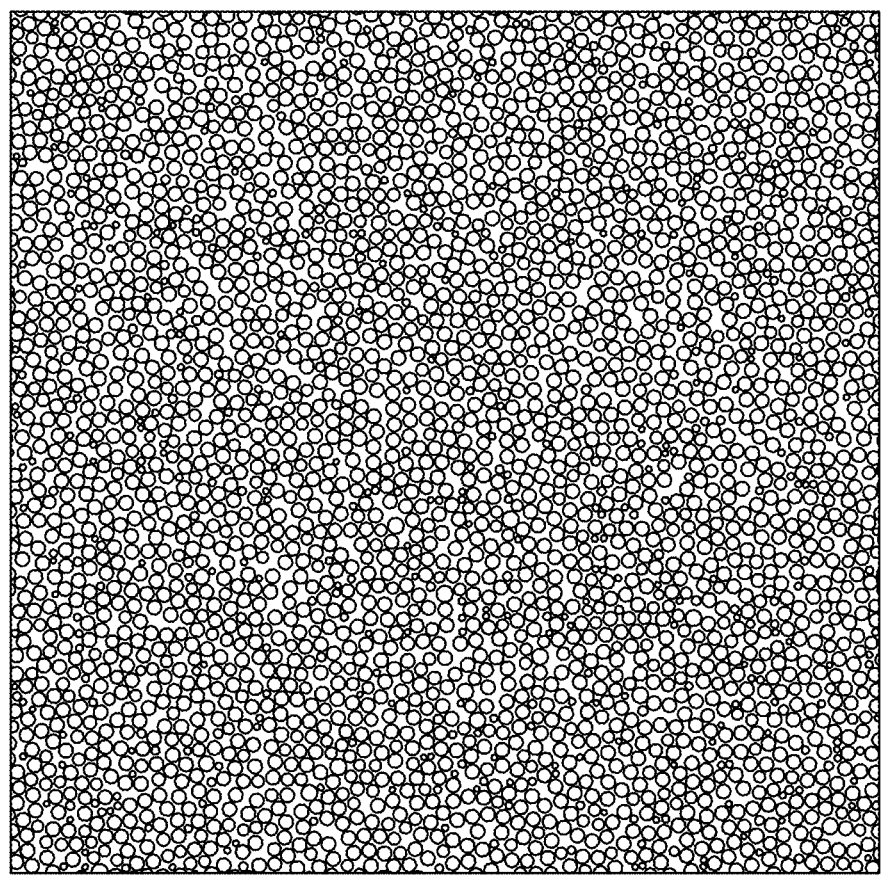
FIG. 9 shows a detailed view of an example of a dispersive pattern in accordance with some embodiments.

FIG. 9 shows a detailed view of an example of a dispersive pattern 900 in accordance with some embodiments. The dispersive pattern 900 is formed on the LGP and may also be formed on an exit surface of the light engine. The dispersive pattern 900 may contain dots having relatively randomized locations and sizes to reduce susceptibility to Moiré fringe formation. The sizes of individual dots may be, for example, between about 0.1 mm and about 2 mm. The dots may not overlap and, in fact may have a separation between adjacent dots, for example, between about 0.1 mm and about 2 mm. Poisson-disc sampling randomization is one of several available algorithms that can produce "short-range order" or quasi-random patterns for the dot pattern of the light-guide plates lenses. Such patterns are desired to reduce or suppress the susceptibility of the dots pattern to generate Moiré fringes when in proximity with a specular or mostly specular reflector. Moiré fringes are formed by the amplitude superposition of the two images. Poisson-disc sampling is an algorithm to generate the dot patterns. Additional parts or elements can use this algorithm to fill the interstices which can be filled by dots. The "short-range order" or quasi-random patterns also allow to have sufficient density of the dots as to not impact negatively the optical efficiency. The use of the dispersive pattern 900, instead of or in conjunction with, the spacing between the LGP and the reflector (e.g., formed by the tape at the edge of the reflector) may prevent generation of the Moiré pattern.

Figure 10A:
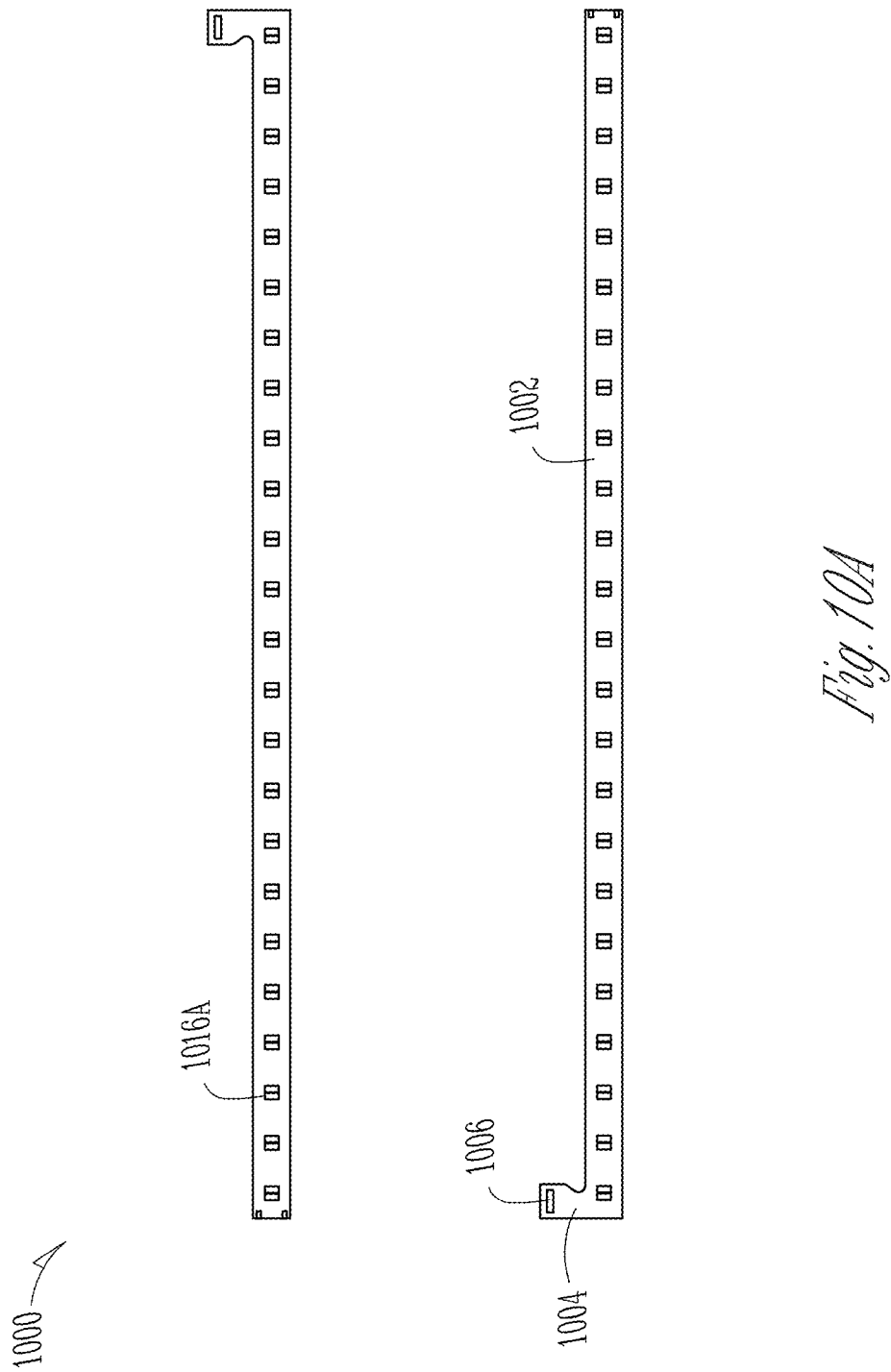
FIG. 10A shows an example of an FPC in accordance with some embodiments.

FIGS. 10A-10D show examples of an FPC 1000 in accordance with some embodiments. FIGS. 10E-10H show examples of a circuit diagram for driving the FPCs of FIGS. 10A-10D in accordance with some embodiments. In some symmetrical LED embodiments, as shown in FIG. 10A, each FPC 1000 may contain 24 LEDs 1016a having a pitch of about 15.875 mm and centered in height within the FPC 1000. As shown, the FPC 1000 may have an "L" shape with a main portion 1002 and one end having an extension 1004 that extends in the height direction, to which an electrical connector is soldered or otherwise connected at a connection point 1006. In some embodiments, the extension 1004 has a thickness of about 11 mm and a width of about 25 mm (rather than the 11.5 mm width of the main portion 1002 of the FPC 1000). In some embodiments, the distance from the center of the LED 1016a closest to the end of the FPC 1000 having the extension 1004 to the edge of the FPC 1000 having the extension 1004 may be about 7.938 mm. The LEDs 1016a of each FPC 1000, as shown in FIG. 10E, may be electrically driven in three parallel sets 1016b of 8 LEDs 1016a in series. In some embodiments, the end of the FPC 1000 having the extension 1004 to the edge of the FPC 1000 having the extension 1004 may be about 7.938 mm.

Figure 10B:
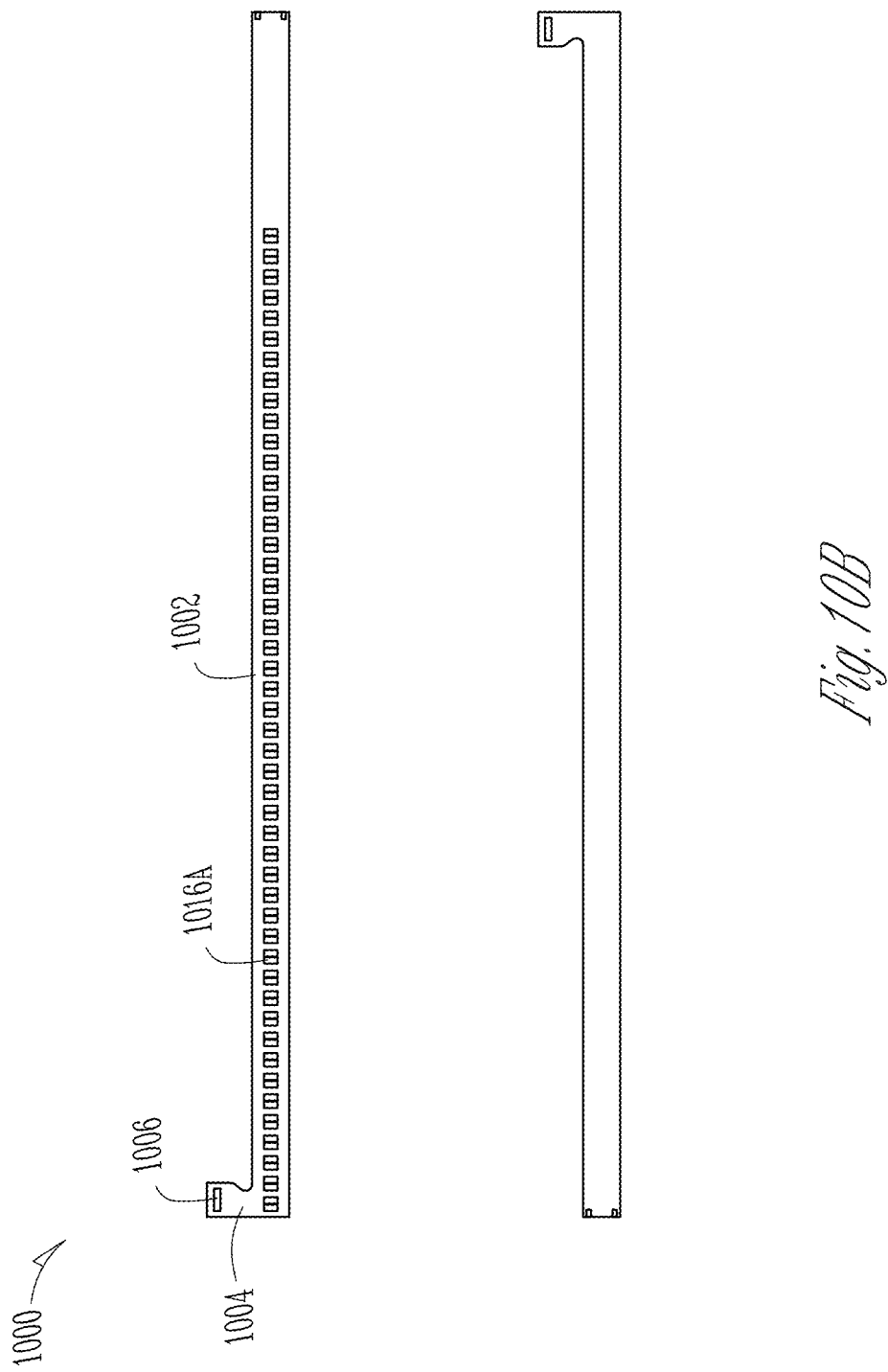
FIG. 10B shows another example of an FPC in accordance with some embodiments.
Figure 10C:
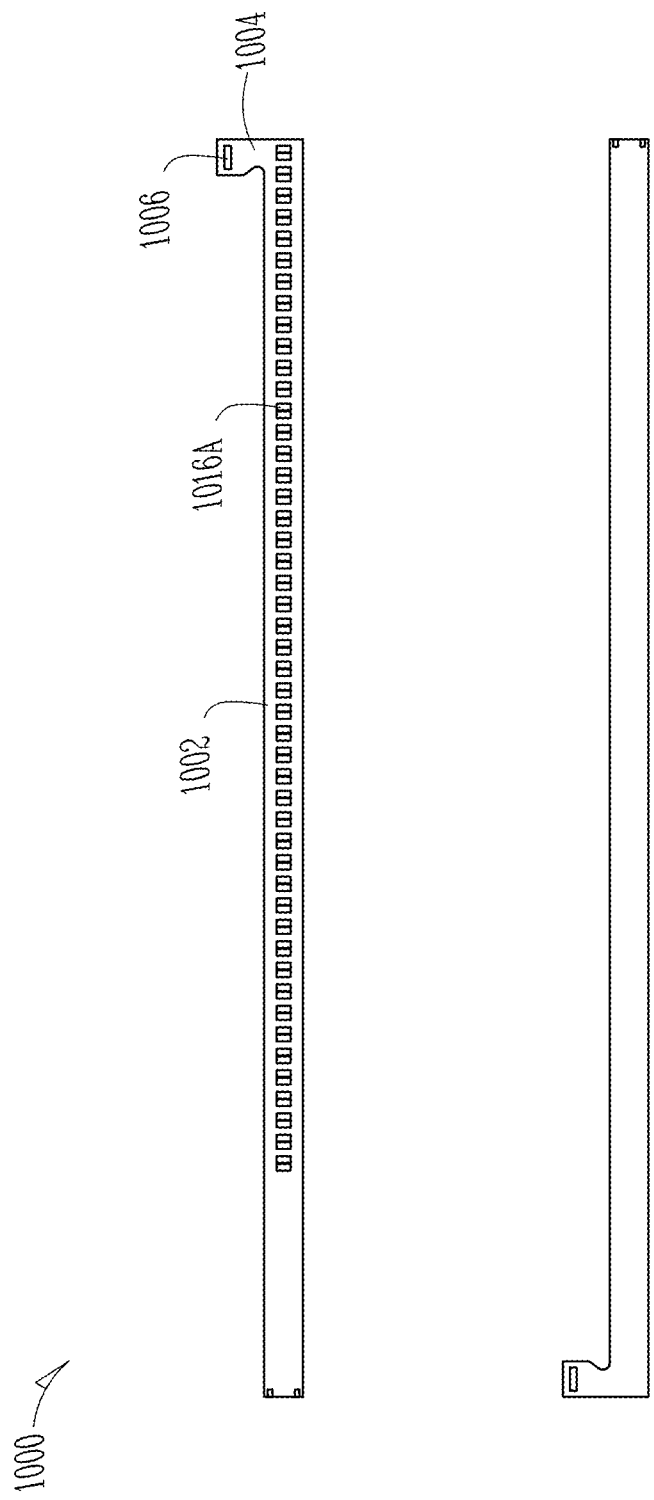
FIG. 10C shows another example of an FPC in accordance with some embodiments.

In some asymmetrical LED embodiments, as shown in FIGS. 10B and 10C, one of the FPC 1000 may contain all 48 LEDs 1016a. The LEDs may have a pitch of about 6.5 mm and centered in height within the FPC 1000. In some embodiments, the distance from the center of the LED 1016a closest to the end of the FPC 1000 having the extension 1004 to the edge of the end of the FPC 1000 having the extension 1004 may be about 4.1 mm. In this case, the LEDs 1016a may be asymmetric both around the entire light engine (not shown in FIG. 10) and along the FPC 1000, with the LEDs 1016a being closer to the edge of the FPC having the extension 1004. The LEDs 1016a of the FPC 1000 may be electrically driven in six parallel sets 1016b of 8 LEDs 1016a in series, as shown in FIGS. 10F through 10G.

Figure 10D:
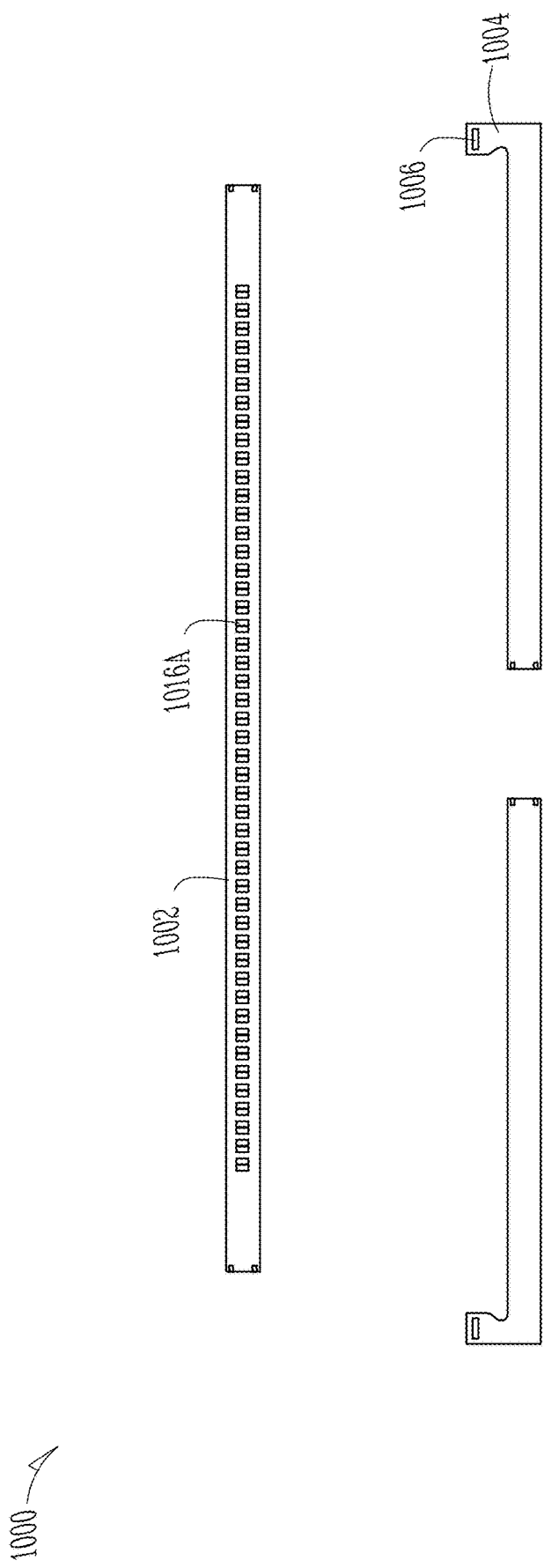
FIG. 10D shows another example of an FPC in accordance with some embodiments.
Figure 10F:
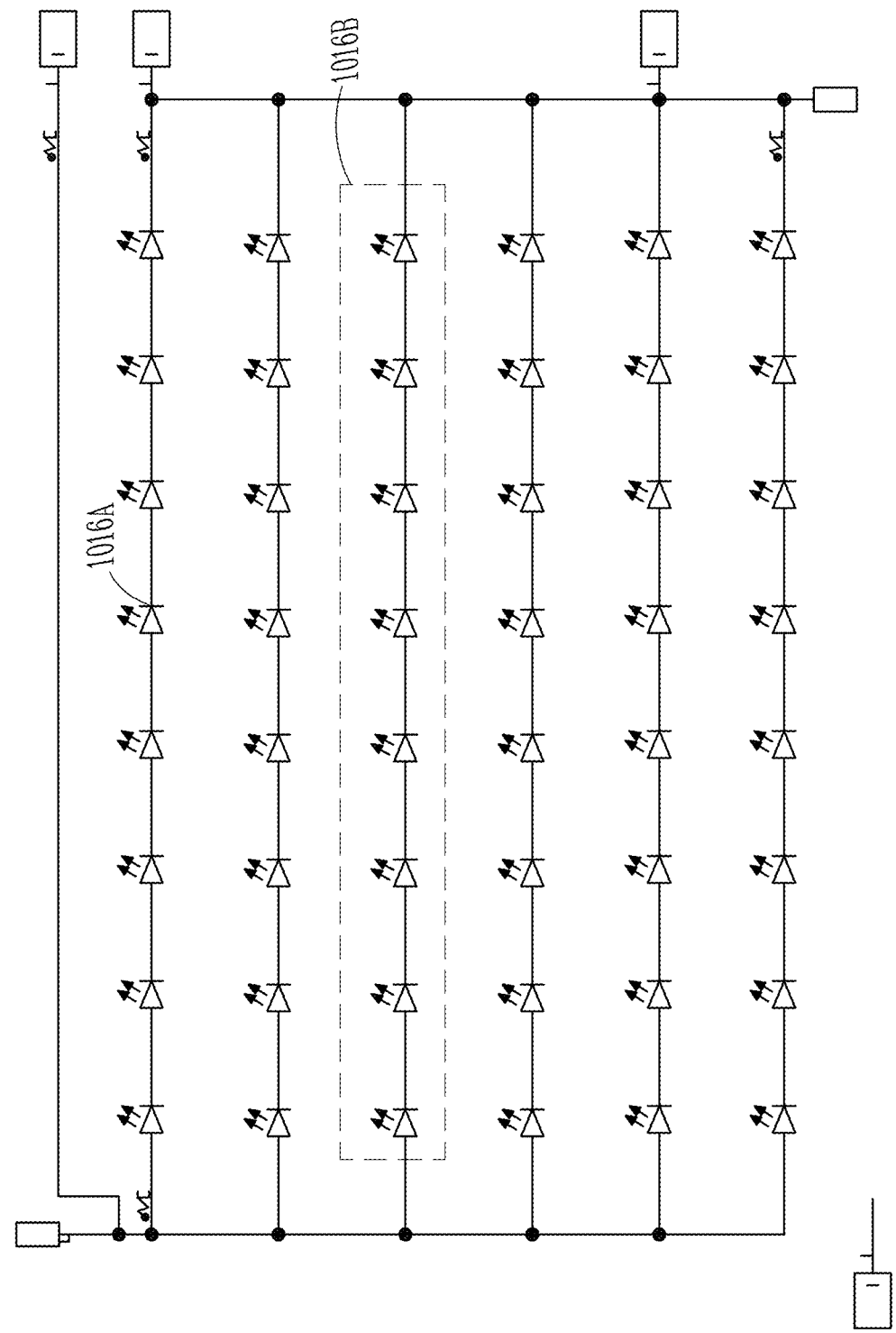
FIG. 10F shows an example of a circuit diagram for driving the FPC of FIG. 10B in accordance with some embodiments.
Figure 10H:
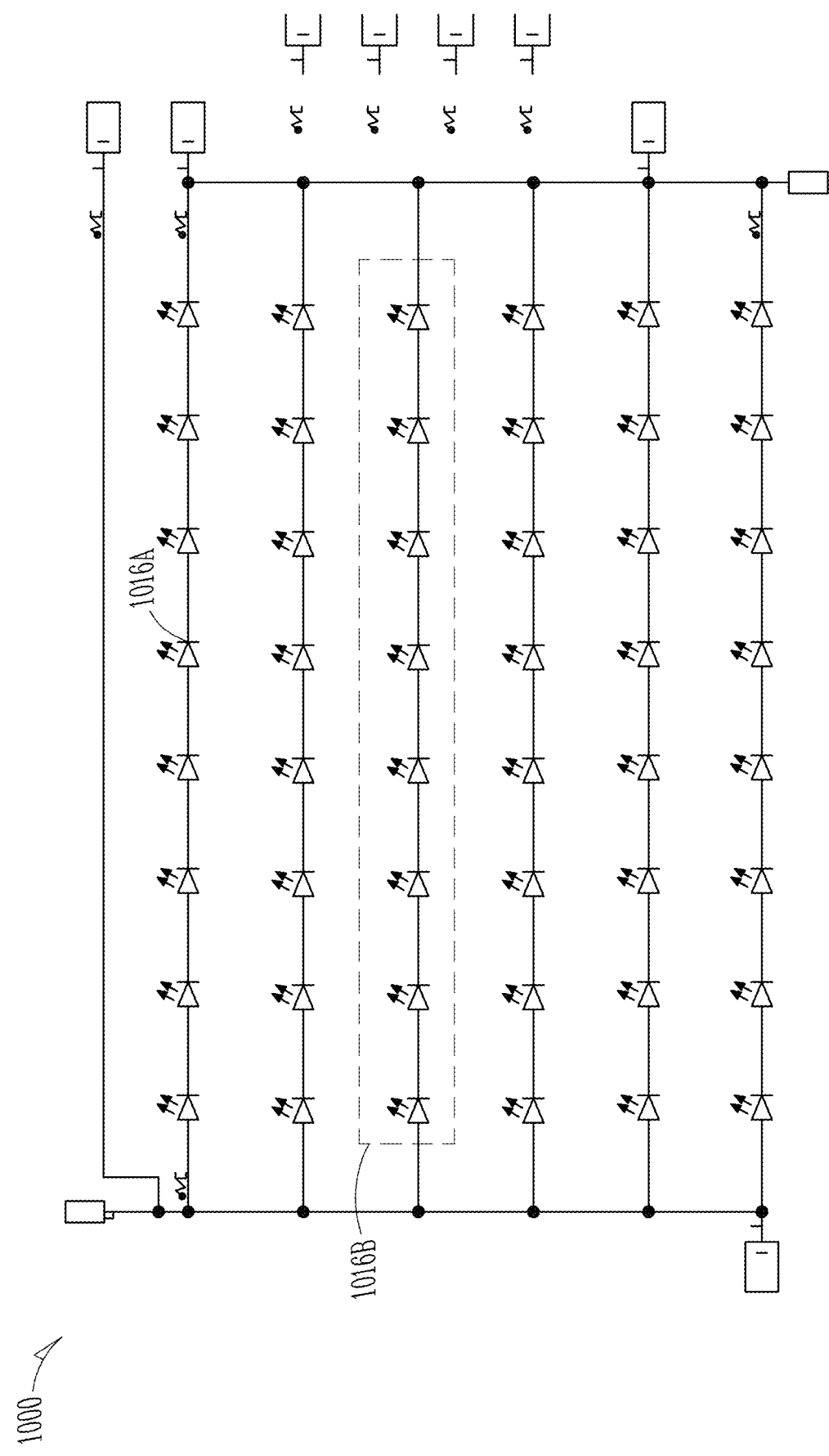
FIG. 10H shows an example of a circuit diagram for driving the FPC of FIG. 10D in accordance with some embodiments.

In other asymmetrical LED embodiments, as shown in FIG. 10D, the distance from the center of the LED 1016a closest to the end of the FPC 1000 to the edge of the FPC 1000 may be about 37.75 mm. In this case, the LEDs 1016a may be asymmetric around the entire light engine 200, but symmetric within the FPC 1000. The LEDs 1016a of the FPC 1000 may be electrically driven in six parallel 1016b of 8 LEDs 1016a in series, as shown in FIG. 10H. Note that in all of the embodiments shown in FIGS. 10A-10H, one or more extensions may be used to vary color distribution or intensity distribution of light produced by the LEDs 1016a.

It will thus be evident that various modifications and changes may be made to these aspects without departing from the broader scope of the present disclosure. Accordingly, the specification and drawings are to be regarded in an illustrative rather than a restrictive sense. The accompanying drawings that form a part hereof show, by way of illustration, and not of limitation, specific aspects in which the subject matter may be practiced. The aspects illustrated are described in sufficient detail to enable those skilled in the art to practice the teachings disclosed herein. Other aspects may be utilized and derived therefrom, such that structural and logical substitutions and changes may be made without departing from the scope of this disclosure. This Detailed Description, therefore, is not to be taken in a limiting sense, and the scope of various aspects is defined only by the appended claims, along with the full range of equivalents to which such claims are entitled.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single aspect for the purpose of streamlining the disclosure. This method of disclosure is not to be interpreted as reflecting an intention that the claimed aspects require more features than are expressly recited in each claim. Rather, as the following claims reflect, inventive subject matter lies in less than all features of a single disclosed aspect. Thus, the following claims are hereby incorporated into the Detailed Description, with each claim standing on its own as a separate aspect.

What is claimed is:

1. A lighting system comprising:
    a chassis having a side wall and bottom surface, the side wall and the bottom surface defining a cavity, with a recess formed in the bottom surface;
    a flexible printed circuit (FPC) disposed on the side wall;
    light emitting diodes (LEDs) mounted on the FPC, the LEDs positioned to emit light toward a center of the cavity;

a light guide positioned within the cavity to receive light emitted by the LEDs through an edge of the light guide;

a gasket disposed within the recess, the gasket being in contact with a first surface of the light guide and disposed closer to the center of the cavity than the LEDs;

a reflector within the cavity adjacent to a second surface of the light guide opposite the first surface of the light guide;

a backplate attached to the chassis and configured to seal the cavity; and a white reflective sheet disposed between the reflector and the backplate, the white reflective sheet having a diameter larger than that of the reflector.

2. The lighting system of claim 1, further comprising:
spacers attached to the chassis between the reflector and the backplate.

3. The lighting system of claim 2, wherein:
the backplate is in contact with the spacers, and
the backplate comprises a groove is configured such that, if the spacers were absent, the backplate would assert pressure on the reflector proximate to an edge of the reflector.

4. The lighting system of claim 2, wherein:
a protrusion in the bottom surface of the chassis that forms an outer wall of the recess is configured such that, if the gasket was absent, the protrusion would assert pressure on the light guide proximate to the edge of the light guide.

5. The lighting system of claim 4, wherein:
the protrusion is disposed more proximate to the LEDs than the groove is disposed to the LEDs.

6. The lighting system of claim 2, wherein:
the spacers comprise a central spacer disposed at an approximate center of the reflector and an approximate center of the backplate and distributed spacers disposed at about symmetric locations farther from the center of the reflector and the center of the backplate than the central spacer.

7. The lighting system of claim 6, wherein:
the central spacer is formed in a circular disc shape and the distributed spacers are formed in a semicircular disc shape having a flat side opposing the central spacer.

8. The lighting system of claim 1, wherein the reflector covers the second surface of the light guide, an edge of the reflector is more proximate to the FPC than the edge of the light guide.

9. The lighting system of claim 1, wherein the reflector is disposed in the cavity and has a diameter to provide a clearance distance of 1.6 mm from the FPC.

10. The lighting system of claim 1, further comprising:
a dispersive pattern configured to prevent generation of Moiré fringes disposed on the second surface of the light guide, and
a transparent adhesive disposed on the second surface of the light guide to attach the reflector and the light guide.

11. The lighting system of claim 1, further comprising:
locator pins disposed within recesses formed in the bottom surface of the chassis, the light guide comprising a plurality of slots formed therein and configured to receive the locator pins to limit thermal displacement of the light guide towards the LEDs.

12. The lighting system of claim 11, wherein:
the chassis comprises a protrusion,
the sidewall is an inner wall of the protrusion, and
the FPC has a leg that extends, for electrical contact, over a top of the protrusion to an outer wall on an opposite side of the protrusion as the inner wall.

13. A lighting engine comprising:
a metal chassis having a side wall and bottom surface, the side wall and the bottom surface defining a cavity having a circular cross-section;
a flexible printed circuit (FPC) disposed on the side wall;
light emitting diodes (LEDs) mounted on the FPC separated from the bottom surface by a predetermined distance, the LEDs positioned to emit light toward a center of the cavity;
a substantially transparent light guide positioned within the cavity to receive light emitted by the LEDs through an edge of the light guide, the light guide having a first surface opposing the bottom surface of the chassis;
a reflector within the cavity adjacent to a second surface of the light guide opposite the first surface of the light guide;
a reflective material disposed between the reflector and the FPC,
the reflective material comprising a reflective tape disposed between the reflector and the FPC, over an edge of the reflector, and between the reflector and a backplate,
the reflective tape attached to the light guide, the edge of the reflector, and a surface of the reflector opposing the backplate,
the reflective tape terminating at the edge of the light guide; and
a secondary reflective material disposed on the reflective tape on the light guide and between the reflective tape and the FPC.

14. The lighting engine of claim 13, wherein:
a dispersive pattern configured to prevent generation of Moiré fringes is disposed on the second surface of the light guide.

15. A method of fabricating a lighting system, the method comprising:
attaching a flexible printed circuit (FPC) to a side wall of a cavity, the cavity having a circular cross-section, in a metal chassis, the FPC having light emitting diodes (LEDs) mounted thereon such that the LEDs are positioned to emit light toward a center of the cavity;
inserting a gasket into a recess formed in a bottom surface of the cavity;
positioning a substantially transparent light guide in the cavity such that a first surface of the light guide contacts the gasket and an edge of the light guide opposes the LEDs and is configured to receive light emitted by the LEDs;
inserting a reflector in the cavity adjacent to a second surface of the light guide such that the reflector entirely covers the light guide and is configured to reflect substantially all light incident on the reflector from the light guide back toward the light guide;
positioning a white reflective sheet on the reflector, the white reflective sheet having a diameter larger than that of the reflector and
attaching a backplate to the chassis to seal the cavity, the white reflective sheet positioned between the reflector and the backplate.

* * * * *